US009595476B2

(12) United States Patent
Masuoka et al.

(10) Patent No.: US 9,595,476 B2
(45) Date of Patent: *Mar. 14, 2017

(54) METHOD FOR PRODUCING SEMICONDUCTOR DEVICE AND SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/018,191

(22) Filed: Feb. 8, 2016

(65) Prior Publication Data

US 2016/0155857 A1    Jun. 2, 2016

Related U.S. Application Data

(63) Continuation of application No. 14/743,266, filed on Jun. 18, 2015, now Pat. No. 9,299,701, which is a
(Continued)

(51) Int. Cl.
*H01L 29/78*     (2006.01)
*H01L 29/786*   (2006.01)
(Continued)

(52) U.S. Cl.
CPC ...... *H01L 21/823431* (2013.01); *B82Y 10/00* (2013.01); *H01L 21/26506* (2013.01);
(Continued)

(58) Field of Classification Search
CPC ..... H01L 29/78; H01L 29/786; H01L 29/423; H01L 29/78642; H01L 29/78654;
(Continued)

(56) References Cited

U.S. PATENT DOCUMENTS 5,489,546 A     2/1996   Ahmad et al.
8,080,458 B2   12/2011   Masuoka et al.
(Continued)

FOREIGN PATENT DOCUMENTS

JP     02-071556 A     3/1990
JP     02-188966 A     7/1990
(Continued)

OTHER PUBLICATIONS

Mistry, K, et al., "A 45nm Logic Technology With High-k+Metal Gate Transistors, Strained Silicon, 9 Cu Interconnect Layers, 193nm Dry Patterning, and 100% Pb-free Packaging," *Electron Devices Meeting*, 2007, IEEE International, pp. 247-250.
(Continued)

*Primary Examiner* — Chuong A Luu
(74) *Attorney, Agent, or Firm* — Brinks Gilson & Lione

(57) ABSTRACT

A semiconductor device includes first and second fin-shaped semiconductor layers on a substrate. First and second pillar-shaped semiconductor layers reside on the first and second fin-shaped semiconductor layers, respectively, where a width of the bottom of the first and second pillar-shaped semiconductors is equal to a width of the top of the first and second fin-shaped semiconductor layers, respectively. A gate insulating film and metal gate electrode are around underlying gate insulating layers on each fin-shaped semiconductor layer. A metal gate line is connected to the metal gate electrodes and extends in a direction perpendicular to the first and second fin-shaped semiconductor layers. Contacts reside on the upper portion of diffusion layers in upper portions of the first and second pillar-shaped semiconductor layers and are directly connected to the diffusion layers.

1 Claim, 47 Drawing Sheets

Related U.S. Application Data continuation of application No. 14/083,060, filed on Nov. 18, 2013, now Pat. No. 9,117,690, which is a continuation-in-part of application No. 13/679,225, filed on Nov. 16, 2012, now Pat. No. 8,735,971.

(60) Provisional application No. 61/566,244, filed on Dec. 2, 2011.

(51) Int. Cl.

| | | |
|---|---|---|
| *H01L 21/8234* | (2006.01) | |
| *H01L 27/088* | (2006.01) | |
| *H01L 29/66* | (2006.01) | |
| *H01L 29/775* | (2006.01) | |
| *H01L 29/06* | (2006.01) | |
| *B82Y 10/00* | (2011.01) | |
| *H01L 29/423* | (2006.01) | |
| *H01L 21/265* | (2006.01) | |
| *H01L 21/306* | (2006.01) | |
| *H01L 21/324* | (2006.01) | |
| *H01L 21/768* | (2006.01) | |
| *H01L 29/16* | (2006.01) | |

(52) U.S. Cl.
CPC .. *H01L 21/30604* (2013.01); *H01L 21/30625* (2013.01); *H01L 21/324* (2013.01); *H01L 21/76895* (2013.01); *H01L 21/823481* (2013.01); *H01L 27/088* (2013.01); *H01L 27/0886* (2013.01); *H01L 29/0676* (2013.01); *H01L 29/42392* (2013.01); *H01L 29/66477* (2013.01); *H01L 29/66795* (2013.01); *H01L 29/775* (2013.01); *H01L 29/78618* (2013.01); *H01L 29/78642* (2013.01); *H01L 29/78654* (2013.01); *H01L 29/78696* (2013.01); *H01L 29/16* (2013.01)

(58) Field of Classification Search
CPC ......... H01L 29/78618; H01L 29/42392; H01L 29/66; H01L 29/0847; H01L 29/407; H01L 29/41741; H01L 29/41766; H01L 29/66659; H01L 69/66712; H01L 29/66719; H01L 29/7809; H01L 29/7835; H01L 27/088; H01L 27/0922; H01L 27/0928
USPC ................ 257/329, 347, 368, 369, 288, 412
See application file for complete search history.

(56) References Cited

U.S. PATENT DOCUMENTS

| | | | |
|---|---|---|---|
| 8,735,971 B2 | 5/2014 | Masuoka et al. | |
| 8,772,175 B2 | 7/2014 | Masuoka et al. | |
| 8,916,478 B2 | 12/2014 | Masuoka et al. | |
| 9,117,690 B2* | 8/2015 | Masuoka | H01L 29/775 |
| 9,142,645 B2 | 9/2015 | Masuoka et al. | |
| 2008/0001171 A1 | 1/2008 | Tezuka et al. | |
| 2008/0136030 A1 | 6/2008 | Chang et al. | |
| 2010/0216289 A1 | 8/2010 | Park et al. | |
| 2010/0264485 A1 | 10/2010 | Masuoka et al. | |
| 2011/0068401 A1 | 3/2011 | Izumida et al. | |
| 2011/0104862 A1 | 5/2011 | Kadoya | |
| 2012/0032732 A1 | 2/2012 | Xiao et al. | |
| 2012/0049252 A1 | 3/2012 | Masuoka et al. | |

FOREIGN PATENT DOCUMENTS

| | | |
|---|---|---|
| JP | 03-145761 A | 6/1991 |
| JP | 10-209407 A | 8/1998 |
| JP | 2010-251678 A | 11/2010 |
| JP | 2011-071235 A | 4/2011 |
| JP | 2011-100826 A | 5/2011 |
| JP | 2011-187927 A | 9/2011 |

OTHER PUBLICATIONS

Wu, C.C. et al., "High Performance 22/20nm FinFET CMOS Devices with Advanced High-K/Metal Gate Scheme," *Electron Devices Meeting*, 2010, IEEE International, pp. 27.1.1-27.1.4.
International Search Report with English Translation for PCT/JP2011/077959 dated Dec. 21, 2011, 3 pages.
Office Action for U.S. Appl. No. 13/679,225 dated Jan. 14, 2014, 12 pages.
Notice of Allowance for U.S. Appl. No. 13/679,225 Mar. 18, 2014, 7 pages.
Office Action for U.S. Appl. No. 14/253,518 dated May 19, 2015, 8 pages.
Office Action for U.S. Appl. No. 14/083,060 dated Apr. 22, 2015, 8 pages.
Notice of Allowance for U.S. Appl. No. 14/083,060 dated May 20, 2015, 9 pages.
Notice of Allowance for U.S. Appl. No. 14/083,060 dated Jun. 25, 2015, 6 pages.
Notice of Allowance for U.S. Appl. No. 14/253,518 dated Jul. 2, 2015, 8 pages.
Office Action for U.S. Appl. No. 14/743,266 dated Oct. 21, 2015, 8 pages.
Notice of Allowance for U.S. Appl. No. 14/743,266 dated Dec. 18, 2015, 8 pages.
Office Action for U.S. Appl. No. 14/823,138 dated Jan. 19, 2016, 10 pages.
Notice of Allowance in corresponding U.S. Appl. No. 14/823,138, dated May 6, 2016, 8 pages.

* cited by examiner

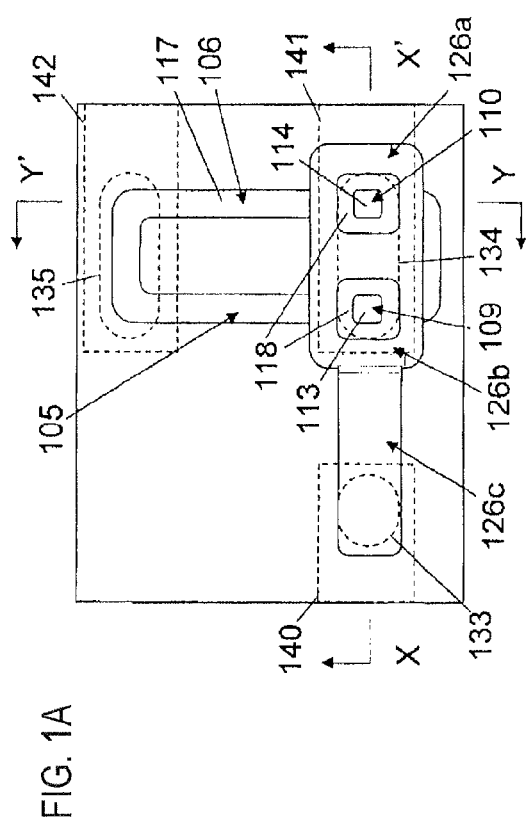
FIG. 1A
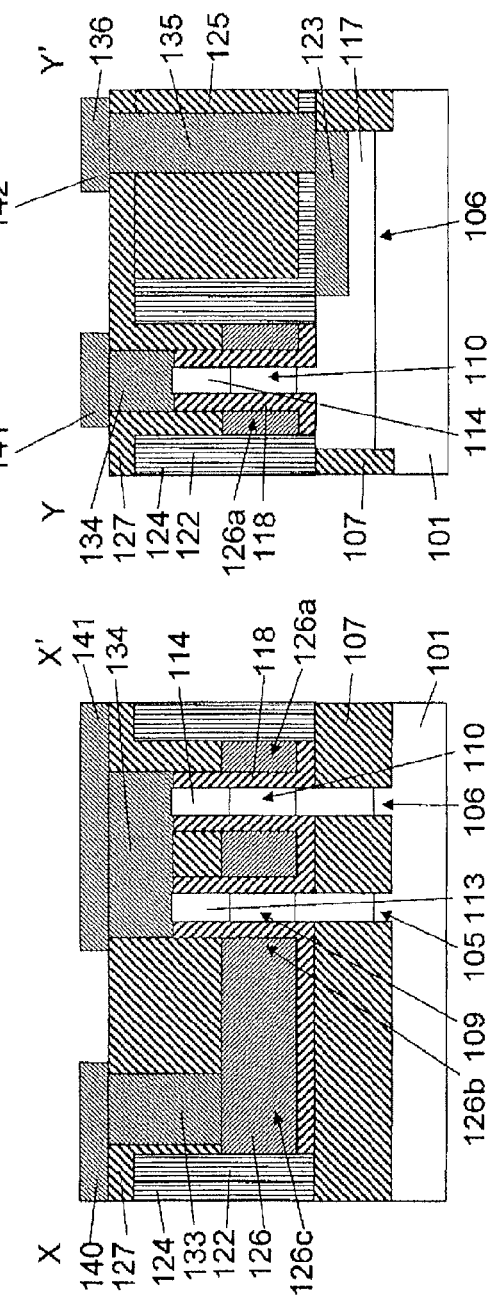
FIG. 1C
FIG. 1B

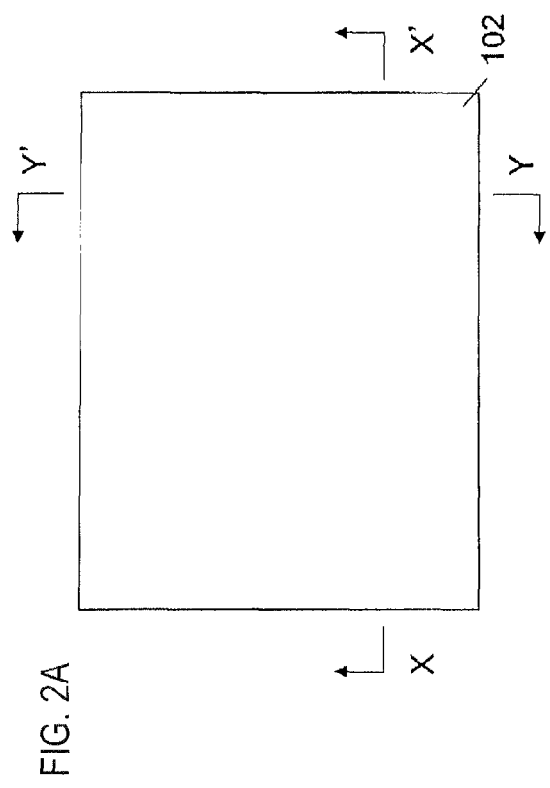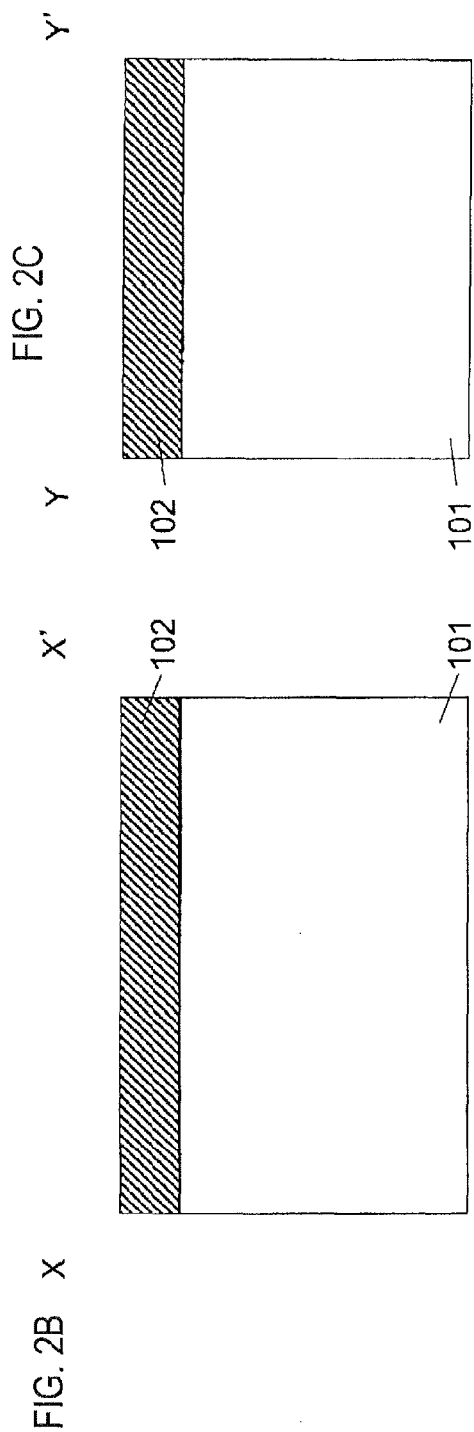
FIG. 2A
FIG. 2B
FIG. 2C

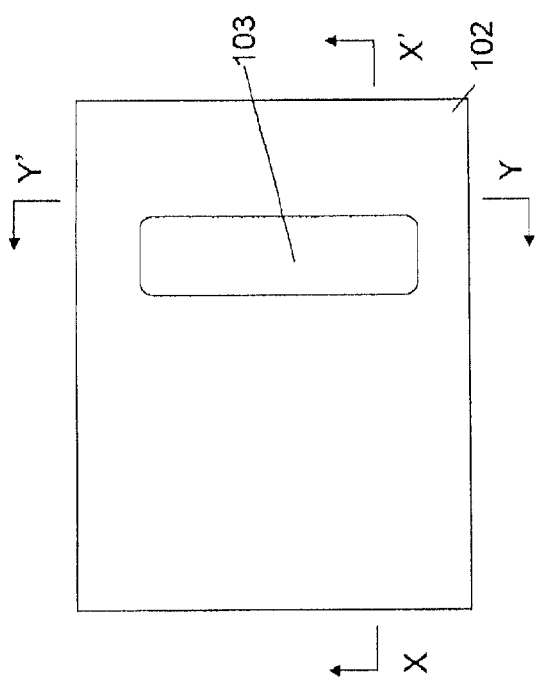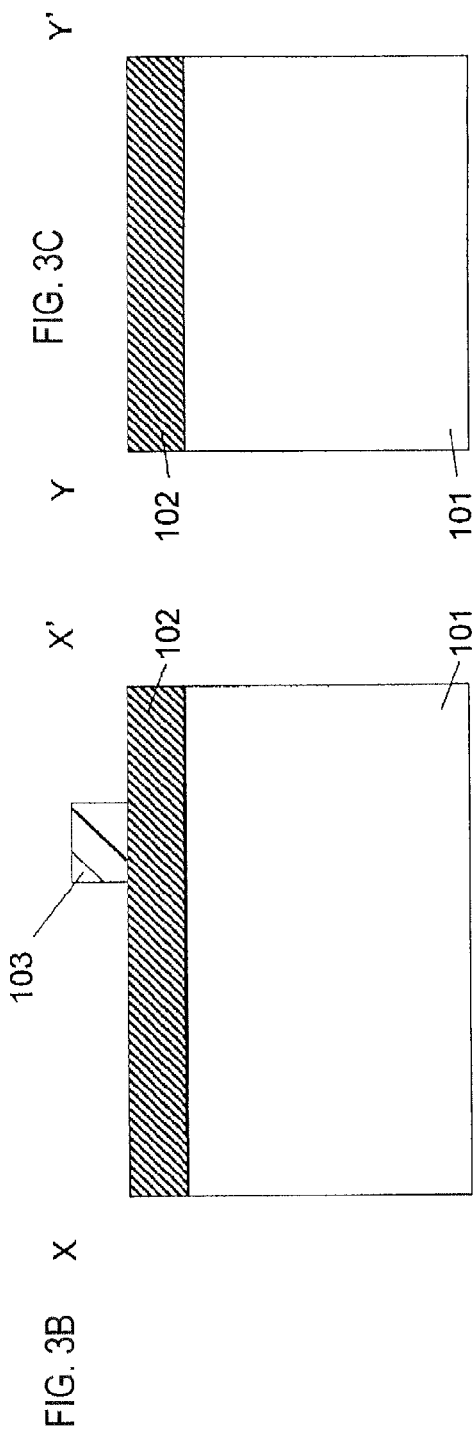

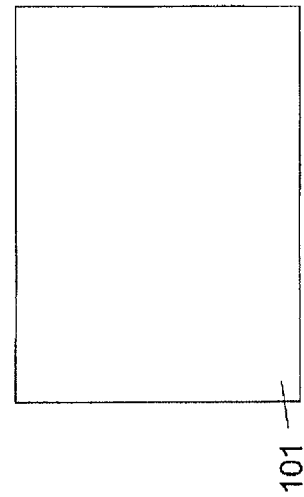
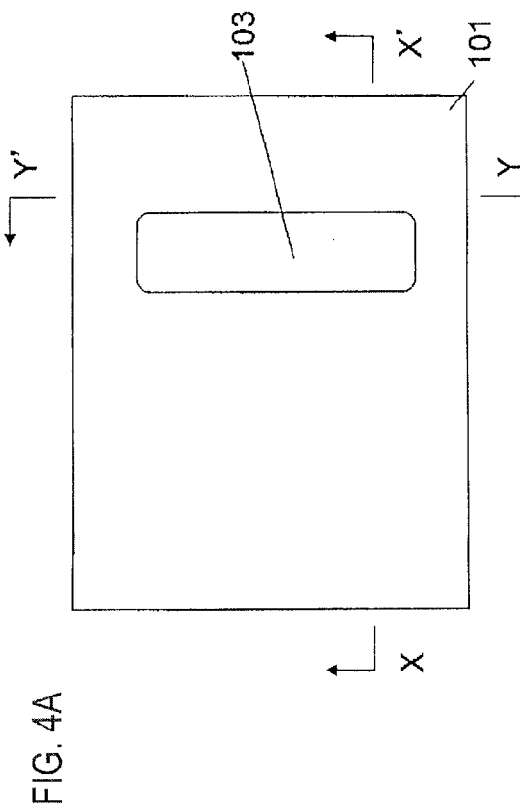
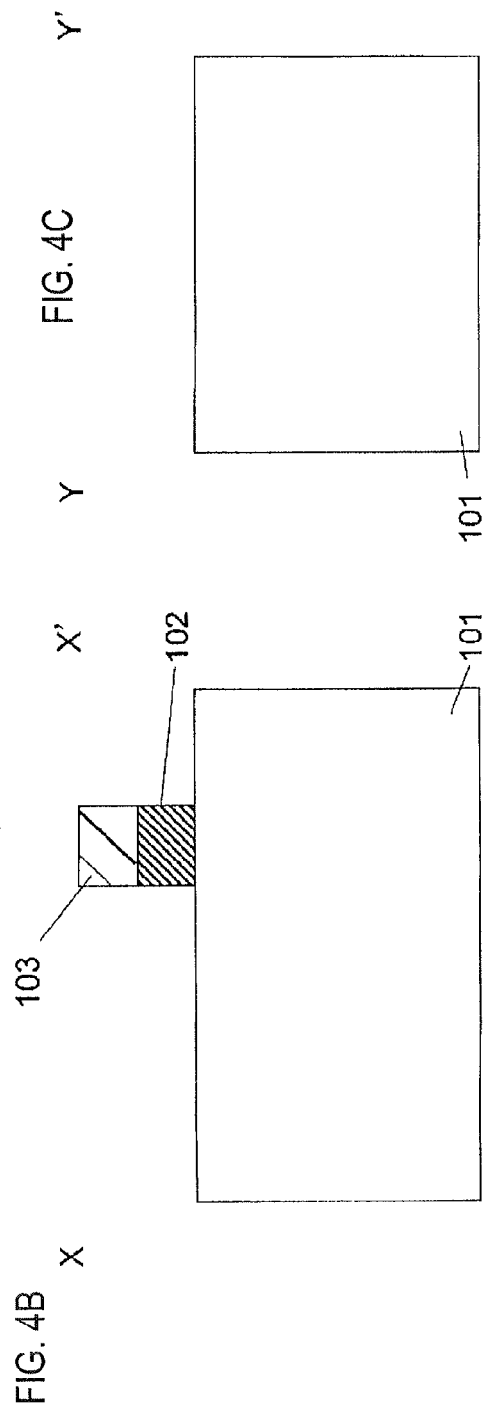

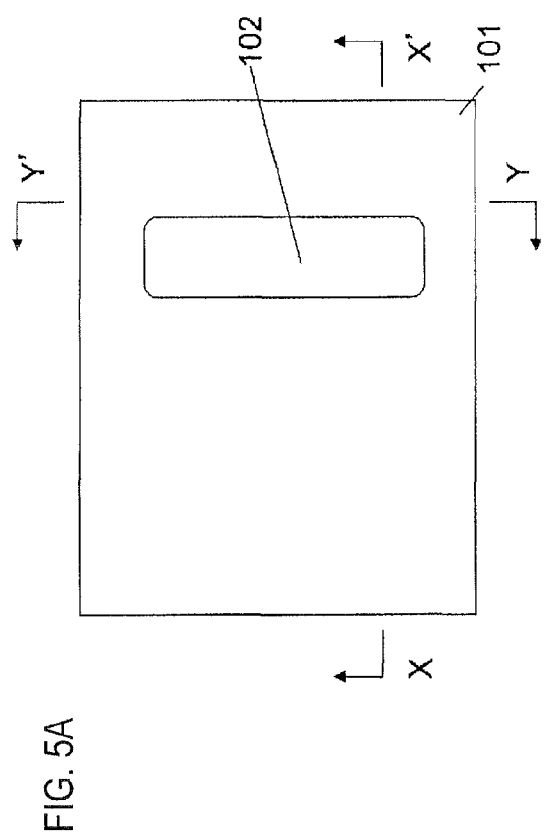
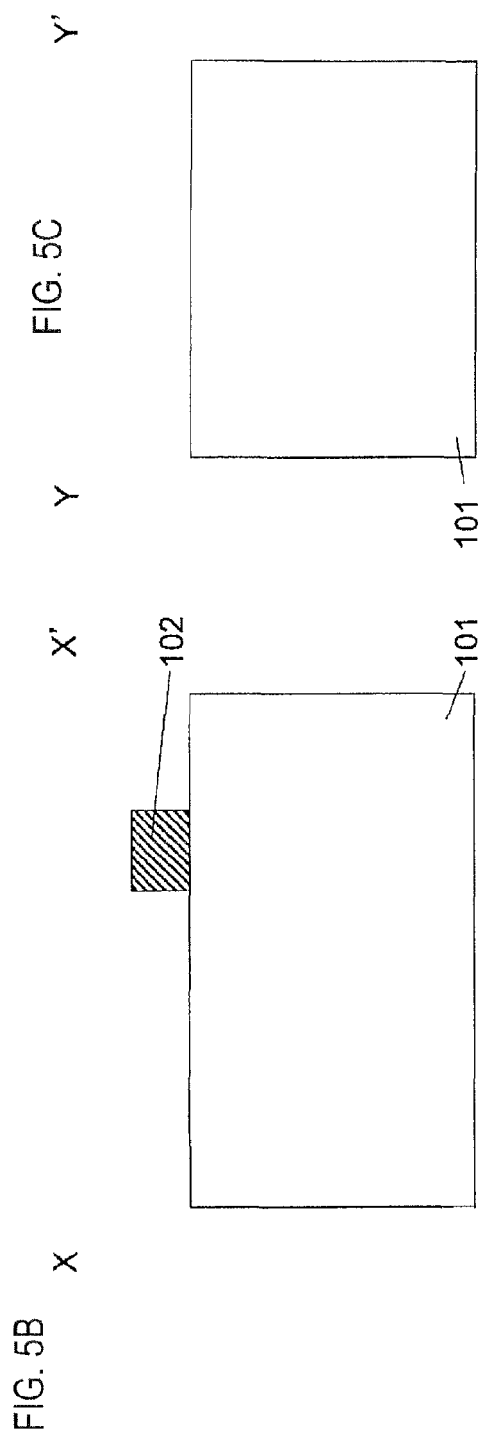
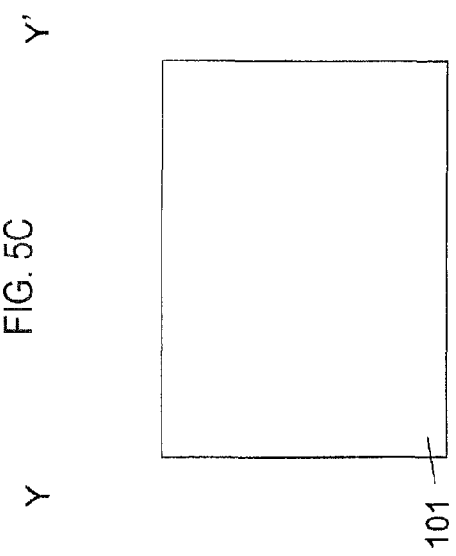

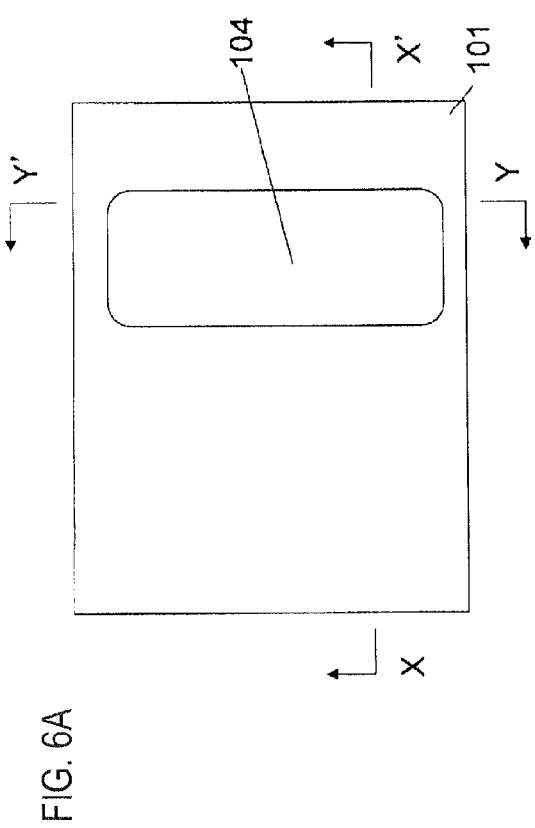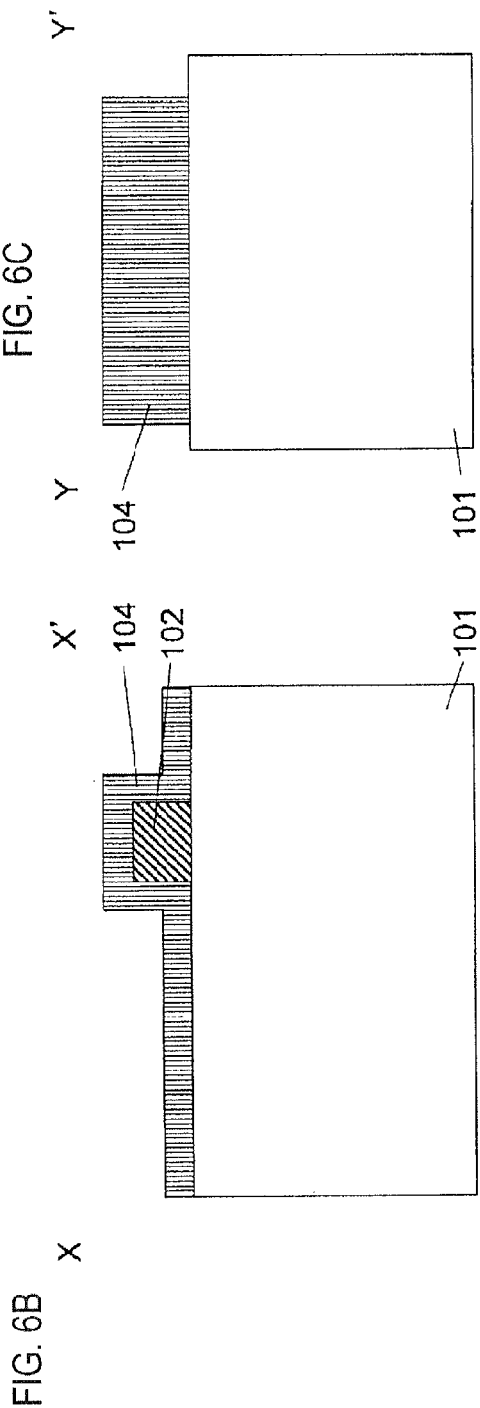

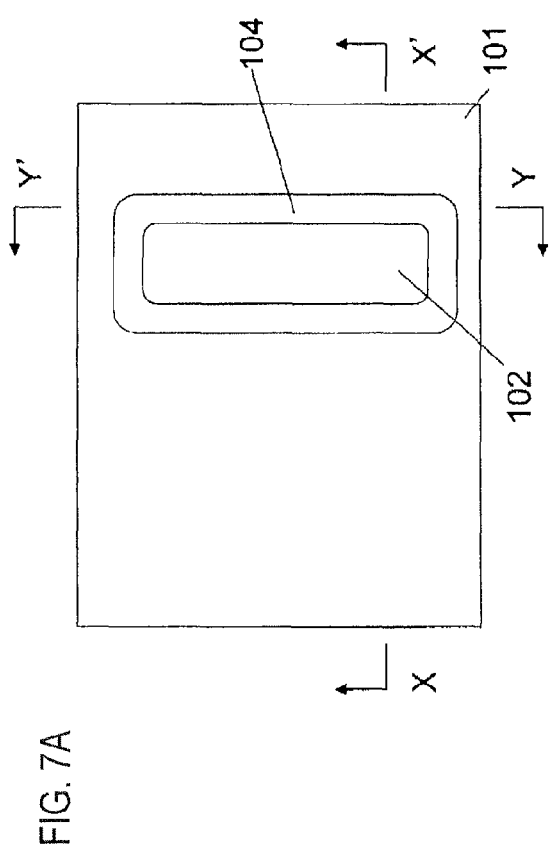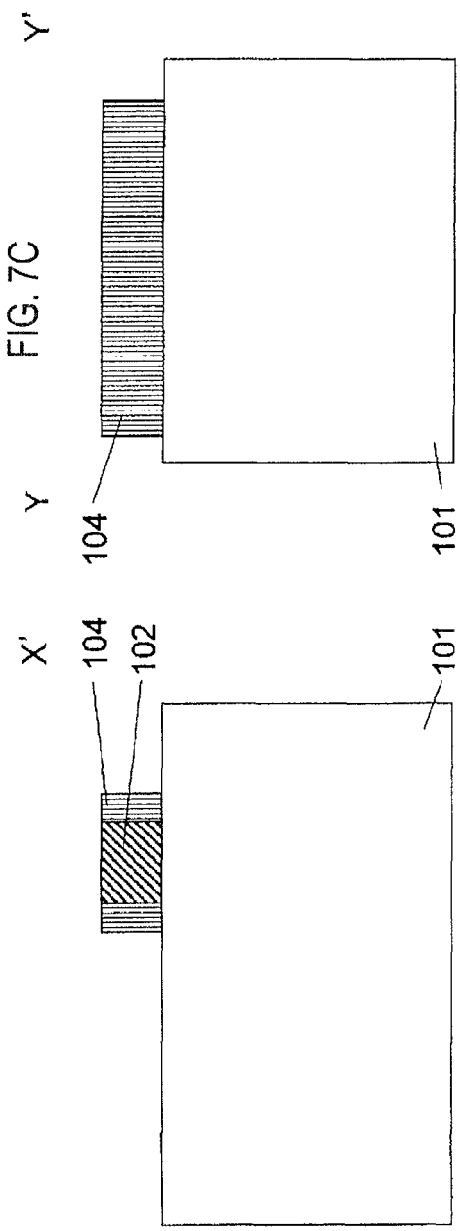

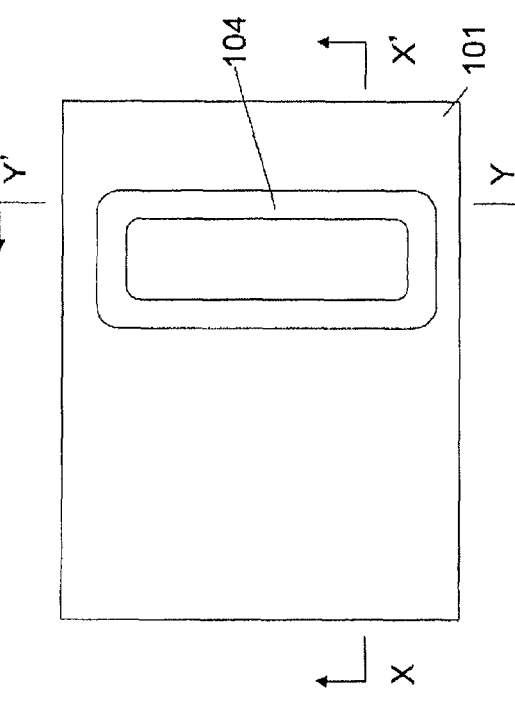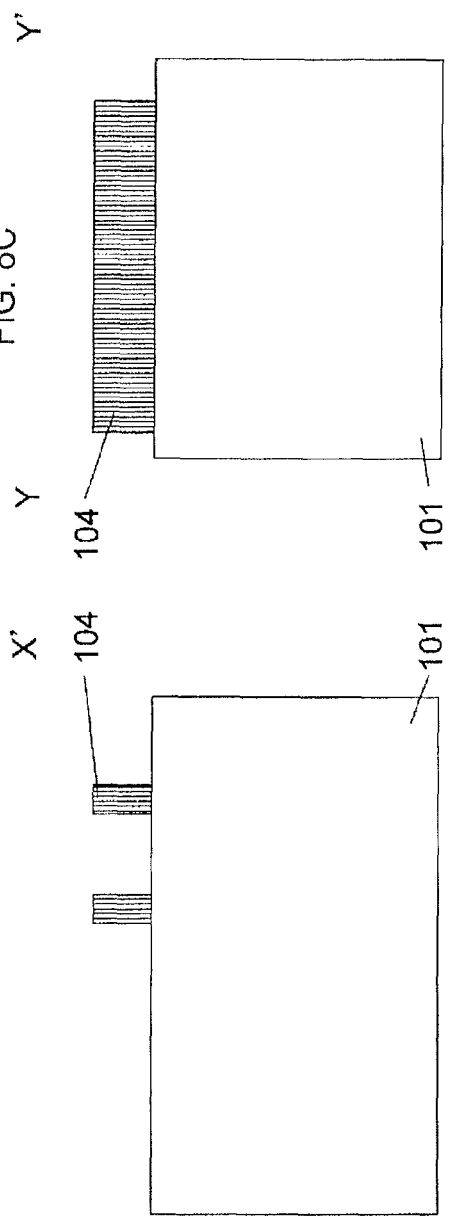

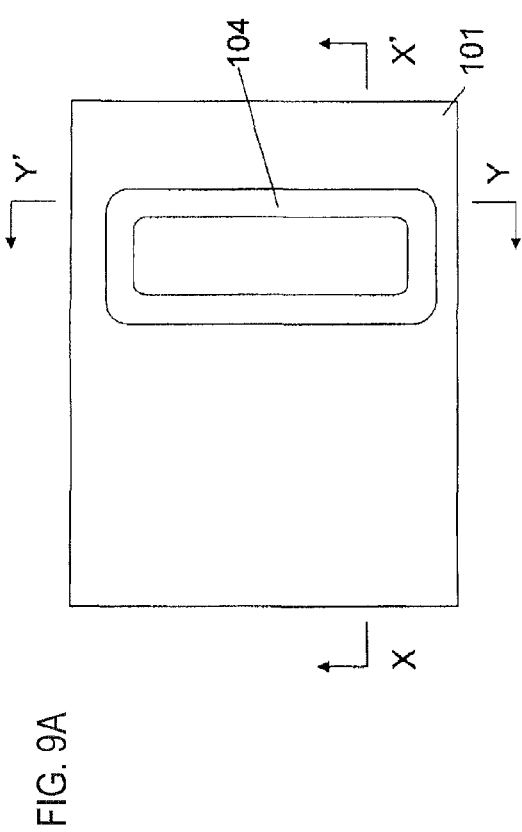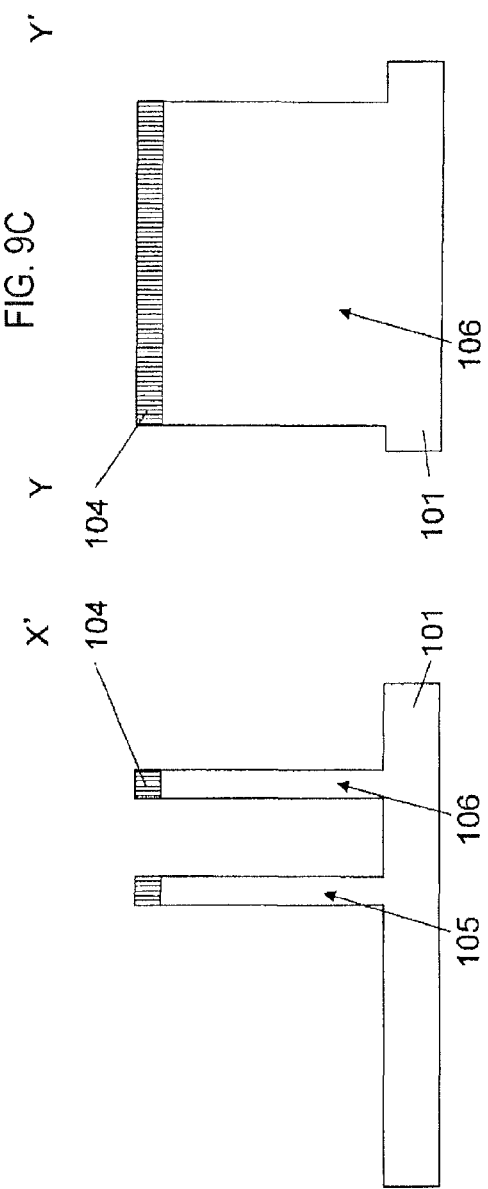

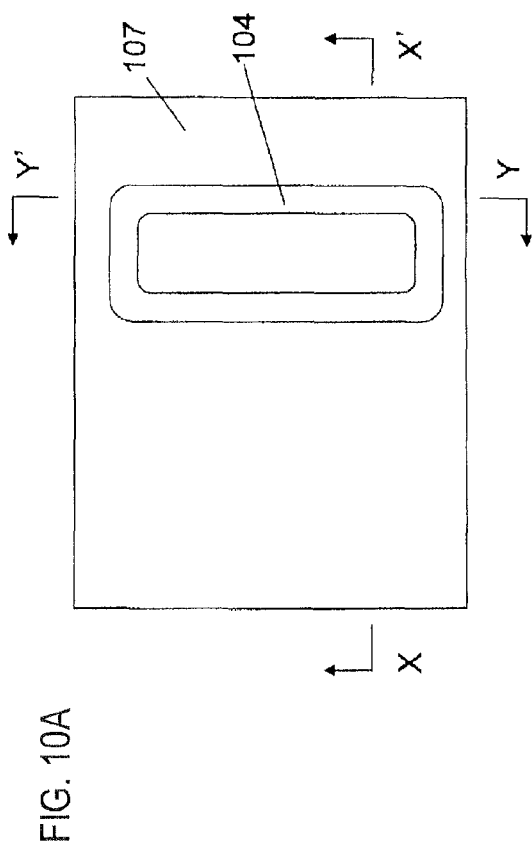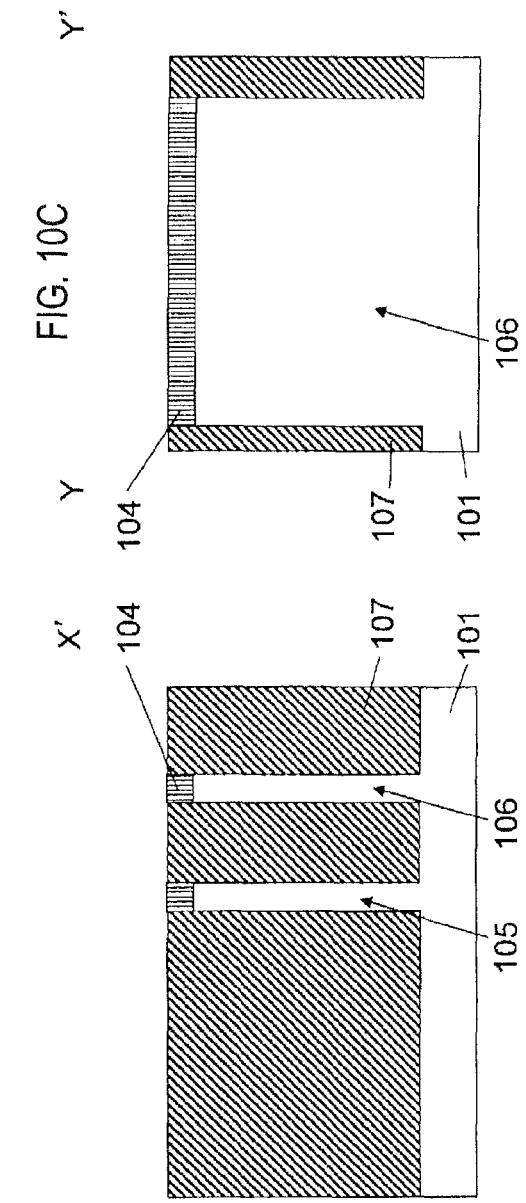

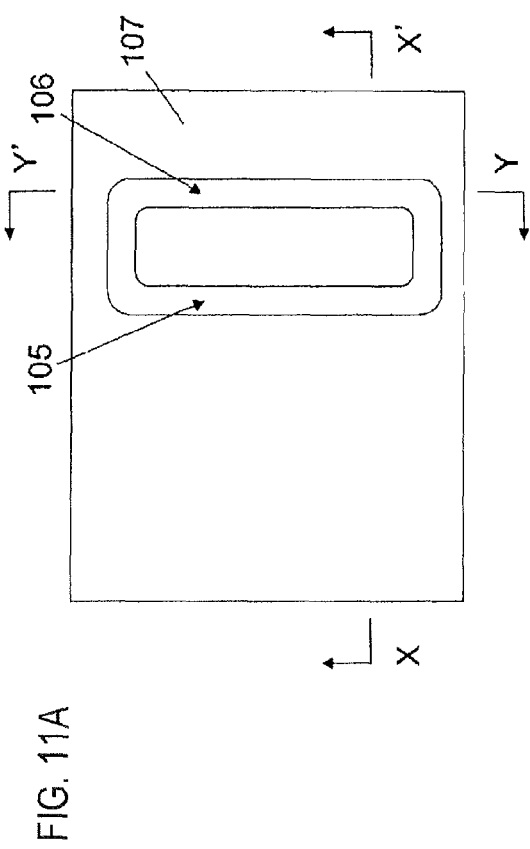
FIG. 11A
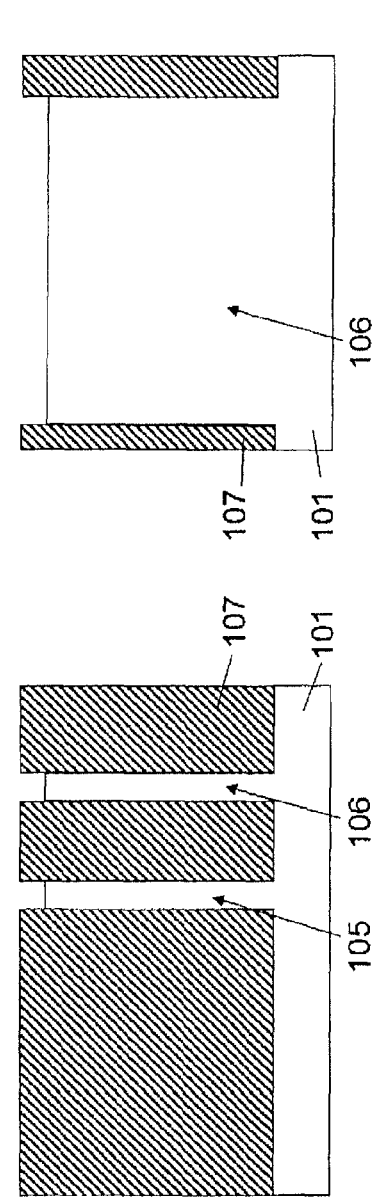
FIG. 11B
FIG. 11C

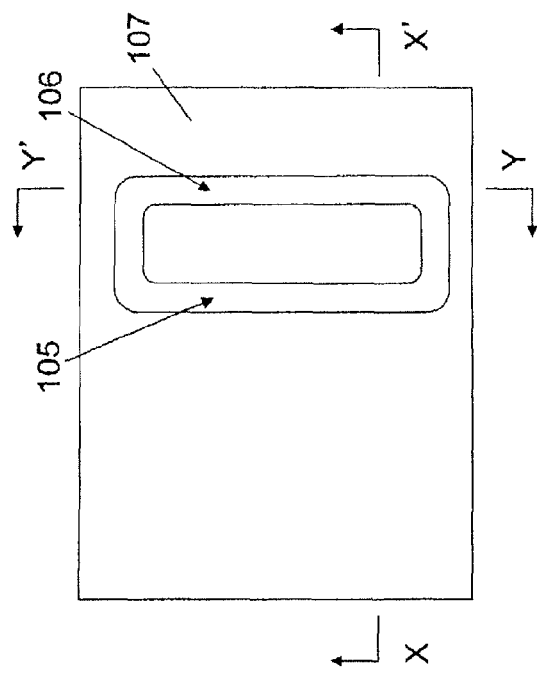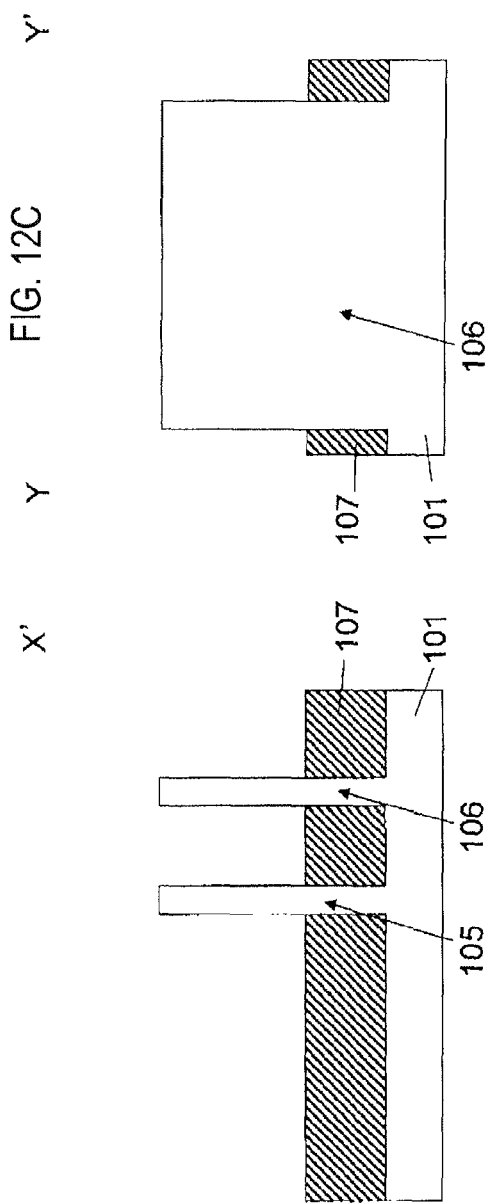

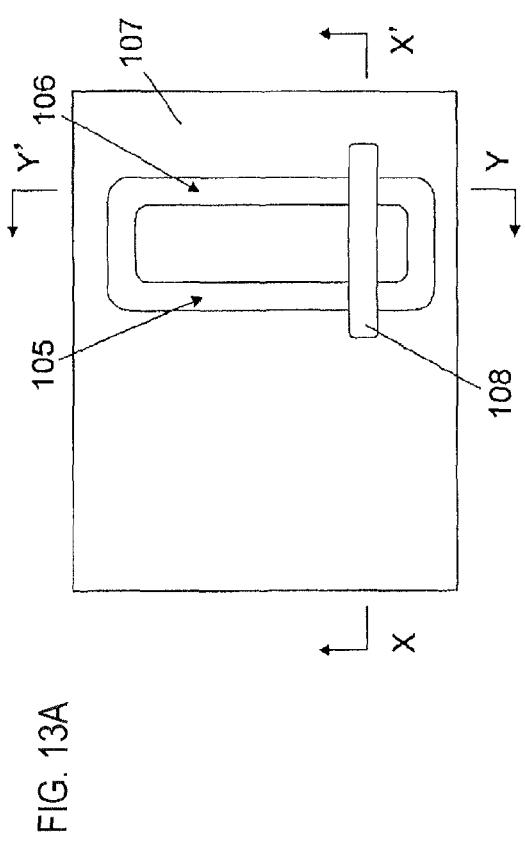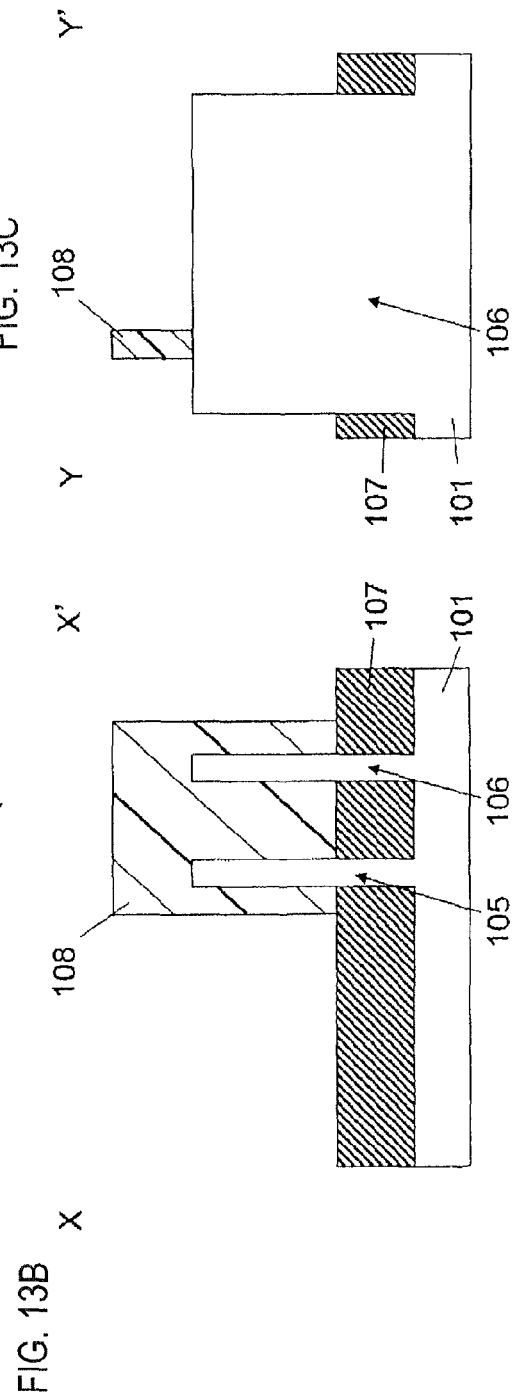

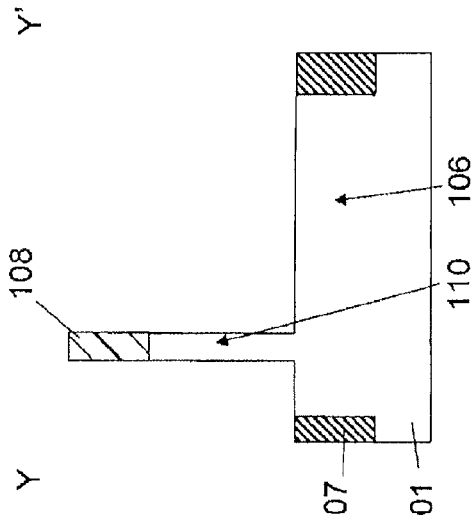
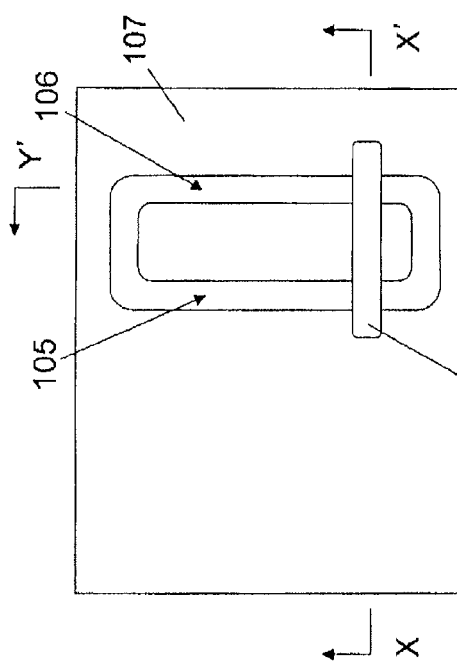
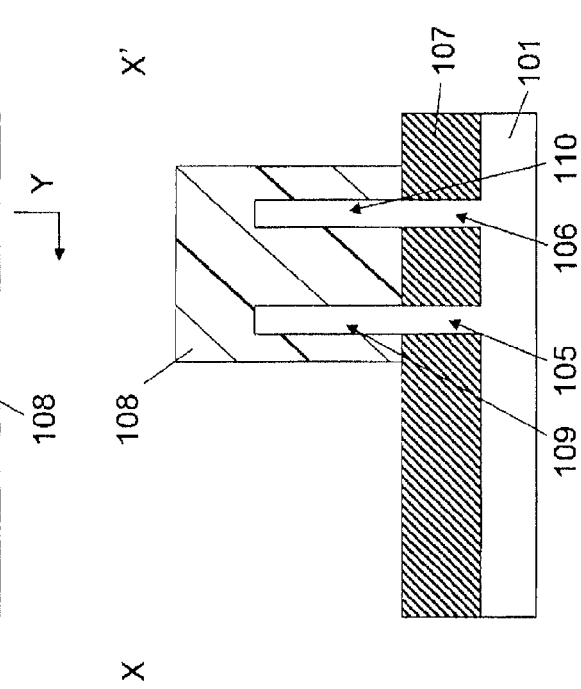

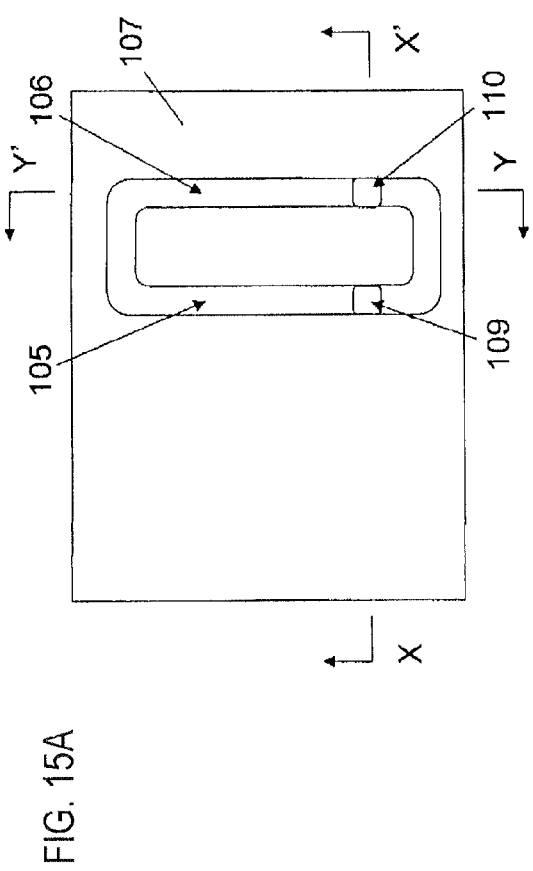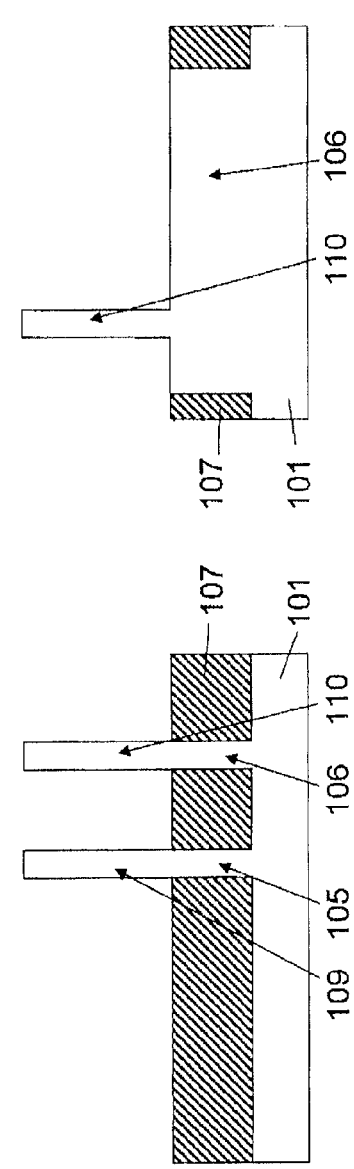

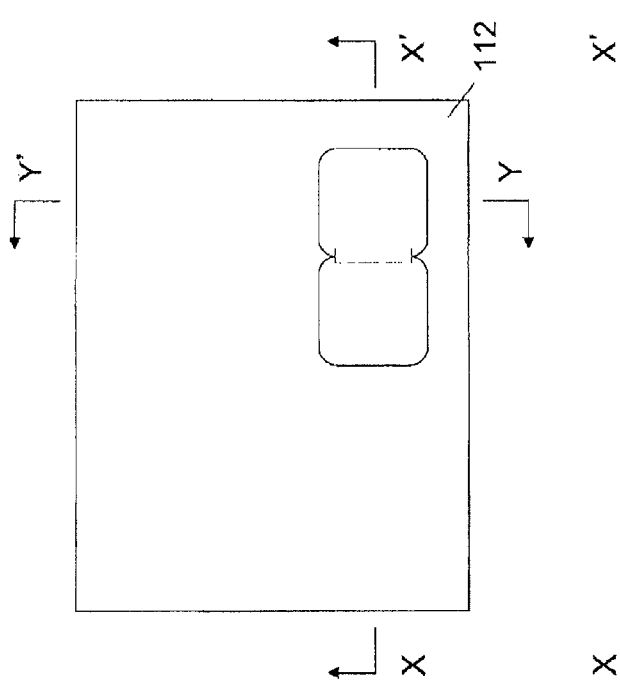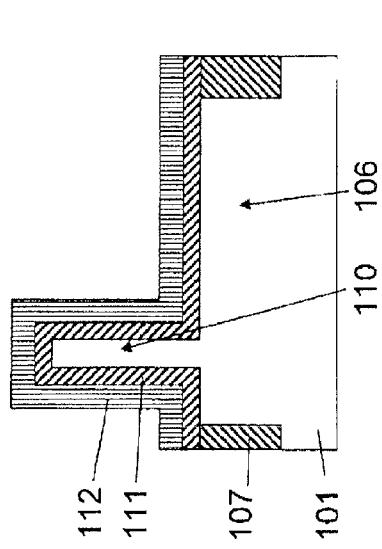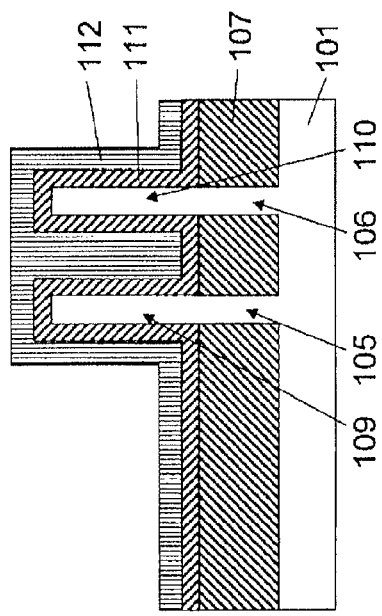
FIG. 16A
FIG. 16B
FIG. 16C

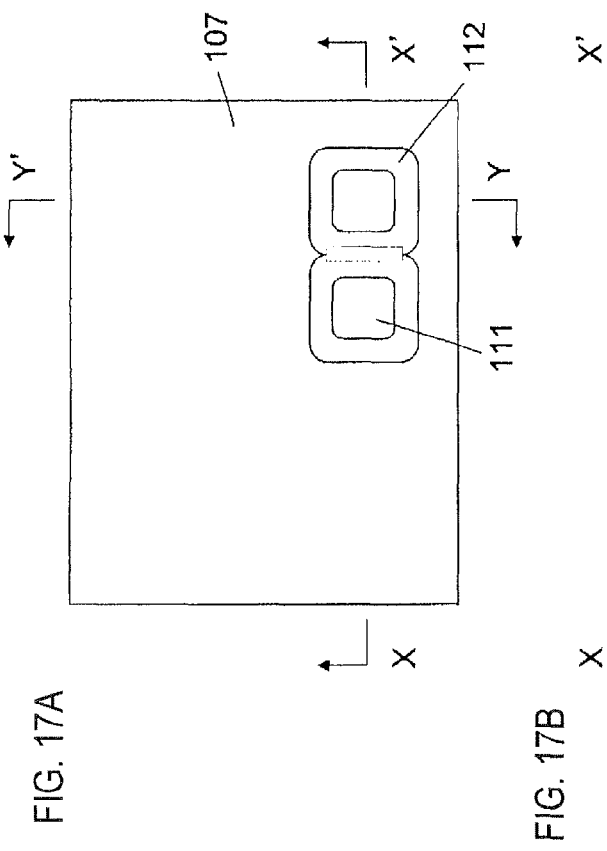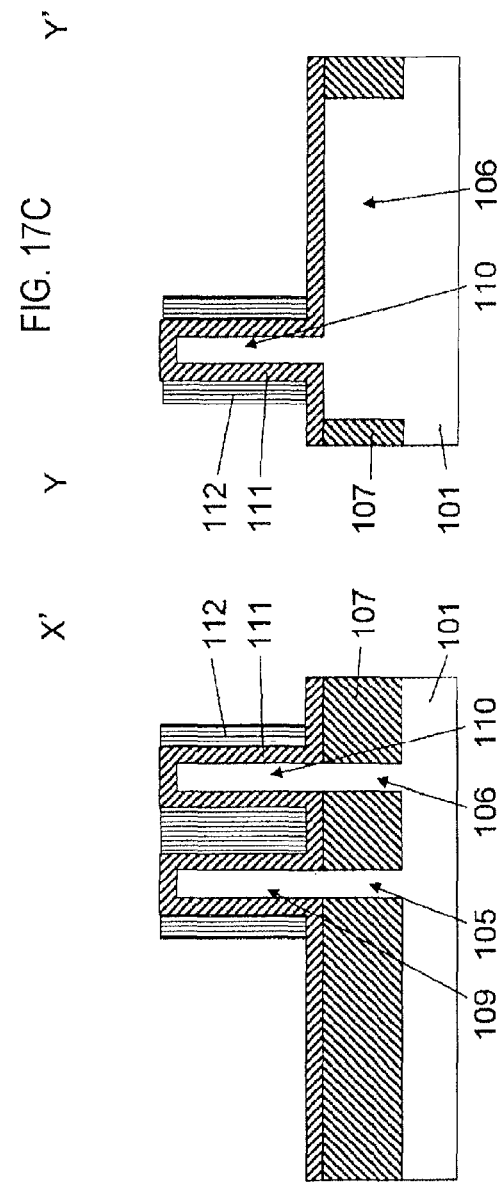

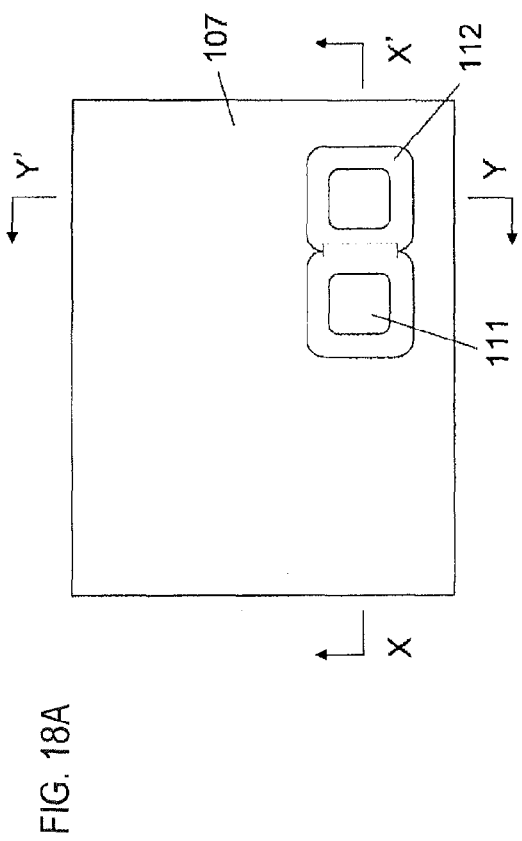
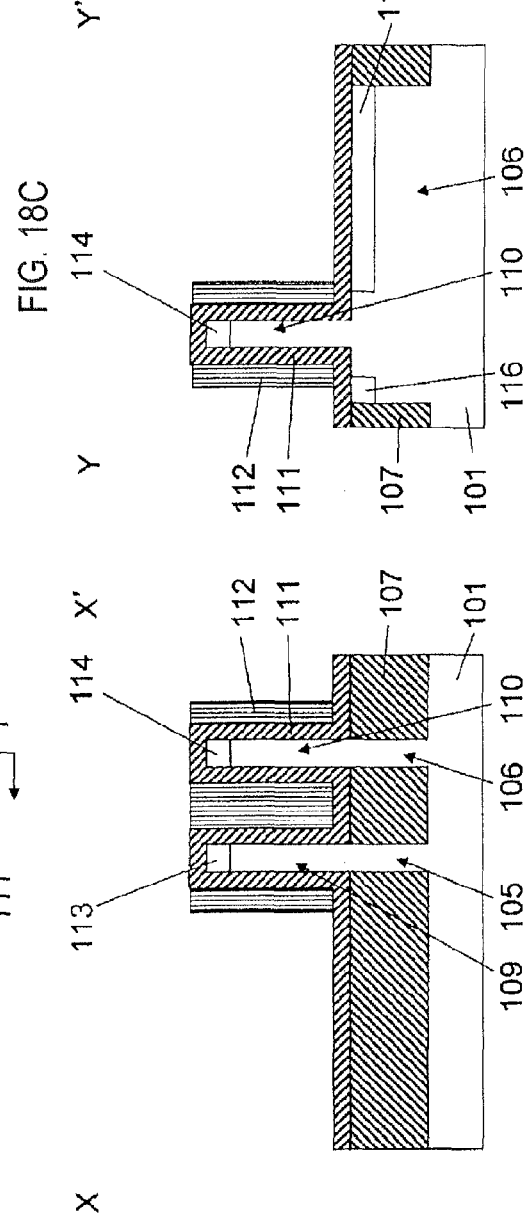

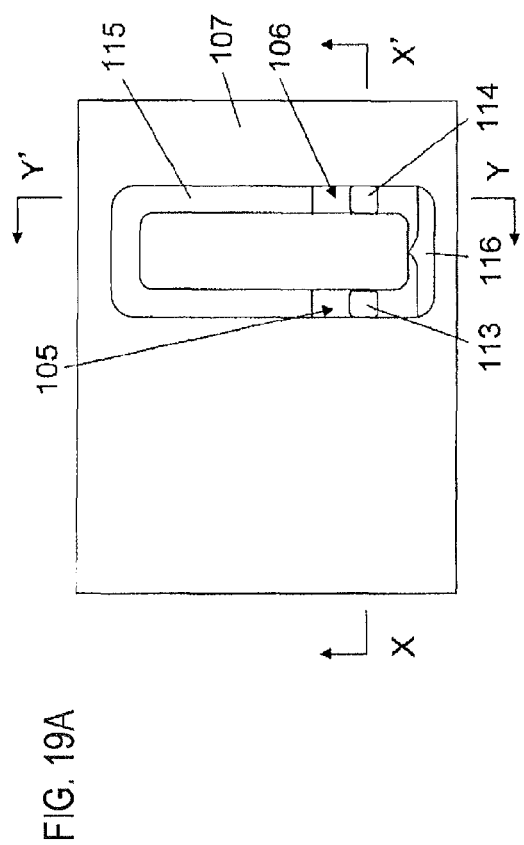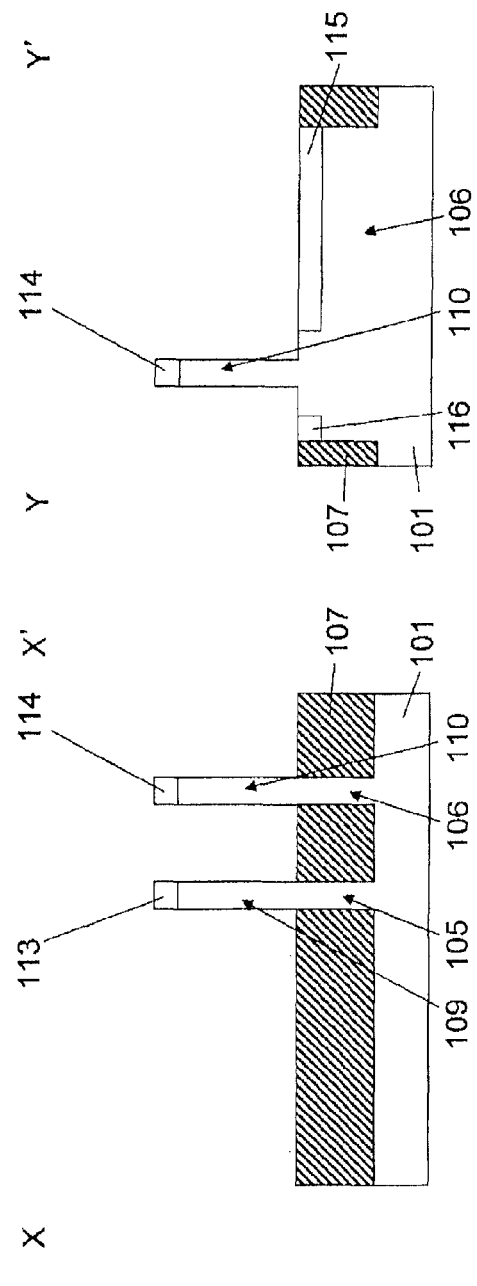

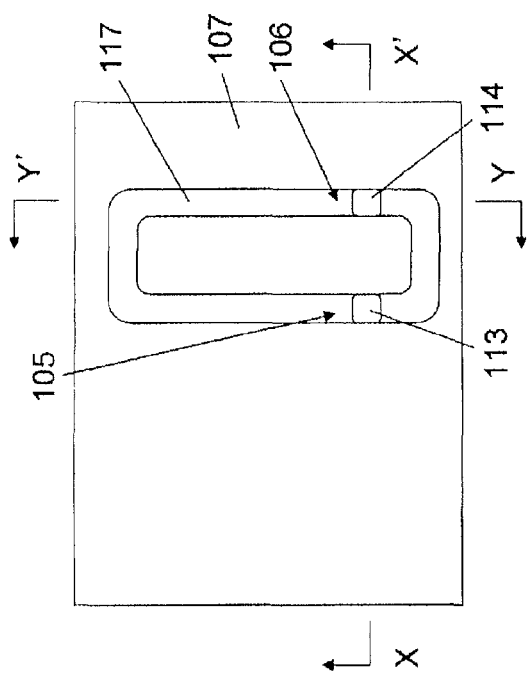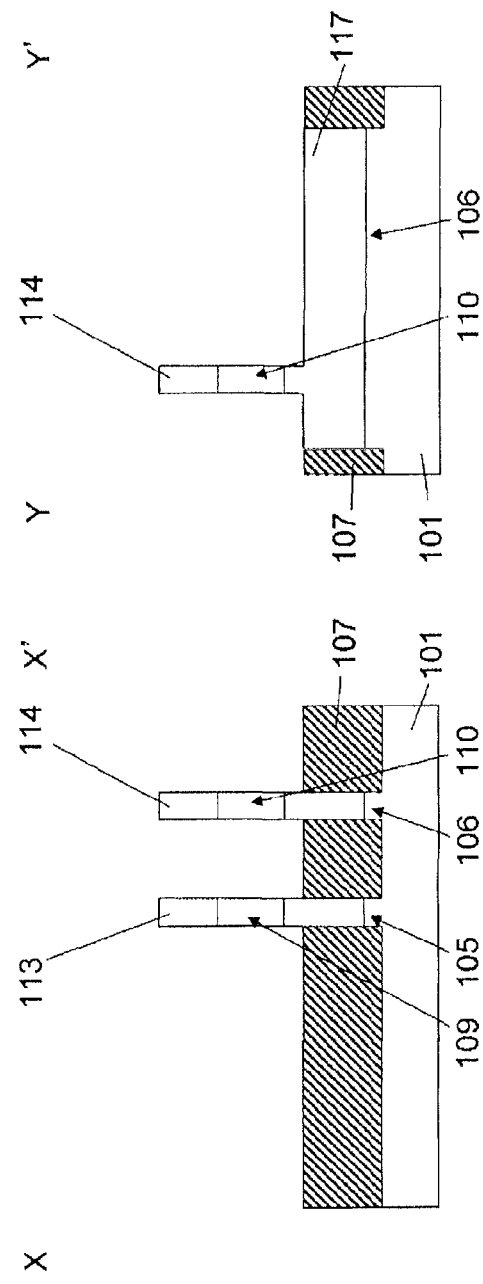
FIG. 20A
FIG. 20B
FIG. 20C

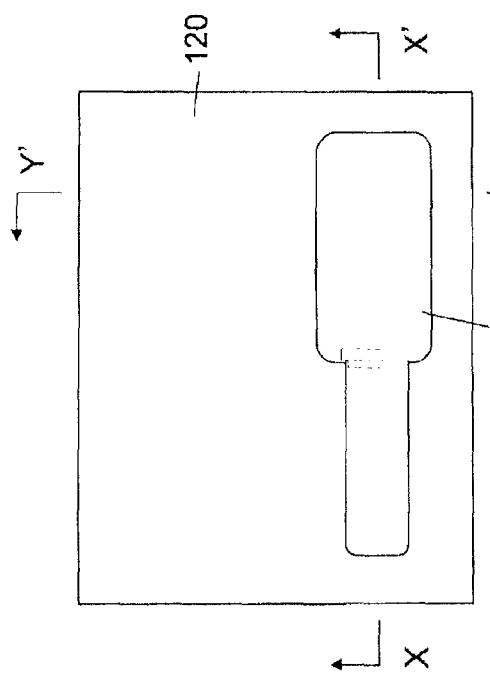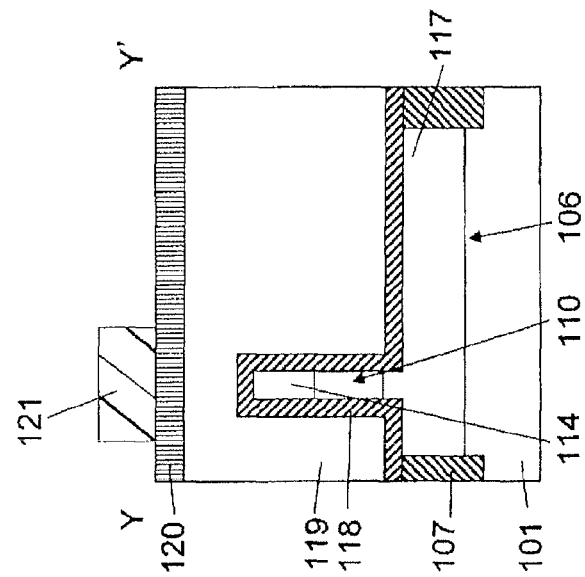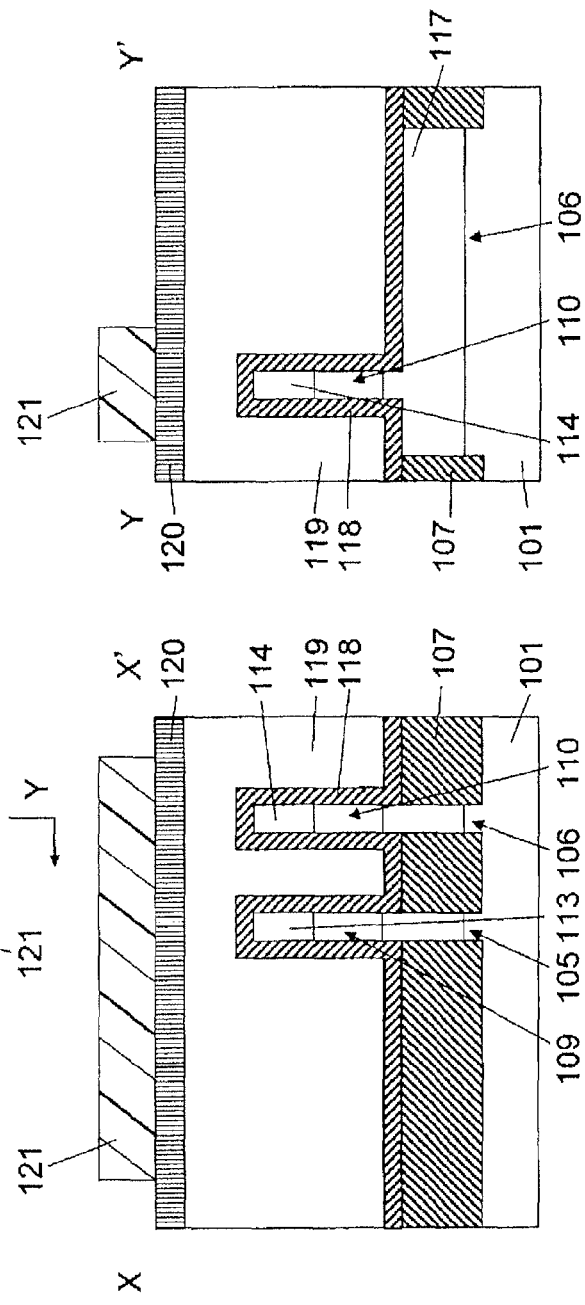

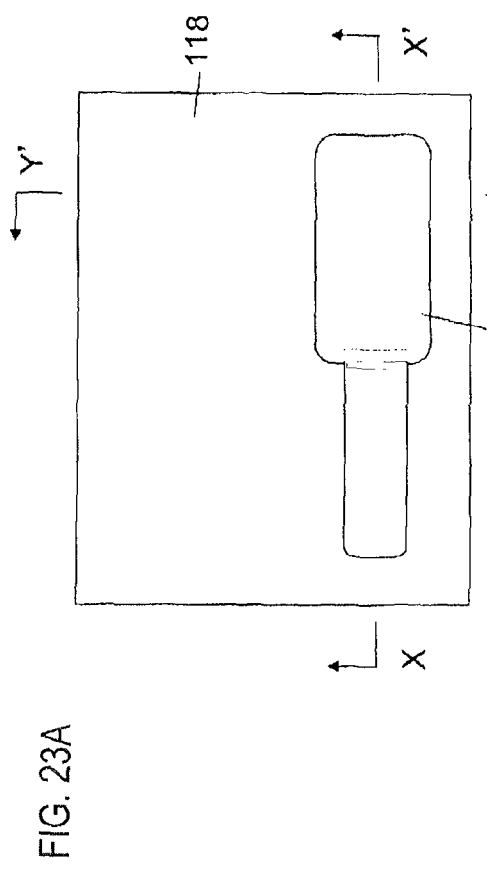
FIG. 23A
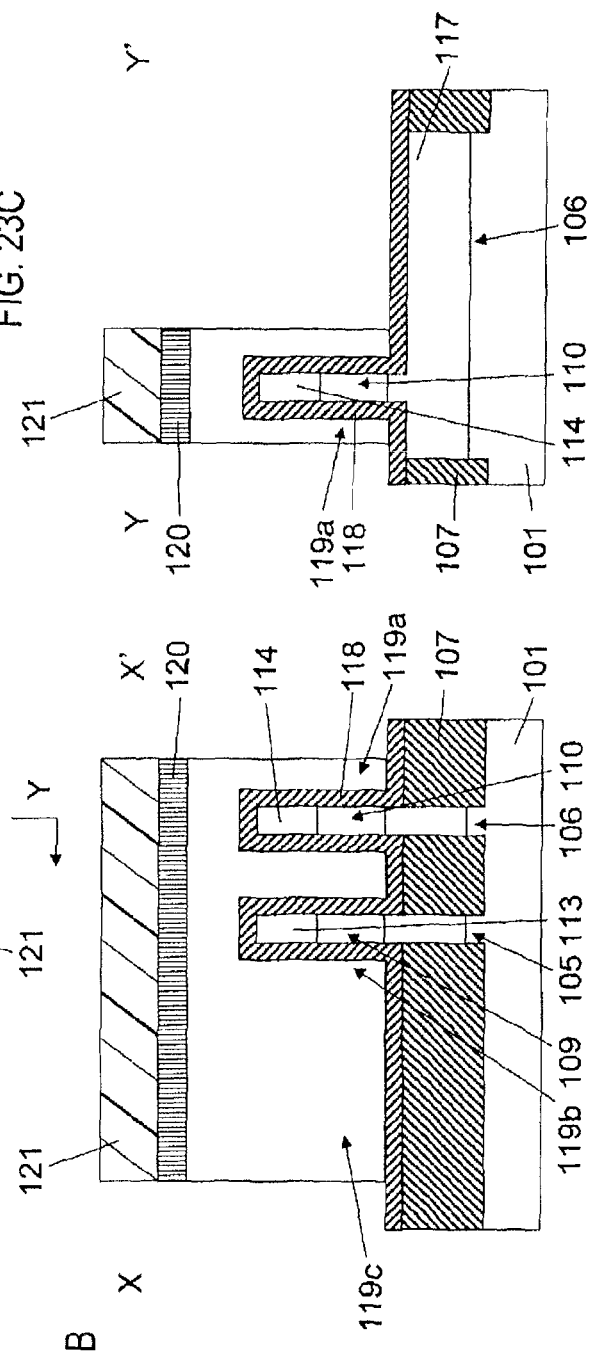
FIG. 23B
FIG. 23C

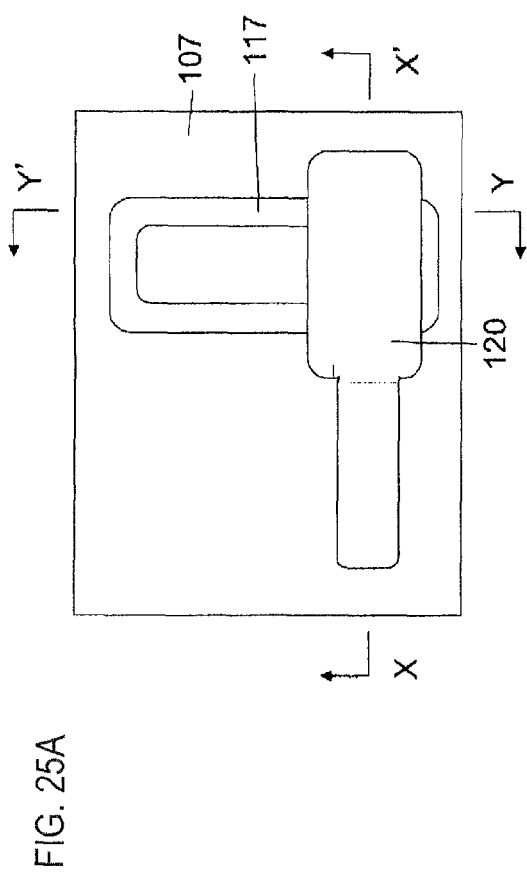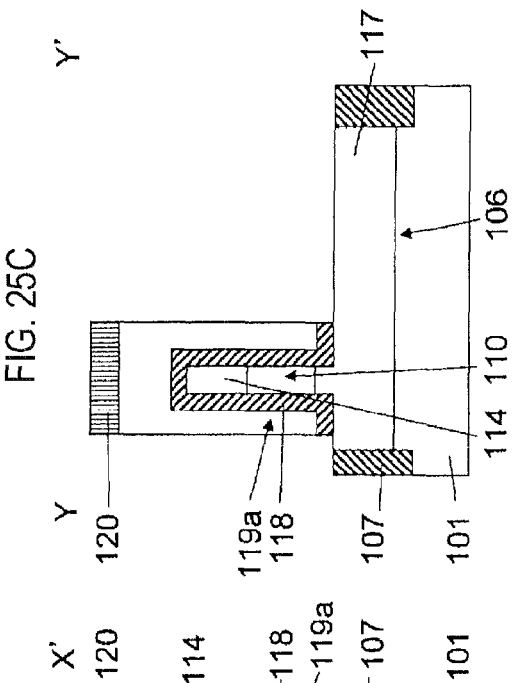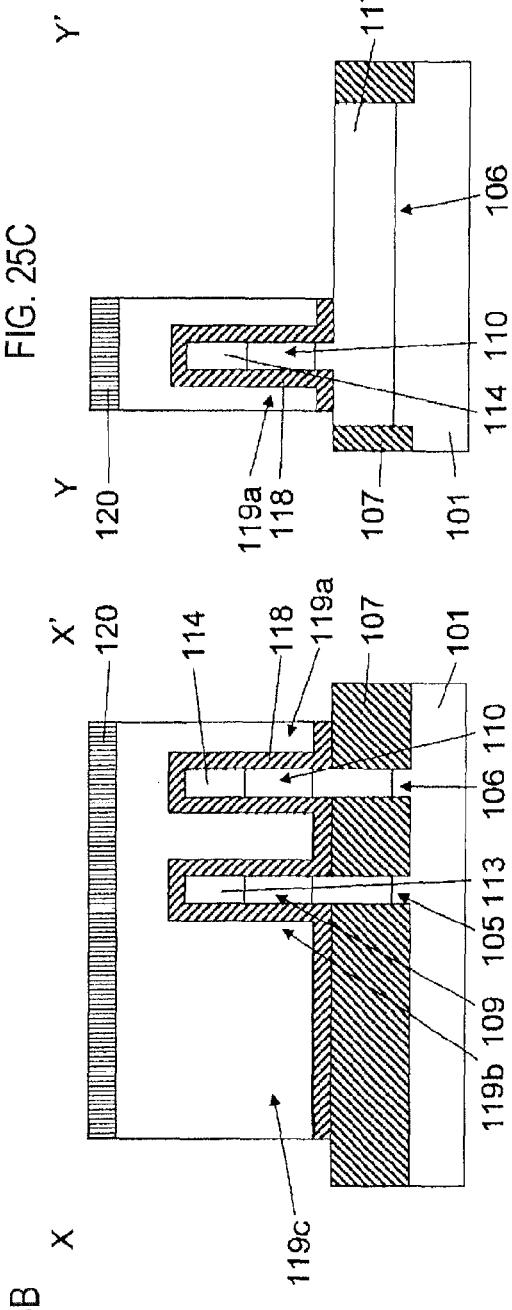
FIG. 25A
FIG. 25C
FIG. 25B

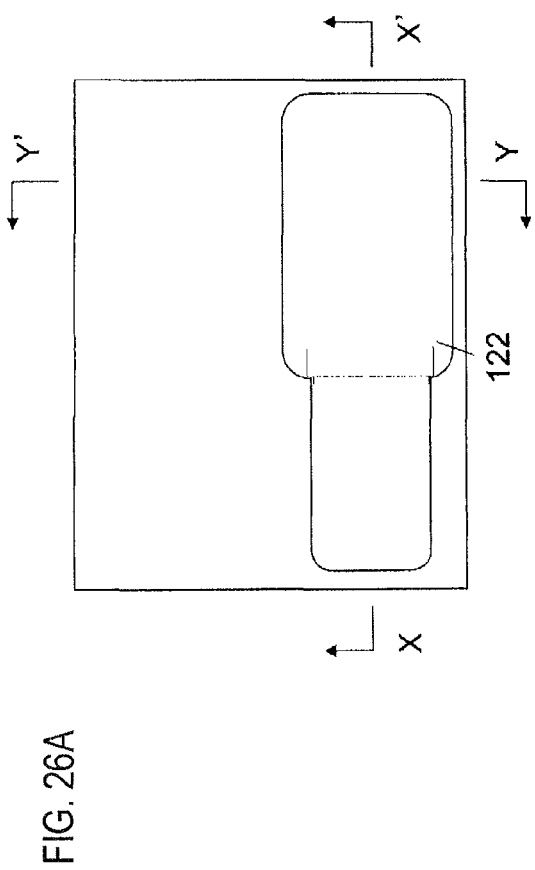
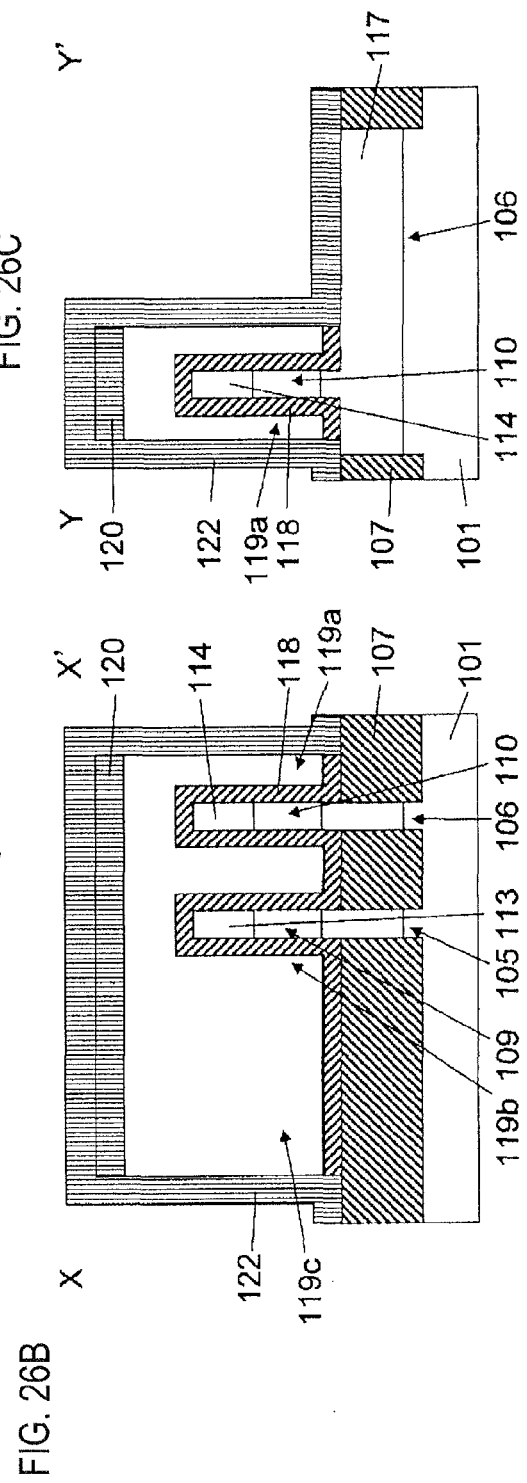
FIG. 26A
FIG. 26B
FIG. 26C

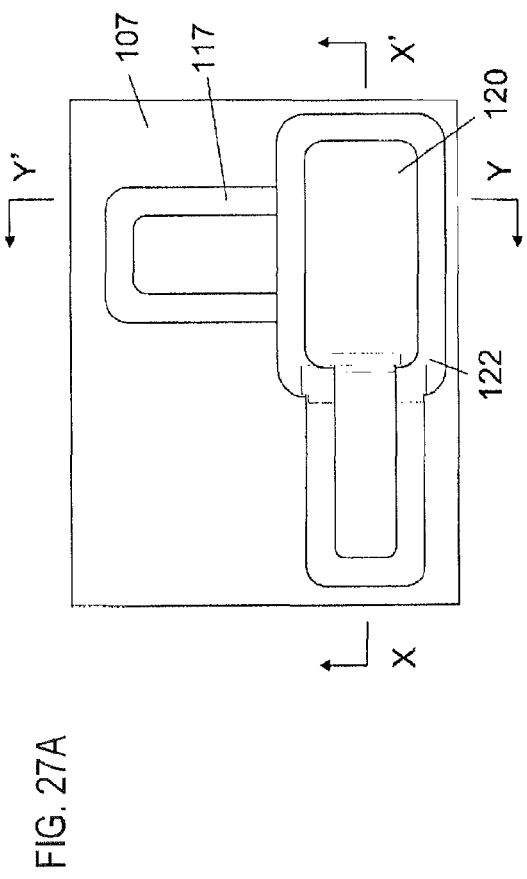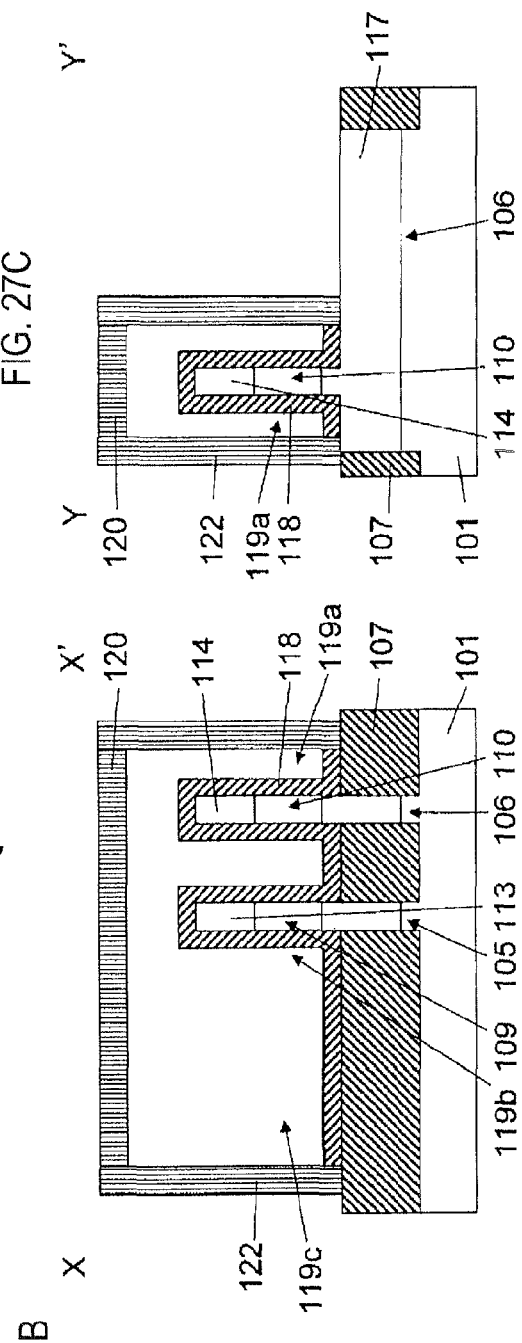
FIG. 27A
FIG. 27B
FIG. 27C

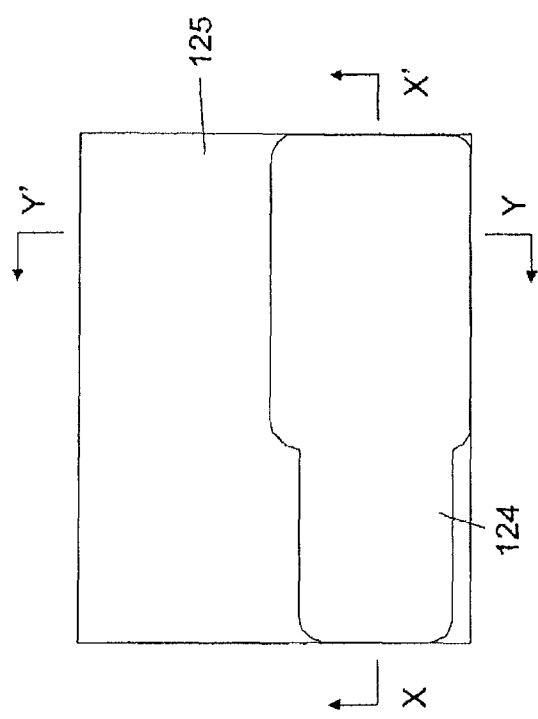
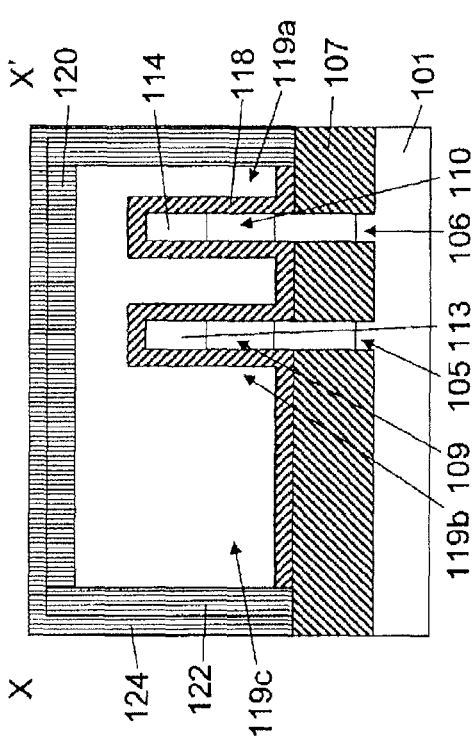
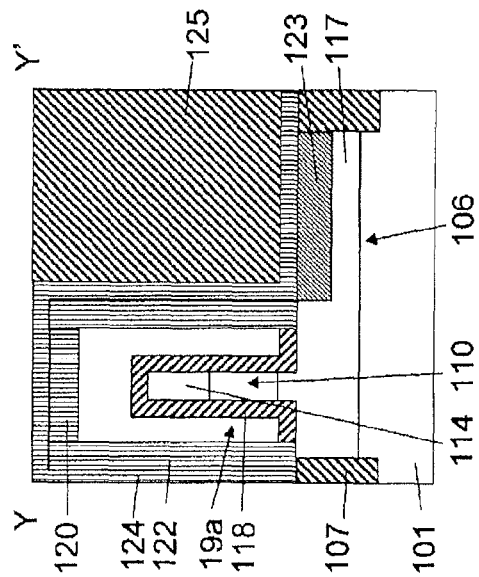
FIG. 30A
FIG. 30B
FIG. 30C

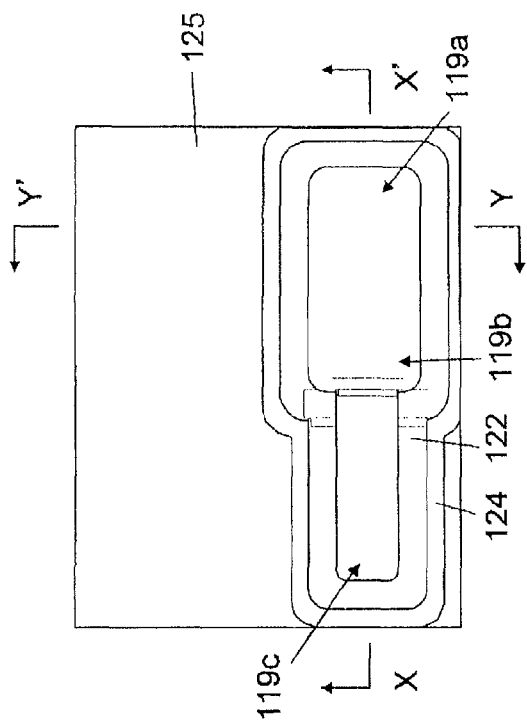
FIG. 31A
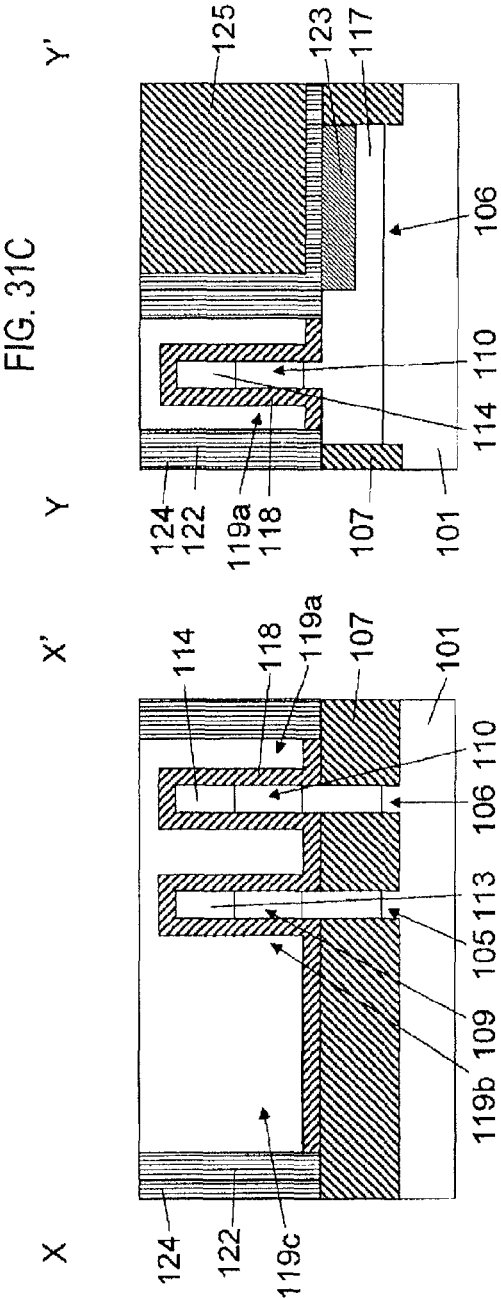
FIG. 31C
FIG. 31B

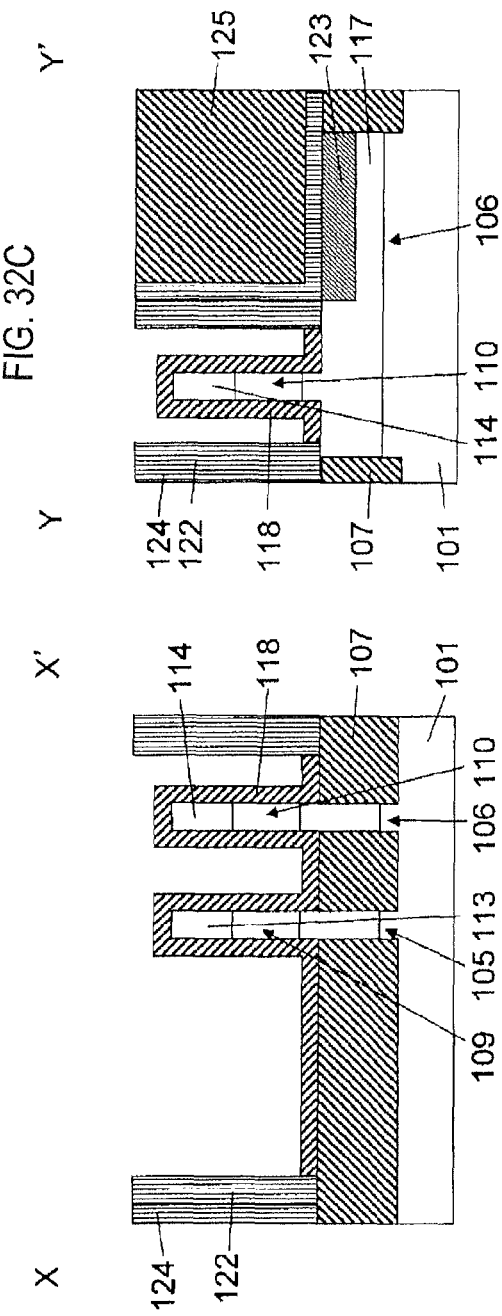
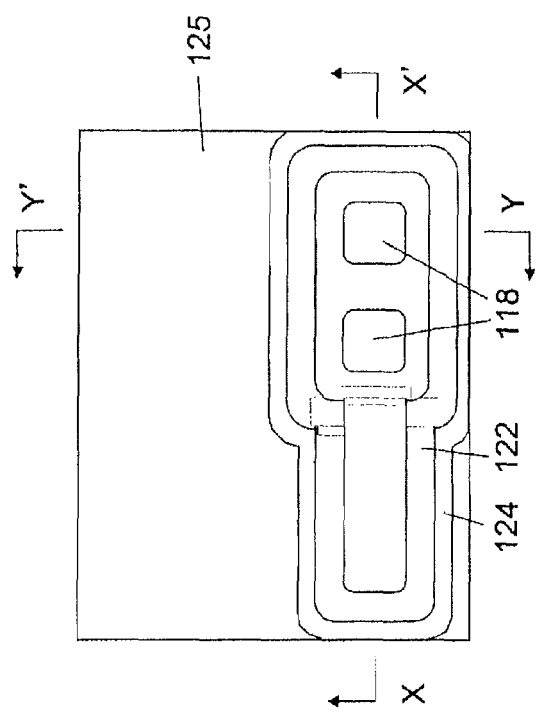
FIG. 32A
FIG. 32B
FIG. 32C

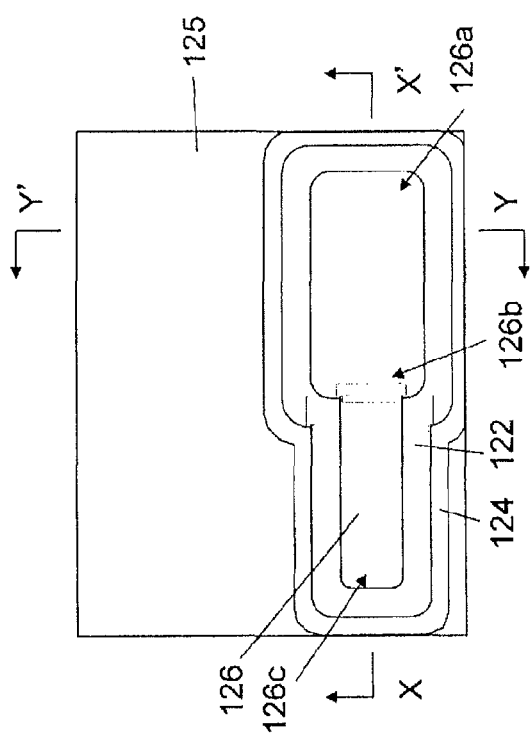
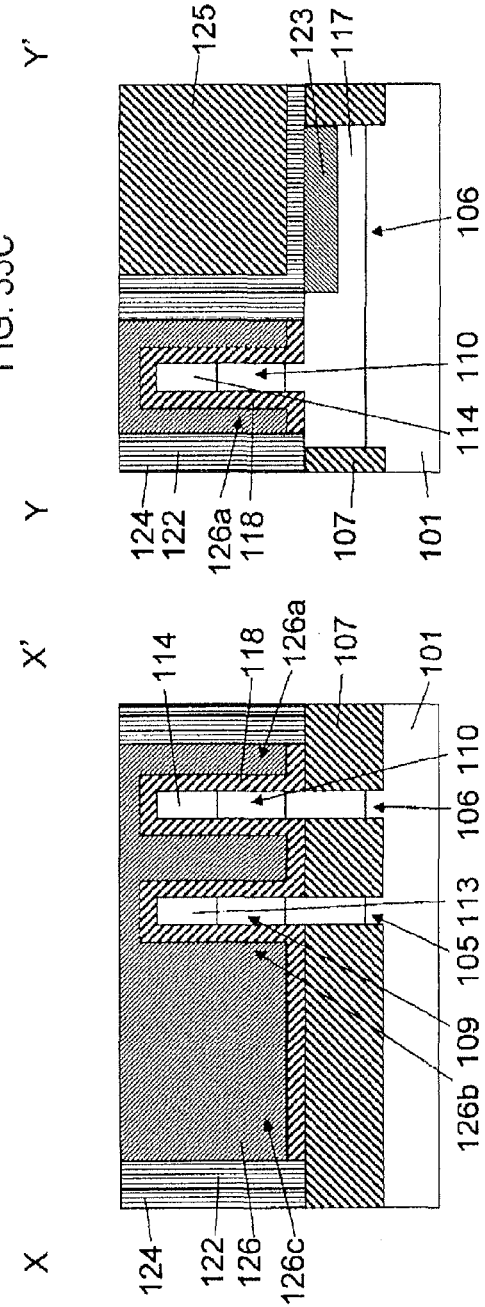
FIG. 33A
FIG. 33B
FIG. 33C

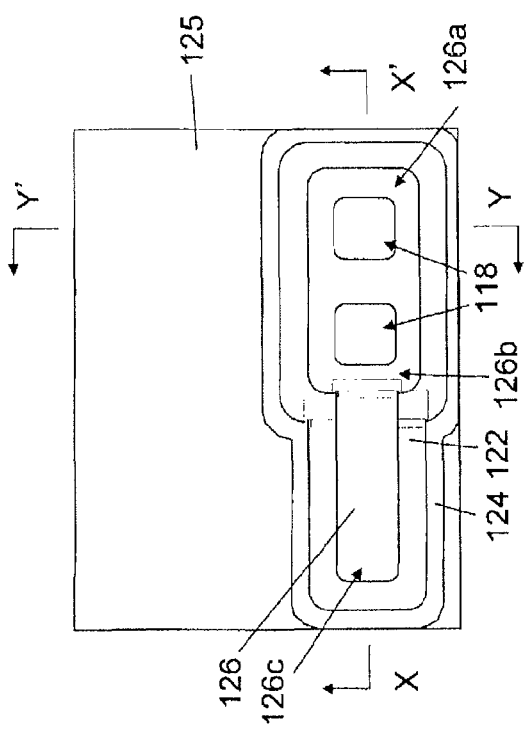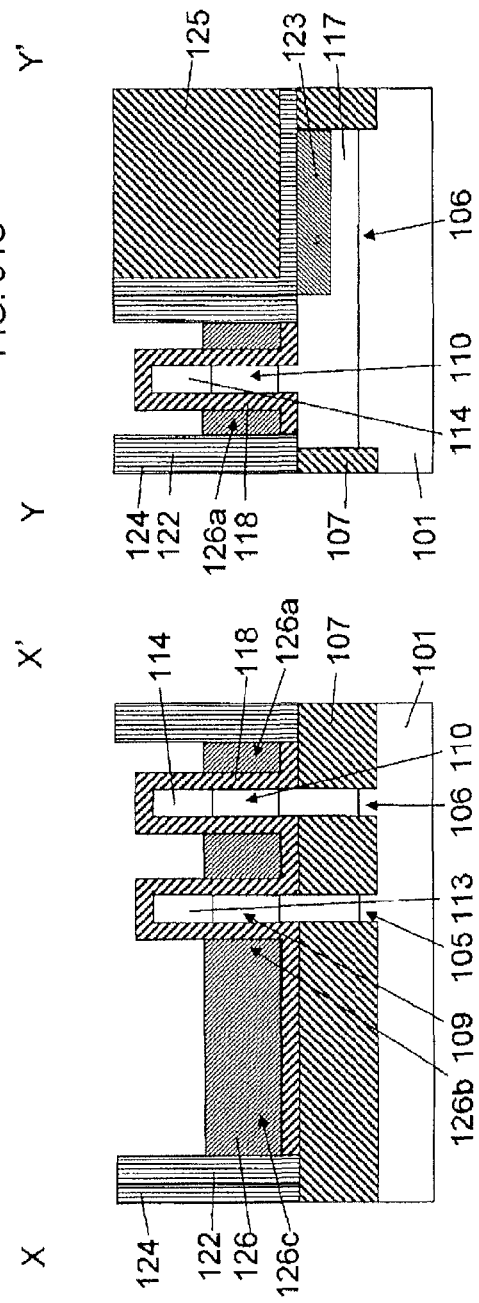
FIG. 34A
FIG. 34B
FIG. 34C

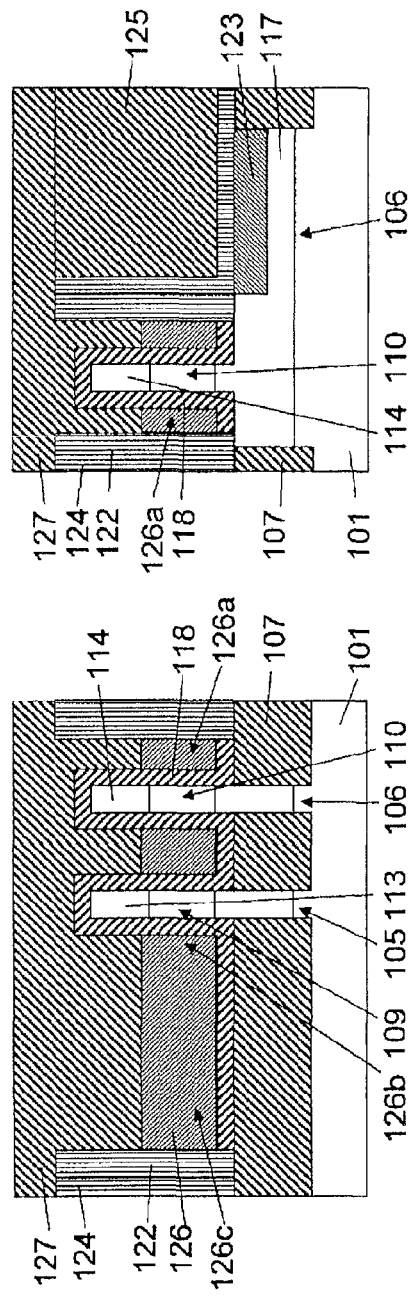
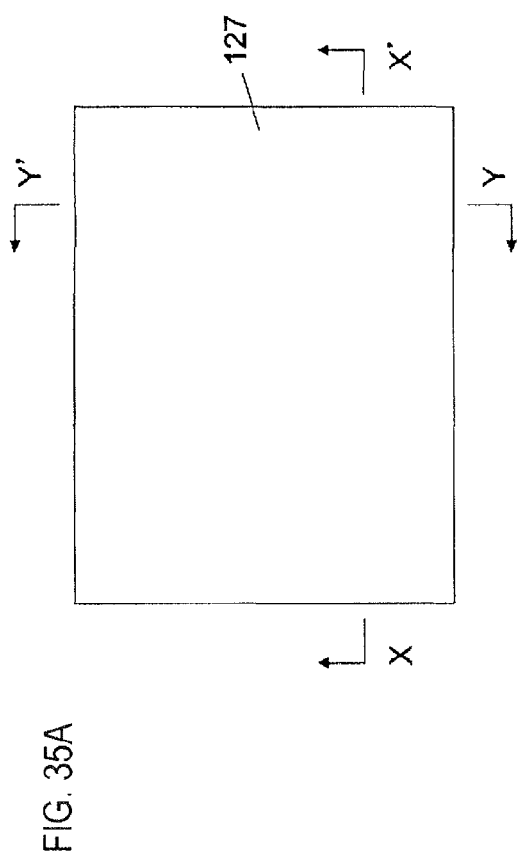
FIG. 35A
FIG. 35B
FIG. 35C

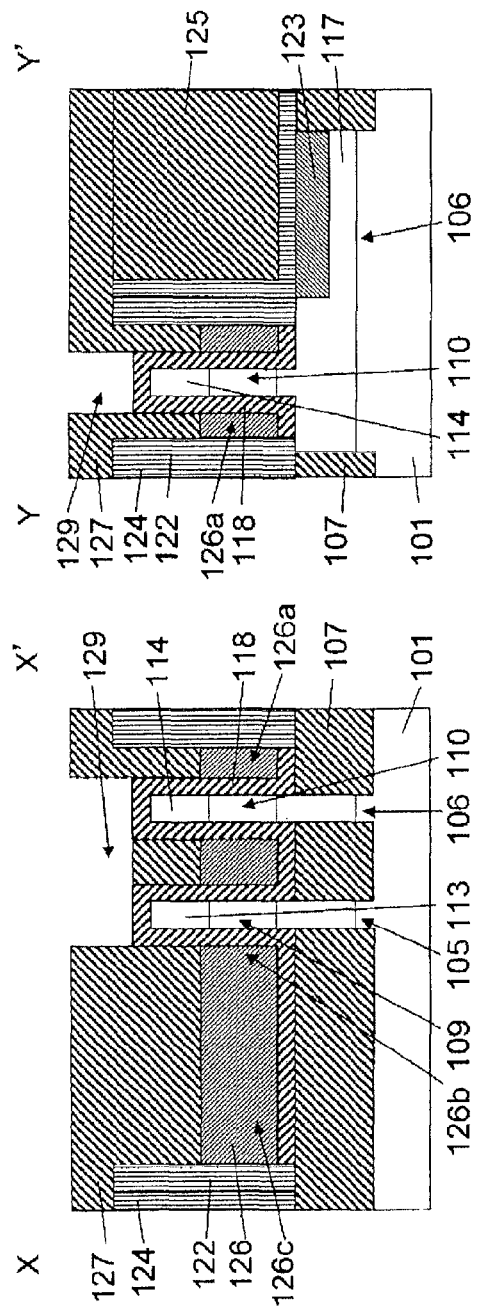
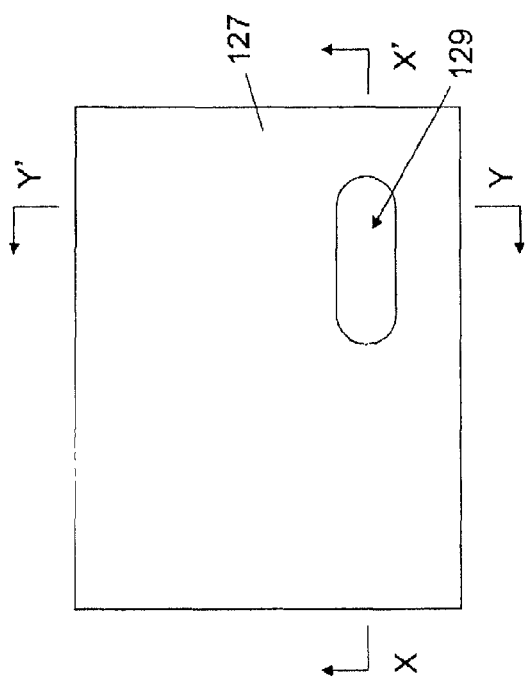
FIG. 38A
FIG. 38B
FIG. 38C

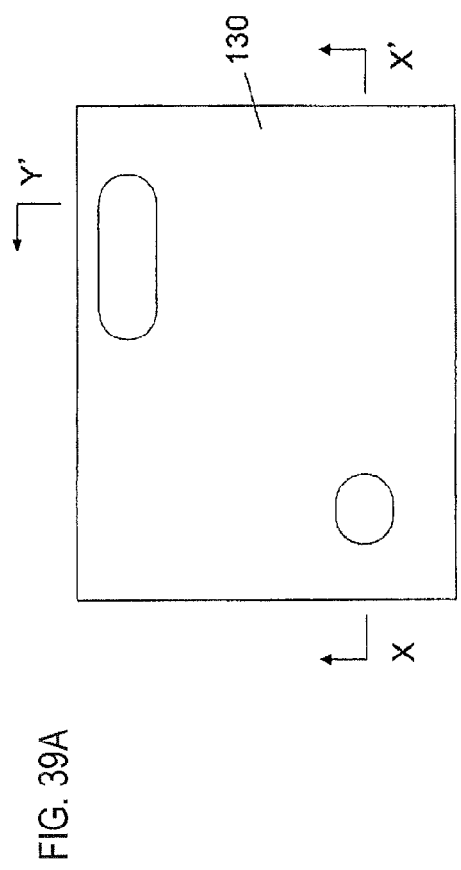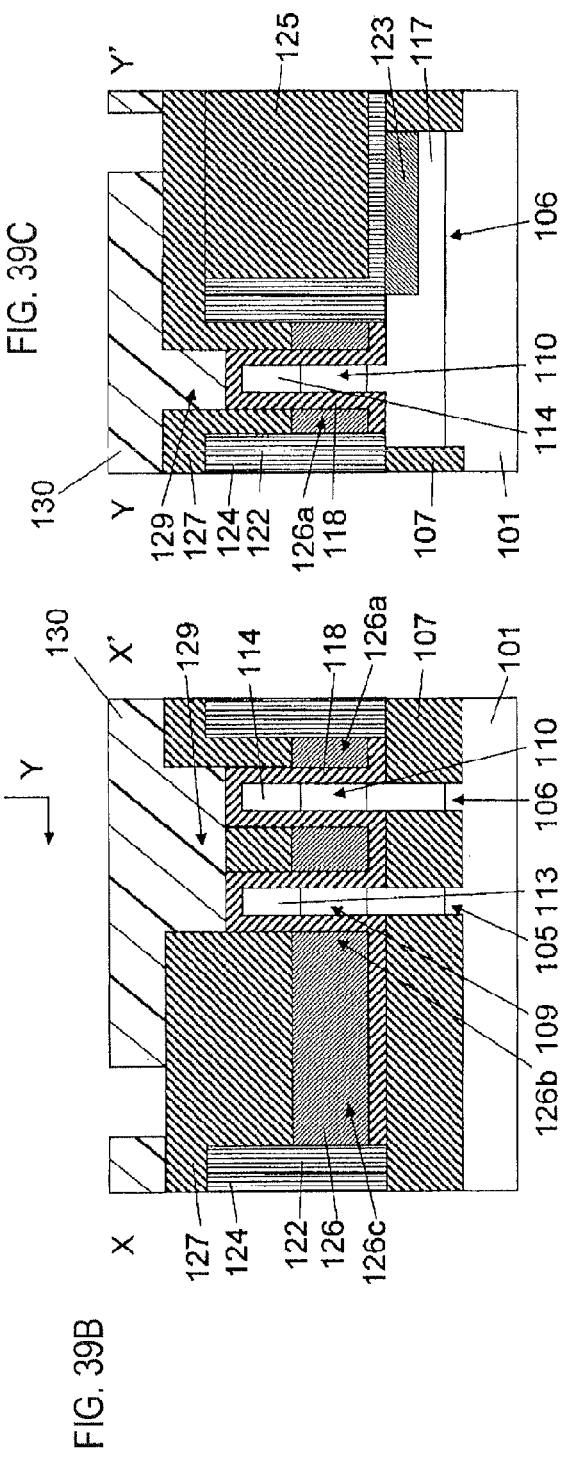

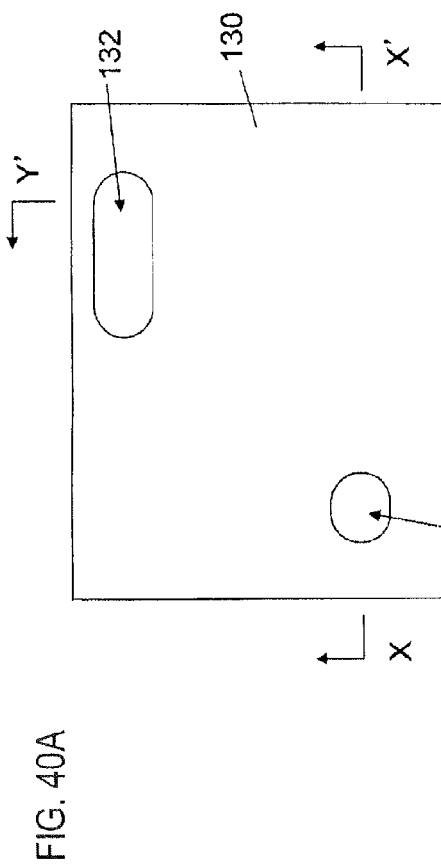
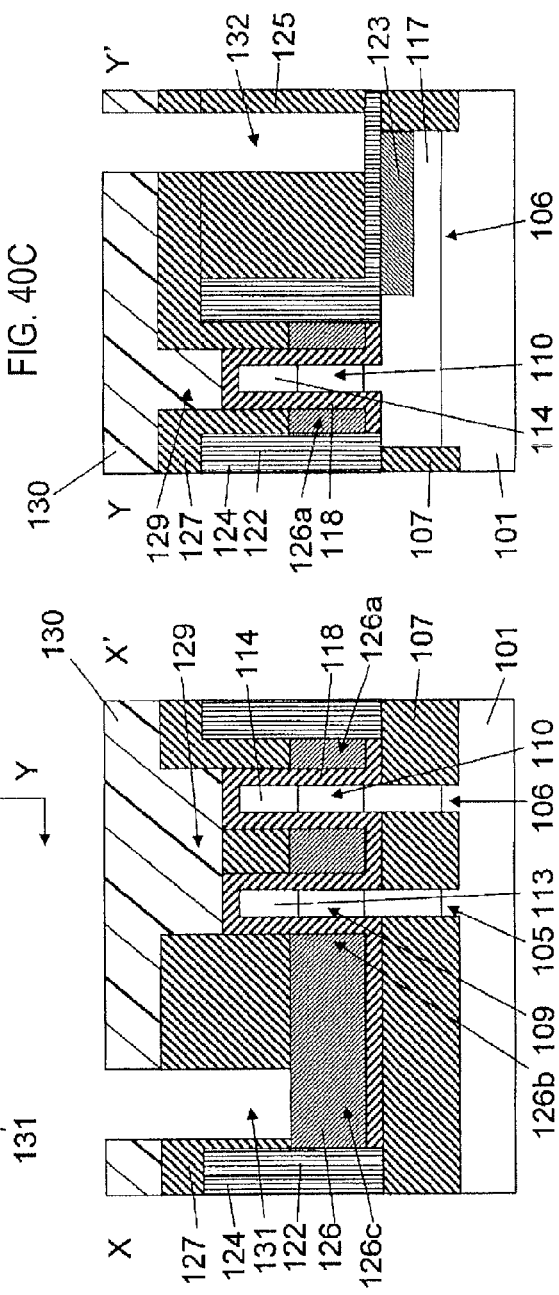
FIG. 40A
FIG. 40B
FIG. 40C

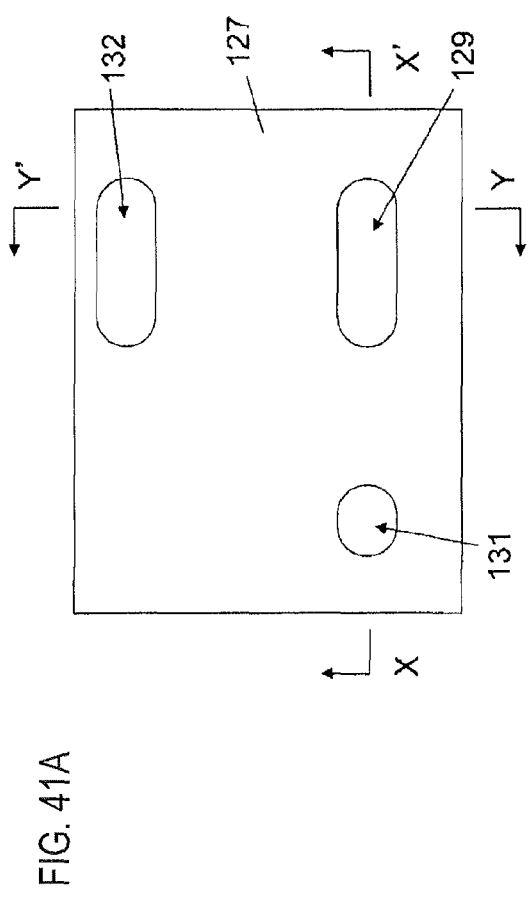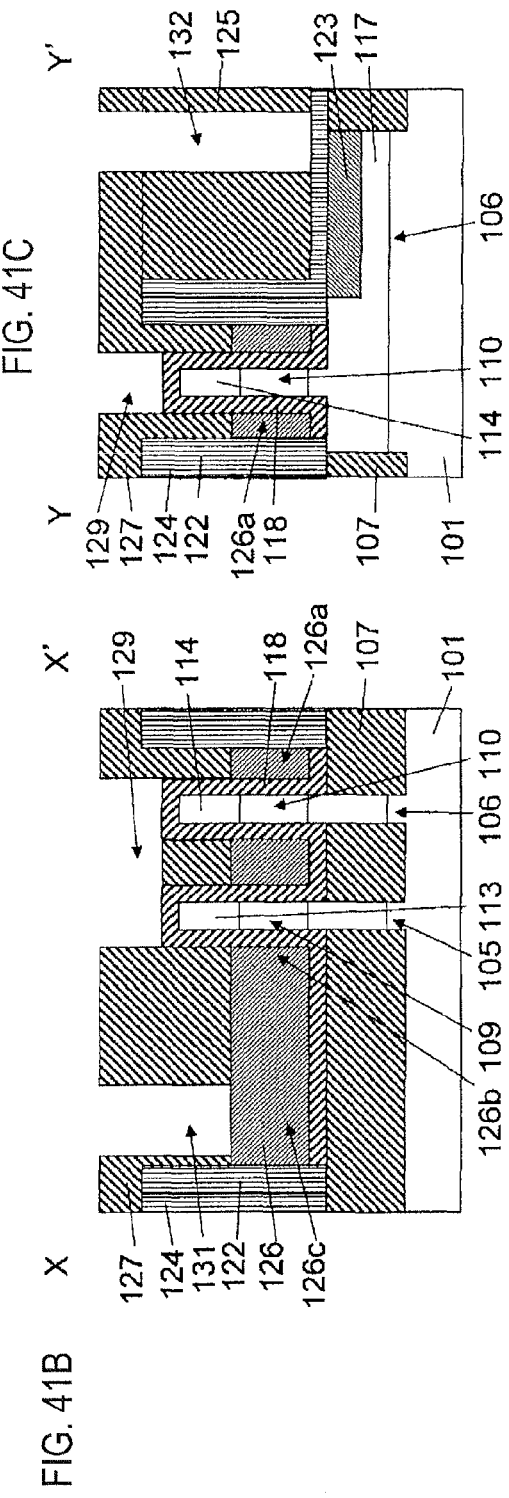
FIG. 41A
FIG. 41B
FIG. 41C

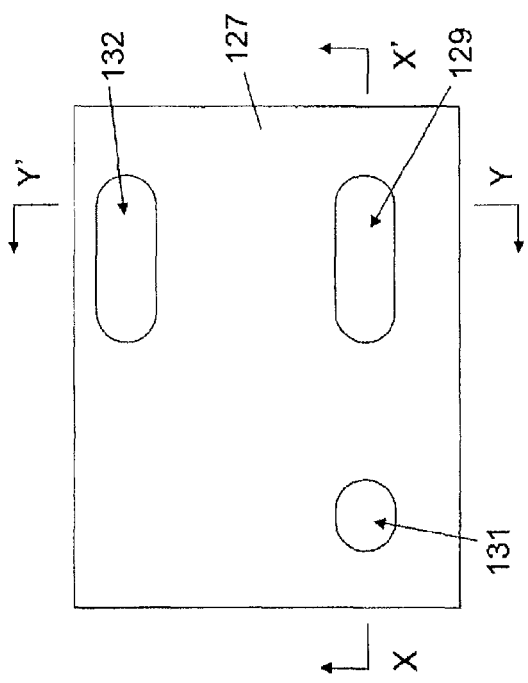
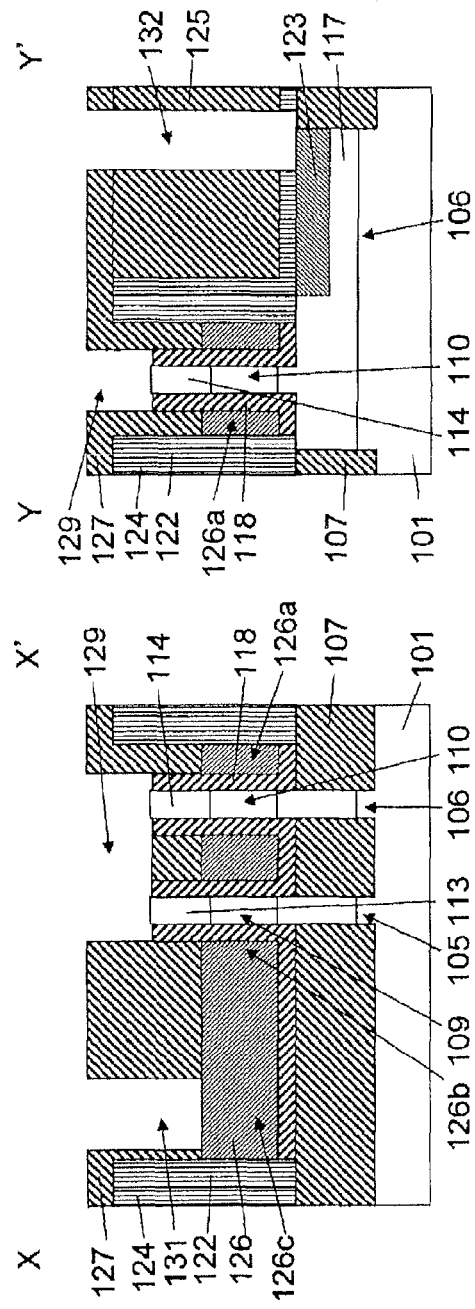
FIG. 42A
FIG. 42B
FIG. 42C

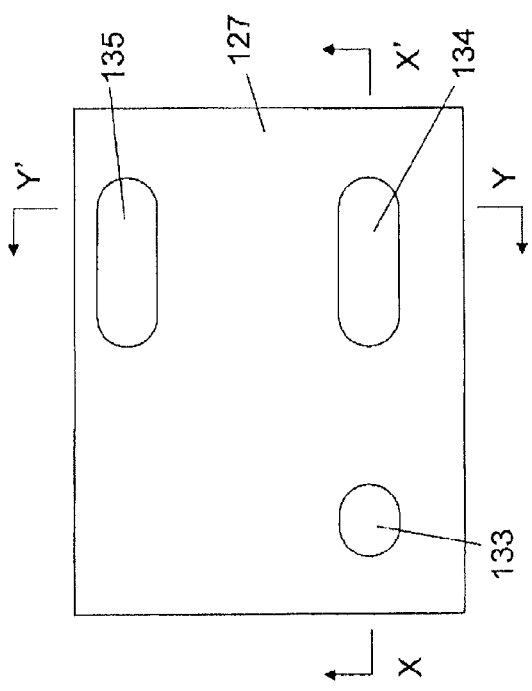
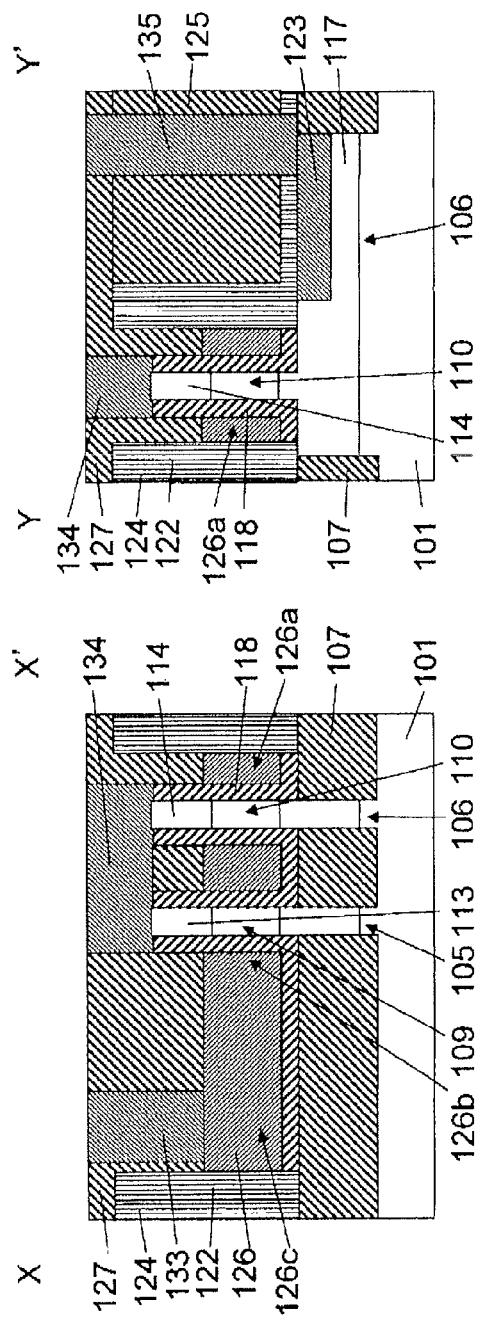
FIG. 43A
FIG. 43B
FIG. 43C

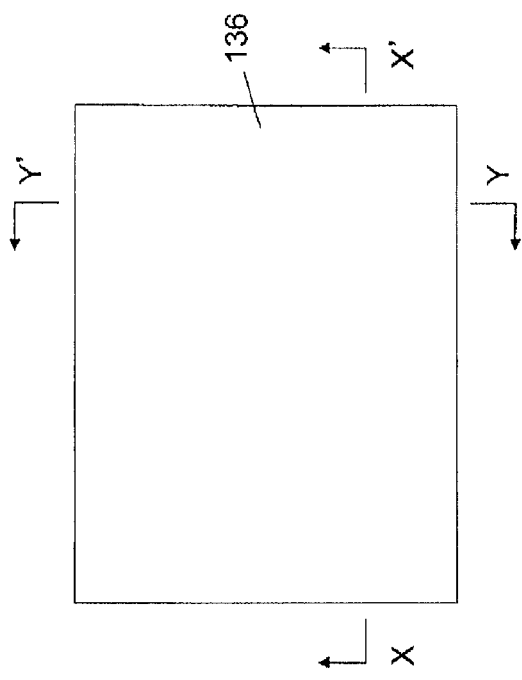
FIG. 44A
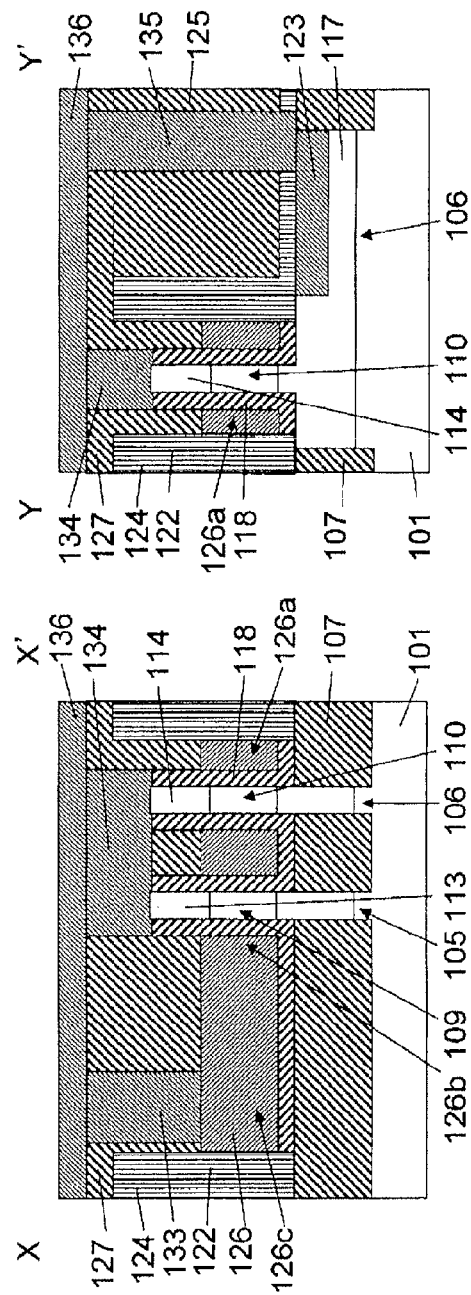
FIG. 44B
FIG. 44C

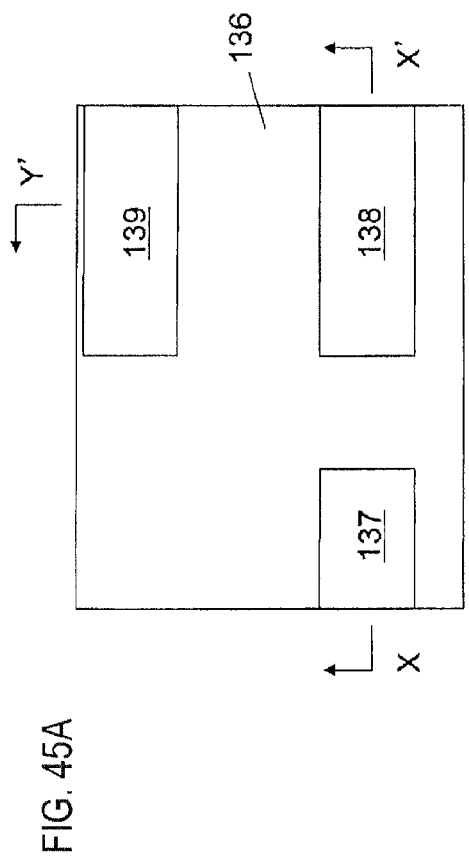
FIG. 45A
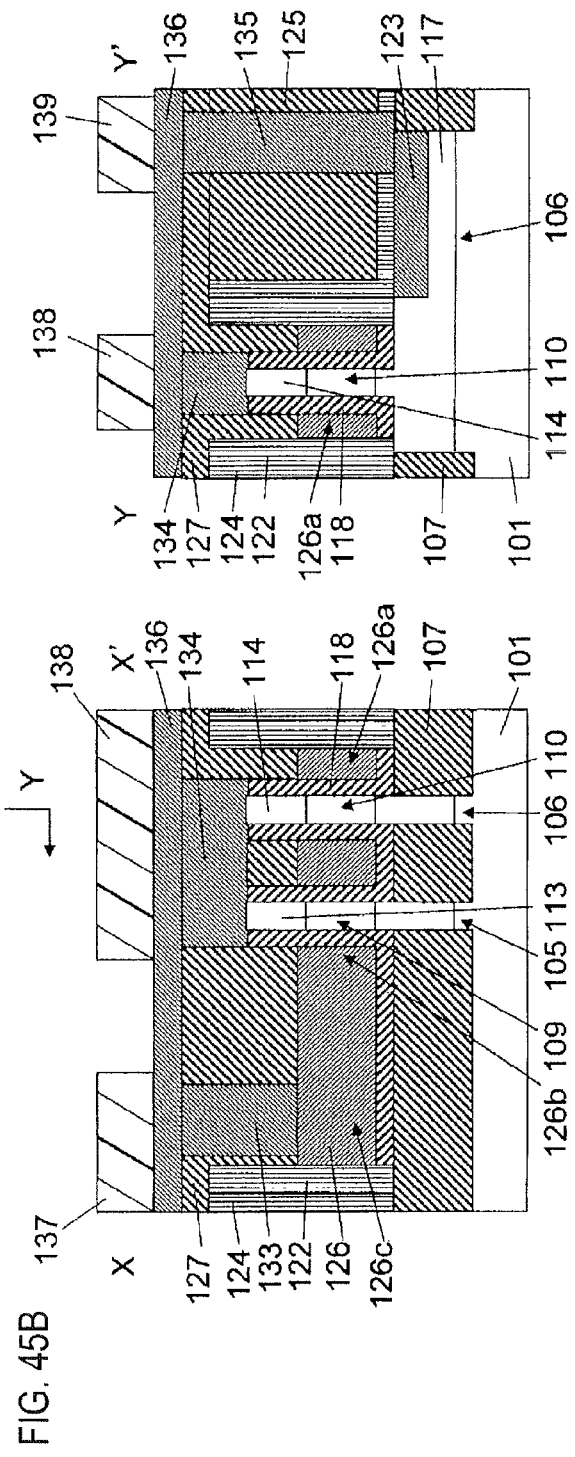
FIG. 45B
FIG. 45C

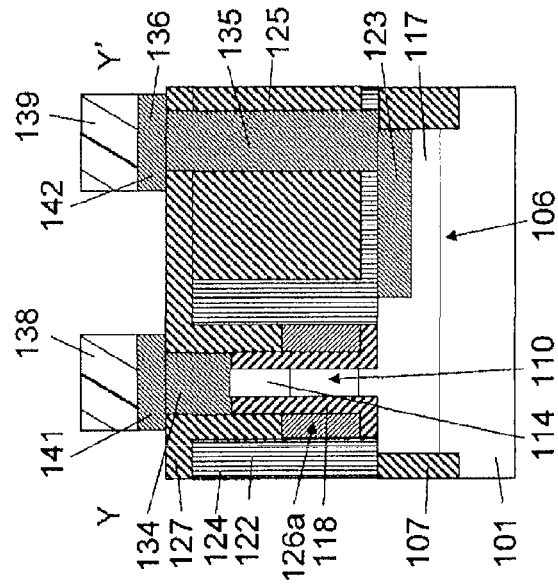
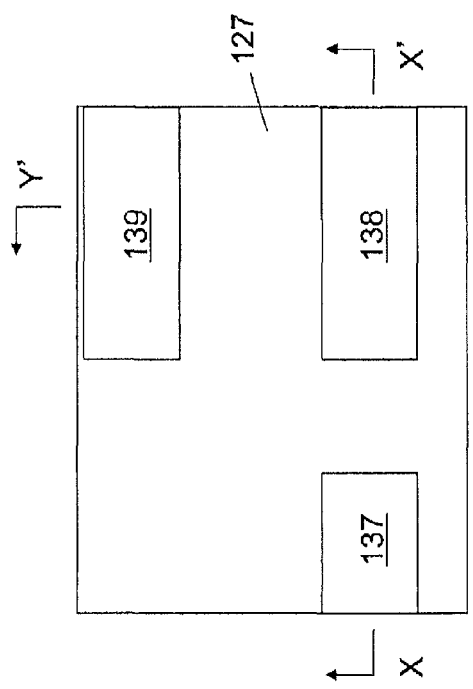
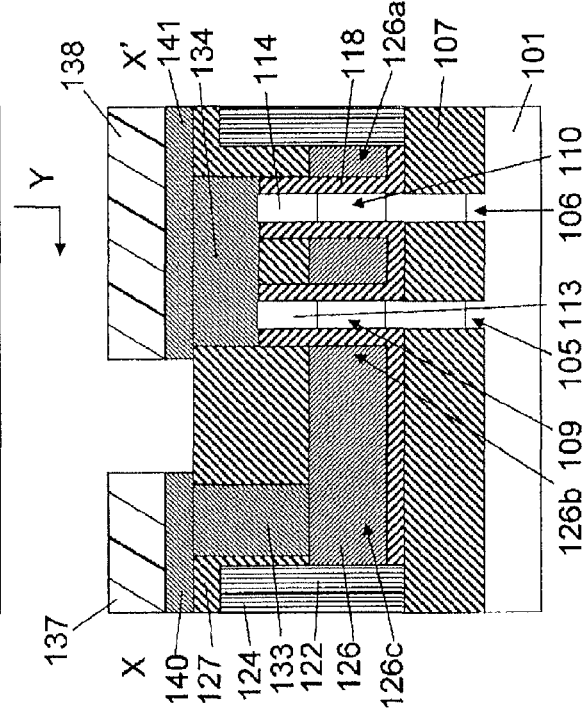

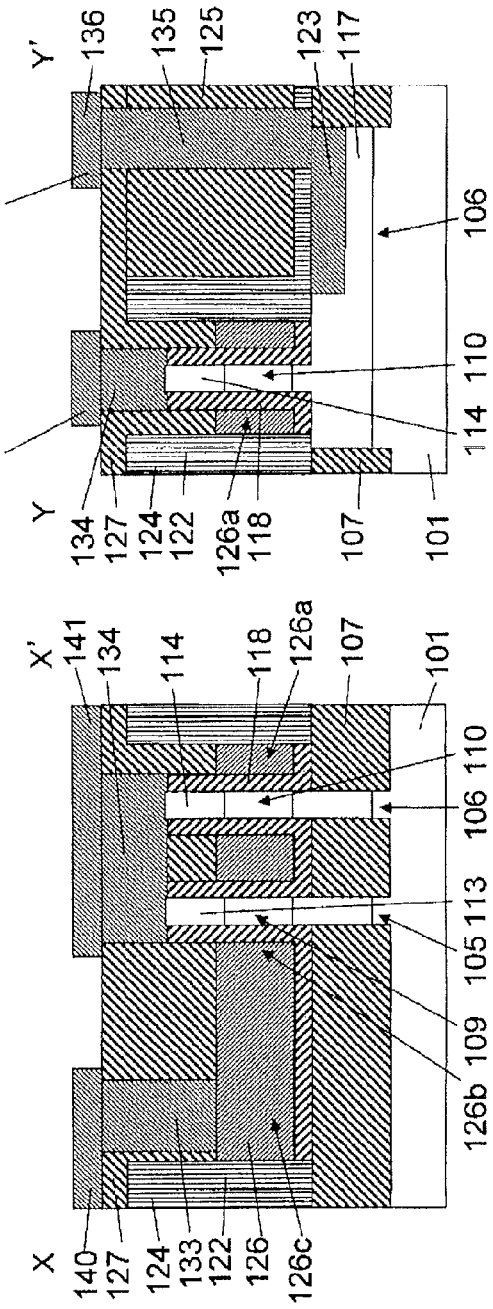
FIG. 47C
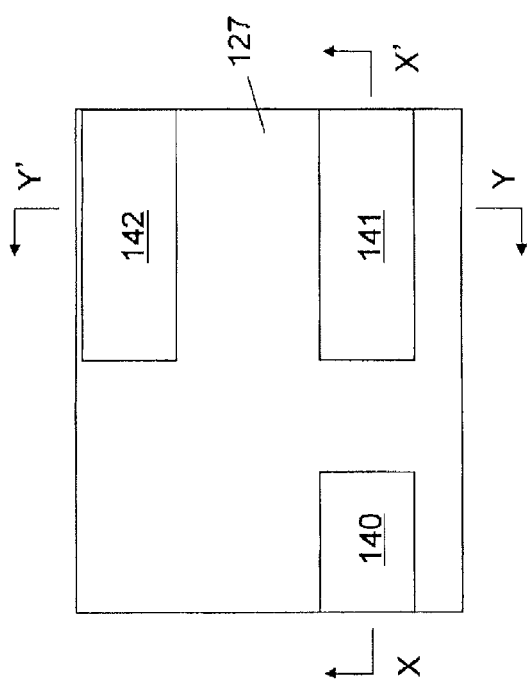
FIG. 47A
FIG. 47B

METHOD FOR PRODUCING SEMICONDUCTOR DEVICE AND SEMICONDUCTOR DEVICE

RELATED APPLICATIONS

This application is a continuation of U.S. patent application Ser. No. 14/743,266, filed Jun. 18, 2015, now U.S. Pat. No. 9,299,701, which is a continuation of U.S. patent application Ser. No. 14/083,060, now U.S. Pat. No. 9,117, 690, filed Nov. 18, 2013, which is Continuation In Part (CIP) application of U.S. patent application Ser. No. 13/679,225, now U.S. Pat. No. 8,735,971, filed Nov. 16, 2013, which pursuant to 35 U.S.C. §119(e), claims the benefit of the filing date of Provisional U.S. Patent Application Ser. No. 61/566, 244 filed on Dec. 2, 2011. The entire contents of which are hereby incorporated by reference.

BACKGROUND

1. Field of the Invention

The present invention relates to a semiconductor device.

2. Description of the Related Art

The degree of integration of semiconductor integrated circuits, in particular, integrated circuits using MOS transistors, has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (SGT) having a structure in which a source, a gate, and a drain are arranged vertically with respect to a substrate and the gate surrounds a pillar-shaped semiconductor layer has been proposed (e.g., Japanese Unexamined Patent Application Publication Nos. 2-71556, 2-188966, and 3-145761).

By using a metal for gate electrodes instead of a polysilicon, the depletion can be suppressed and the resistance of the gate electrodes can be decreased. However, the production process after a metal gate is formed needs to be conducted always in consideration of metal contamination due to the metal gate.

In existing MOS transistors, in order to perform both a metal gate process and a high-temperature process, a metal gate last process in which a metal gate is formed after a high-temperature process has been employed in production of actual products (IEDM 2007 K. Mistry et al., pp. 247 to 250). The metal gate last process includes forming a gate using a polysilicon, then depositing an interlayer insulating film, exposing the polysilicon gate by chemical mechanical polishing, etching the polysilicon gate, and depositing a metal. Therefore, a metal gate last process in which a metal gate is formed after a high-temperature process also needs to be employed in SGTs in order to perform both a metal gate process and a high-temperature process. In SGTs, since a pillar-shaped silicon layer is located at a higher position than a gate, a scheme for employing the metal gate last process is required.

To decrease the parasitic capacitance between a gate line and a substrate, a first insulating film is used in existing MOS transistors. For example, in the FINFET (IEDM 2010 CC. Wu et al., 27.1.1 to 27.1.4), the parasitic capacitance between a gate line and a substrate is decreased by forming a first insulating film around a single fin-shaped semiconductor layer and etching back the first insulating film to expose the fin-shaped semiconductor layer. Therefore, such a first insulating film also needs to be used in SGTs to decrease the parasitic capacitance between a gate line and a substrate. In SGTs, since a pillar-shaped semiconductor layer is formed in addition to the fin-shaped semiconductor layer, a scheme for forming a pillar-shaped semiconductor layer is required.

Furthermore, FINFETs in which two transistors are formed from a single dummy pattern has been known (e.g., Japanese Unexamined Patent Application Publication No. 2011-71235). A sidewall is formed around a dummy pattern and a substrate is etched using the sidewall as a mask to form a fin, and thus two transistors are formed from a single dummy pattern.

SUMMARY

It is an object to provide a SGT production method in which the parasitic capacitance between a gate line and a substrate is decreased, a gate last process is employed, and two transistors are produced from a single dummy pattern and a SGT structure formed by the production method.

A method for producing a semiconductor device according to an aspect of the present invention includes:

a first step of forming, on a substrate, a first fin-shaped silicon layer and a second fin-shaped silicon layer that are connected to each other at their ends to form a closed loop, forming a first insulating film around the first fin-shaped silicon layer and second fin-shaped silicon layer, forming a first pillar-shaped silicon layer in an upper portion of the first fin-shaped silicon layer, and forming a second pillar-shaped silicon layer in an upper portion of the second fin-shaped silicon layer, the first pillar-shaped silicon layer having a width equal to a width of the first fin-shaped silicon layer and the second pillar-shaped silicon layer having a width equal to a width of the second fin-shaped silicon layer; after the first step, a second step of forming diffusion layers by implanting an impurity into an upper portion of the first pillar-shaped silicon layer, an upper portion of the first fin-shaped silicon layer, and a lower portion of the first pillar-shaped silicon layer and forming diffusion layers by implanting an impurity into an upper portion of the second pillar-shaped silicon layer, an upper portion of the second fin-shaped silicon layer, and a lower portion of the second pillar-shaped silicon layer; after the second step, a third step of forming a gate insulating film on and around the first pillar-shaped silicon layer and second pillar-shaped silicon layer, forming a first polysilicon gate electrode and a second polysilicon gate electrode so as to cover the gate insulating film, and forming a polysilicon gate line, where an upper surface of a polysilicon after the first polysilicon gate electrode, the second polysilicon gate electrode, and the polysilicon gate line are formed is located at a higher position than the gate insulating film on the diffusion layer in the upper portion of the first pillar-shaped silicon layer and the gate insulating film on the diffusion layer in the upper portion of the second pillar-shaped silicon layer; after the third step, a fourth step of forming a silicide in an upper portion of the diffusion layer formed in the upper portion of the first fin-shaped silicon layer and in an upper portion of the diffusion layer formed in the second fin-shaped silicon layer; after the fourth step, a fifth step of depositing an interlayer insulating film, exposing the first polysilicon gate electrode, the second polysilicon gate electrode, and the polysilicon gate line, etching the first polysilicon gate electrode, the second polysilicon gate electrode, and the polysilicon gate line, then depositing a metal, and forming a first metal gate electrode, a second metal gate electrode, and a metal gate line, the metal gate line being connected to the first metal gate electrode and second metal gate electrode and extending in a direction perpendicular to a direction in which the first fin-shaped silicon layer and second fin-shaped silicon layer extend; and, after the fifth step, a sixth step of forming a contact that is directly connected to the diffusion layer in the upper portion of the first pillar-shaped silicon layer and the diffusion layer in the upper portion of the second pillar-shaped silicon layer.

Preferably, the first step includes depositing a second oxide film on a substrate in order to form a dummy pattern; forming a first resist for forming the dummy pattern; etching the second oxide film to form the dummy pattern; removing the first resist; depositing a first nitride film; forming a first nitride film sidewall around the dummy pattern by etching the first nitride film in such a manner that the first nitride film is made to remain in a sidewall shape; removing the dummy pattern; etching the substrate using the first nitride film sidewall as a mask to form the first fin-shaped silicon layer and the second fin-shaped silicon layer that are connected to each other at their ends to form a closed loop; forming the first insulating film around the first fin-shaped silicon layer and second fin-shaped silicon layer; removing the first nitride film sidewall; etching back the first insulating film to expose an upper portion of the first fin-shaped silicon layer and an upper portion of the second fin-shaped silicon layer; forming a second resist so as to be perpendicular to the first fin-shaped silicon layer and second fin-shaped silicon layer; etching the first fin-shaped silicon layer and the second fin-shaped silicon layer; and removing the second resist to form the first pillar-shaped silicon layer such that a portion in which the first fin-shaped silicon layer is perpendicular to the second resist is the first pillar-shaped silicon layer and to form the second pillar-shaped silicon layer such that a portion in which the second fin-shaped silicon layer is perpendicular to the second resist is the second pillar-shaped silicon layer.

Preferably, the second step performed after the first step includes depositing a third oxide film on the entire structure formed in the first step; forming a second nitride film; etching the second nitride film in such a manner that the second nitride film is made to remain in a sidewall shape; forming the diffusion layers by implanting an impurity into the upper portion of the first pillar-shaped silicon layer, the upper portion of the first fin-shaped silicon layer, the upper portion of the second pillar-shaped silicon layer, and the upper portion of the second fin-shaped silicon layer; removing the second nitride film and the third oxide film; and performing a heat treatment.

Preferably, the third step performed after the second step includes forming the gate insulating film so as to surround silicon pillars; depositing and planarizing a polysilicon such that an upper surface of the planarized polysilicon is located at a higher position than the gate insulating film on the diffusion layer formed in the upper portion of the first pillar-shaped silicon layer and the gate insulating film on the diffusion layer formed in the upper portion of the second pillar-shaped silicon layer; depositing a third nitride film; forming a third resist for forming the first polysilicon gate electrode, the second polysilicon gate electrode, and the polysilicon gate line; etching the third nitride film and the polysilicon to form the first polysilicon gate electrode, the second polysilicon gate electrode, and the polysilicon gate line; etching the gate insulating film; and removing the third resist.

Preferably, a fourth nitride film is deposited on the entire structure formed in the third step, the fourth nitride film is etched in such a manner that the fourth nitride film is made to remain in a sidewall shape, and a metal is deposited to form the silicide in the upper portions of the diffusion layers formed in the upper portions of the first fin-shaped silicon layer and second fin-shaped silicon layer.

Preferably, a fifth nitride film is deposited on the entire structure formed in the fourth step; an interlayer insulating film is deposited and planarized by chemical mechanical polishing; the first polysilicon gate electrode, the second polysilicon gate electrode, and the polysilicon gate line are exposed by chemical mechanical polishing; the first polysilicon gate electrode, the second polysilicon gate electrode, and the polysilicon gate line are etched; a metal is deposited to fill, with the metal, portions in which the first polysilicon gate electrode, the second polysilicon gate electrode, and the polysilicon gate line have been present; and the metal is etched to expose the gate insulating film on the diffusion layer in the upper portion of the first pillar-shaped silicon layer and the gate insulating film on the diffusion layer in the upper portion of the second pillar-shaped silicon layer and to form the first metal gate electrode, the second metal gate electrode, and the metal gate line.

A semiconductor device according to an aspect of the invention includes a first fin-shaped semiconductor layer on a substrate, a second fin-shaped semiconductor layer on the substrate, a first insulating film around the first fin-shaped semiconductor layer and the second fin-shaped semiconductor layer; a first pillar-shaped semiconductor layer on the first fin-shaped semiconductor layer; a second pillar-shaped semiconductor layer on the second fin-shaped semiconductor layer, where a width of the bottom of the first and second pillar-shaped semiconductors is equal to a width of the top of the first and second fin-shaped semiconductor layers, respectively; a first diffusion layer in an upper portion of the first fin-shaped semiconductor layer and a lower portion of the first pillar-shaped semiconductor layer; a second diffusion layer in an upper portion of the first pillar-shaped semiconductor layer; a third diffusion layer in an upper portion of the second fin-shaped semiconductor layer and a lower portion of the second pillar-shaped semiconductor layer; a fourth diffusion layer in an upper portion of the second pillar-shaped semiconductor layer; a first gate insulating film around the first pillar-shaped semiconductor layer; a first metal gate electrode around the first gate insulating film; a second gate insulating film around the second pillar-shaped semiconductor layer; a second metal gate electrode around the second gate insulating film; a metal gate line connected to the first metal gate electrode and the second metal gate electrode and extending in a direction perpendicular to a direction in which the first fin-shaped semiconductor layer and second fin-shaped semiconductor layer extend; a contact on the upper portion of the second diffusion layer and directly connected to the second diffusion layer; and a contact on the upper portion of the fourth diffusion layer and directly connected to the fourth diffusion layer.

A semiconductor device according to another aspect of the present invention includes a first fin-shaped semiconductor layer formed on a substrate, a second fin-shaped semiconductor layer formed on the substrate, the first fin-shaped semiconductor layer and the second fin-shaped semiconductor layer being connected to each other at their ends to form a closed loop, a first insulating film formed around the first fin-shaped semiconductor layer and second fin-shaped semiconductor layer, a first pillar-shaped semiconductor layer formed on the first fin-shaped semiconductor layer and having a width equal to a width of the first fin-shaped semiconductor layer, a second pillar-shaped semiconductor layer formed on the second fin-shaped semiconductor layer and having a width equal to a width of the second fin-shaped semiconductor layer, a diffusion layer formed in an upper portion of the first fin-shaped semiconductor layer and a lower portion of the first pillar-shaped semiconductor layer, a diffusion layer formed in an upper portion of the first pillar-shaped semiconductor layer, a diffusion layer formed in an upper portion of the second fin-shaped semiconductor layer and a lower portion of the second pillar-shaped semiconductor layer, a diffusion layer formed in an upper portion of the second pillar-shaped semiconductor layer, a silicide formed in upper portions of the diffusion layers formed in the upper portion of the first fin-shaped semiconductor layer and in the upper portion of the second fin-shaped semiconductor layer, a gate insulating film formed around the first pillar-shaped semiconductor layer, a first metal gate electrode formed around the gate insulating film, a gate insulating film formed around the second pillar-shaped semiconductor layer, a second metal gate electrode formed around the gate insulating film, a metal gate line that is connected to the first metal gate electrode and the second metal gate electrode and that extends in a direction perpendicular to a direction in which the first fin-shaped semiconductor layer and second fin-shaped semiconductor layer extend, a contact formed on the diffusion layer formed in the upper portion of the first pillar-shaped semiconductor layer so as to be directly connected to the diffusion layer, and a contact formed on the diffusion layer formed in the upper portion of the second pillar-shaped semiconductor layer so as to be directly connected to the diffusion layer.

The present invention can provide a SGT production method in which the parasitic capacitance between a gate line and a substrate is decreased, a gate last process is employed, and two transistors are produced from a single dummy pattern and a SGT structure formed by the production method.

Two SGTs can be easily produced from a single dummy pattern by employing a method for producing an existing FINFET. In the method, a sidewall is formed around a dummy pattern and a substrate is etched using the sidewall as a mask to form a fin, and thus two transistors are formed from a single dummy pattern.

In addition, a metal gate SGT can be easily produced because a production method that employs an existing metal gate last process can be used. A silicide has been conventionally formed in an upper portion of a pillar-shaped silicon layer, but the temperature at which a polysilicon is deposited is higher than the temperature at which a silicide is formed and thus a silicide needs to be formed after the formation of a polysilicon gate. If a silicide is formed in an upper portion of a silicon pillar, a polysilicon gate is formed, a hole is made above a polysilicon gate electrode, an insulating film is formed on the sidewall of the hole, a silicide is formed, and the hole is filled with an insulating film. This increases the number of production steps. Therefore, the existing metal gate last process below can be employed. A diffusion layer is formed before the formation of a polysilicon gate electrode and a polysilicon gate line. By covering a pillar-shaped silicon layer with the polysilicon gate electrode and by forming a silicide only in an upper portion of a fin-shaped silicon layer, a polysilicon gate is formed. Subsequently, an interlayer insulating film is deposited and then the polysilicon gate is exposed by chemical mechanical polishing. The polysilicon gate is etched and then a metal is deposited.

BRIEF DESCRIPTION OF THE DRAWING

FIG. 1A is a plan view of a semiconductor device according to an embodiment of the present invention, FIG. 1B is a sectional view taken along line X-X' of FIG. 1A, and FIG. 1C is a sectional view taken along line Y-Y' of FIG. 1A;

FIG. 2A is a plan view showing a method for producing a semiconductor device according to an embodiment of the present invention, FIG. 2B is a sectional view taken along line X-X' of FIG. 2A, and FIG. 2C is a sectional view taken along line Y-Y' of FIG. 2A;

FIG. 3A is a plan view showing a method for producing a semiconductor device according to an embodiment of the present invention, FIG. 3B is a sectional view taken along line X-X' of FIG. 3A, and FIG. 3C is a sectional view taken along line Y-Y' of FIG. 3A;

FIG. 4A is a plan view showing a method for producing a semiconductor device according to an embodiment of the present invention, FIG. 4B is a sectional view taken along line X-X' of FIG. 4A, and FIG. 4C is a sectional view taken along line Y-Y' of FIG. 4A;

FIG. 5A is a plan view showing a method for producing a semiconductor device according to an embodiment of the present invention, FIG. 5B is a sectional view taken along line X-X' of FIG. 5A, and FIG. 5C is a sectional view taken along line Y-Y' of FIG. 5A;

FIG. 6A is a plan view showing a method for producing a semiconductor device according to an embodiment of the present invention, FIG. 6B is a sectional view taken along line X-X' of FIG. 6A, and FIG. 6C is a sectional view taken along line Y-Y' of FIG. 6A;

FIG. 7A is a plan view showing a method for producing a semiconductor device according to an embodiment of the present invention, FIG. 7B is a sectional view taken along line X-X' of FIG. 7A, and FIG. 7C is a sectional view taken along line Y-Y' of FIG. 7A;

FIG. 8A is a plan view showing a method for producing a semiconductor device according to an embodiment of the present invention, FIG. 8B is a sectional view taken along line X-X' of FIG. 8A, and FIG. 8C is a sectional view taken along line Y-Y' of FIG. 8A;

FIG. 9A is a plan view showing a method for producing a semiconductor device according to an embodiment of the present invention, FIG. 9B is a sectional view taken along line X-X' of FIG. 9A, and FIG. 9C is a sectional view taken along line Y-Y' of FIG. 9A;

FIG. 10A is a plan view showing a method for producing a semiconductor device according to an embodiment of the present invention, FIG. 10B is a sectional view taken along line X-X' of FIG. 10A, and FIG. 10C is a sectional view taken along line Y-Y' of FIG. 10A;

FIG. 11A is a plan view showing a method for producing a semiconductor device according to an embodiment of the present invention, FIG. 11B is a sectional view taken along line X-X' of FIG. 11A, and FIG. 11C is a sectional view taken along line Y-Y' of FIG. 11A;

FIG. 12A is a plan view showing a method for producing a semiconductor device according to an embodiment of the present invention, FIG. 12B is a sectional view taken along line X-X' of FIG. 12A, and FIG. 12C is a sectional view taken along line Y-Y' of FIG. 12A;

FIG. 13A is a plan view showing a method for producing a semiconductor device according to an embodiment of the present invention, FIG. 13B is a sectional view taken along line X-X' of FIG. 13A, and FIG. 13C is a sectional view taken along line Y-Y' of FIG. 13A;

FIG. 14A is a plan view showing a method for producing a semiconductor device according to an embodiment of the present invention, FIG. 14B is a sectional view taken along line X-X' of FIG. 14A, and FIG. 14C is a sectional view taken along line Y-Y' of FIG. 14A;

FIG. 15A is a plan view showing a method for producing a semiconductor device according to an embodiment of the present invention, FIG. 15B is a sectional view taken along line X-X' of FIG. 15A, and FIG. 15C is a sectional view taken along line Y-Y' of FIG. 15A;

FIG. 16A is a plan view showing a method for producing a semiconductor device according to an embodiment of the present invention, FIG. 16B is a sectional view taken along line X-X' of FIG. 16A, and FIG. 16C is a sectional view taken along line Y-Y' of FIG. 16A;

FIG. 17A is a plan view showing a method for producing a semiconductor device according to an embodiment of the present invention, FIG. 17B is a sectional view taken along line X-X' of FIG. 17A, and FIG. 17C is a sectional view taken along line Y-Y' of FIG. 17A;

FIG. 18A is a plan view showing a method for producing a semiconductor device according to an embodiment of the present invention, FIG. 18B is a sectional view taken along line X-X' of FIG. 18A, and FIG. 18C is a sectional view taken along line Y-Y' of FIG. 18A;

FIG. 19A is a plan view showing a method for producing a semiconductor device according to an embodiment of the present invention, FIG. 19B is a sectional view taken along line X-X' of FIG. 19A, and FIG. 19C is a sectional view taken along line Y-Y' of FIG. 19A;

FIG. 20A is a plan view showing a method for producing a semiconductor device according to an embodiment of the present invention, FIG. 20B is a sectional view taken along line X-X' of FIG. 20A, and FIG. 20C is a sectional view taken along line Y-Y' of FIG. 20A;

FIG. 22A is a plan view showing a method for producing a semiconductor device according to an embodiment of the present invention, FIG. 22B is a sectional view taken along line X-X' of FIG. 22A, and FIG. 22C is a sectional view taken along line Y-Y' of FIG. 22A;

FIG. 23A is a plan view showing a method for producing a semiconductor device according to an embodiment of the present invention, FIG. 23B is a sectional view taken along line X-X' of FIG. 23A, and FIG. 23C is a sectional view taken along line Y-Y' of FIG. 23A;

FIG. 25A is a plan view showing a method for producing a semiconductor device according to an embodiment of the present invention, FIG. 25B is a sectional view taken along line X-X' of FIG. 25A, and FIG. 25C is a sectional view taken along line Y-Y' of FIG. 25A;

FIG. 26A is a plan view showing a method for producing a semiconductor device according to an embodiment of the present invention, FIG. 26B is a sectional view taken along line X-X' of FIG. 26A, and FIG. 26C is a sectional view taken along line Y-Y' of FIG. 26A;

FIG. 27A is a plan view showing a method for producing a semiconductor device according to an embodiment of the present invention, FIG. 27B is a sectional view taken along line X-X' of FIG. 27A, and FIG. 27C is a sectional view taken along line Y-Y' of FIG. 27A;

FIG. 30A is a plan view showing a method for producing a semiconductor device according to an embodiment of the present invention, FIG. 30B is a sectional view taken along line X-X' of FIG. 30A, and FIG. 30C is a sectional view taken along line Y-Y' of FIG. 30A;

FIG. 31A is a plan view showing a method for producing a semiconductor device according to an embodiment of the present invention, FIG. 31B is a sectional view taken along line X-X' of FIG. 31A, and FIG. 31C is a sectional view taken along line Y-Y' of FIG. 31A;

FIG. 32A is a plan view showing a method for producing a semiconductor device according to an embodiment of the present invention, FIG. 32B is a sectional view taken along line X-X' of FIG. 32A, and FIG. 32C is a sectional view taken along line Y-Y' of FIG. 32A;

FIG. 33A is a plan view showing a method for producing a semiconductor device according to an embodiment of the present invention, FIG. 33B is a sectional view taken along line X-X' of FIG. 33A, and FIG. 33C is a sectional view taken along line Y-Y' of FIG. 33A;

FIG. 34A is a plan view showing a method for producing a semiconductor device according to an embodiment of the present invention, FIG. 34B is a sectional view taken along line X-X' of FIG. 34A, and FIG. 34C is a sectional view taken along line Y-Y' of FIG. 34A;

FIG. 35A is a plan view showing a method for producing a semiconductor device according to an embodiment of the present invention, FIG. 35B is a sectional view taken along line X-X' of FIG. 35A, and FIG. 35C is a sectional view taken along line Y-Y' of FIG. 35A;

FIG. 38A is a plan view showing a method for producing a semiconductor device according to an embodiment of the present invention, FIG. 38B is a sectional view taken along line X-X' of FIG. 38A, and FIG. 38C is a sectional view taken along line Y-Y' of FIG. 38A;

FIG. 39A is a plan view showing a method for producing a semiconductor device according to an embodiment of the present invention, FIG. 39B is a sectional view taken along line X-X' of FIG. 39A, and FIG. 39C is a sectional view taken along line Y-Y' of FIG. 39A;

FIG. 40A is a plan view showing a method for producing a semiconductor device according to an embodiment of the present invention, FIG. 40B is a sectional view taken along line X-X' of FIG. 40A, and FIG. 40C is a sectional view taken along line Y-Y' of FIG. 40A;

FIG. 41A is a plan view showing a method for producing a semiconductor device according to an embodiment of the present invention, FIG. 41B is a sectional view taken along line X-X' of FIG. 41A, and FIG. 41C is a sectional view taken along line Y-Y' of FIG. 41A;

FIG. 42A is a plan view showing a method for producing a semiconductor device according to an embodiment of the present invention, FIG. 42B is a sectional view taken along line X-X' of FIG. 42A, and FIG. 42C is a sectional view taken along line Y-Y' of FIG. 42A;

FIG. 43A is a plan view showing a method for producing a semiconductor device according to an embodiment of the present invention, FIG. 43B is a sectional view taken along line X-X' of FIG. 43A, and FIG. 43C is a sectional view taken along line Y-Y' of FIG. 43A;

FIG. 44A is a plan view showing a method for producing a semiconductor device according to an embodiment of the present invention, FIG. 44B is a sectional view taken along line X-X' of FIG. 44A, and FIG. 44C is a sectional view taken along line Y-Y' of FIG. 44A;

FIG. 45A is a plan view showing a method for producing a semiconductor device according to an embodiment of the present invention, FIG. 45B is a sectional view taken along line X-X' of FIG. 45A, and FIG. 45C is a sectional view taken along line Y-Y' of FIG. 45A;

FIG. 46A is a plan view showing a method for producing a semiconductor device according to an embodiment of the present invention, FIG. 46B is a sectional view taken along line X-X' of FIG. 46A, and FIG. 46C is a sectional view taken along line Y-Y' of FIG. 46A; and FIG. 47A is a plan view showing a method for producing a semiconductor device according to an embodiment of the present invention, FIG. 47B is a sectional view taken along line X-X' of FIG. 47A, and FIG. 47C is a sectional view taken along line Y-Y' of FIG. 47A.

DETAILED DESCRIPTION OF THE PREFERRED EMBODIMENTS

Figure 21C:
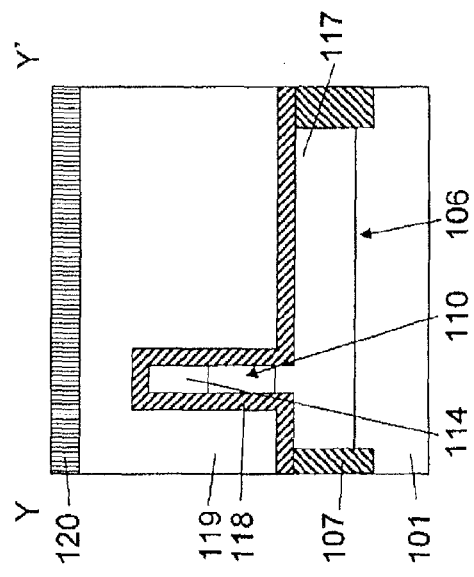
FIG. 21C is a sectional view taken along line Y-Y' of FIG. 21A.

A production process for forming a SGT structure according to an embodiment of the present invention will now be described with reference to FIGS. 2 to 47.

A production method is described that includes forming a first fin-shaped silicon layer and a second fin-shaped silicon layer on a substrate, forming a first insulating film around the first fin-shaped silicon layer and second fin-shaped silicon layer, forming a first pillar-shaped silicon layer in an upper portion of the first fin-shaped silicon layer, and forming a second pillar-shaped silicon layer in an upper portion of the second fin-shaped silicon layer. As shown in FIG. 2, a second oxide film 102 is deposited on a silicon substrate 101 in order to form a dummy pattern. A nitride film or a laminated film of an oxide film and a polysilicon may be used.

As shown in FIGS. 3A-3C, a first resist 103 for forming the dummy pattern is formed.

As shown in FIGS. 4A-4C, the second oxide film 102 is etched to form the dummy pattern 102.

As shown in FIGS. 5A-5C, the first resist 103 is removed.

As shown in FIGS. 6A-6C, a first nitride film 104 is deposited.

As shown in FIGS. 7A-7C, by etching the first nitride film 104, the first nitride film 104 is made to remain in a sidewall shape. Thus, a first nitride film sidewall 104 is formed around the dummy pattern 102. By etching silicon using the formed first nitride film sidewall 104, a first fin-shaped silicon layer 105 and a second fin-shaped silicon layer 106 that are connected to each other at their ends to form a closed loop will be formed.

As shown in FIGS. 8A-8C, the dummy pattern 102 is removed.

As shown in FIGS. 9A-9C, by etching the silicon substrate 101 using the first nitride film sidewall 104 as a mask, a first fin-shaped silicon layer 105 and a second fin-shaped silicon layer 106 that are connected to each other at their ends to form a loop are formed.

As shown in FIGS. 10A-10C, a first insulating film 107 is formed around the first fin-shaped silicon layer 105 and second fin-shaped silicon layer 106.

An oxide film formed using high-density plasma or an oxide film formed by low-pressure chemical vapor deposition may be used as the first insulating film.

As shown in FIGS. 11A-11C, the first nitride film sidewall 104 is removed. In the case where the first nitride film sidewall 104 is removed during the silicon etching or the oxide film deposition, this step is skipped.

As shown in FIGS. 12A-12C, the first insulating film 107 is etched back to expose an upper portion of the first fin-shaped silicon layer 105 and an upper portion of the second fin-shaped silicon layer 106.

As shown in FIGS. 13A-13C, a second resist 108 is formed so as to be perpendicular to the first fin-shaped silicon layer 105 and second fin-shaped silicon layer 106. The portions in which the first fin-shaped silicon layer 105 and second fin-shaped silicon layer 106 are perpendicular to the resist 108 are portions to be formed into pillar-shaped silicon layers. Since the resist can be formed linearly, there is a low probability of the resist falling over after the patterning. Consequently, the process can be stably performed.

As shown in FIGS. 14A-14C, the first fin-shaped silicon layer 105 and the second fin-shaped silicon layer 106 are etched. The portion in which the first fin-shaped silicon layer 105 is perpendicular to the second resist 108 becomes a first pillar-shaped silicon layer 109. The portion in which the second fin-shaped silicon layer 106 is perpendicular to the second resist 108 becomes a second pillar-shaped silicon layer 110. Therefore, the first pillar-shaped silicon layer 109 has a width equal to the width of the first fin-shaped silicon layer 105. The second pillar-shaped silicon layer 110 has a width equal to the width of the second fin-shaped silicon layer 106.

As a result, a structure is formed in which the first pillar-shaped silicon layer 109 is formed in the upper portion of the first fin-shaped silicon layer 105, the second pillar-shaped silicon layer 110 is formed in the upper portion of the second fin-shaped silicon layer 106, and the first insulating film 107 is formed around the first fin-shaped silicon layer 105 and second fin-shaped silicon layer 106.

As shown in FIGS. 15A-15C, the second resist 108 is removed.

Next, there is described a production method that includes, in order to achieve gate last, forming diffusion layers by implanting an impurity into an upper portion of the first pillar-shaped silicon layer 109, an upper portion of the first fin-shaped silicon layer 105, and a lower portion of the first pillar-shaped silicon layer 109 and forming diffusion layers by implanting an impurity into an upper portion of the second pillar-shaped silicon layer 110, an upper portion of the second fin-shaped silicon layer 106, and a lower portion of the second pillar-shaped silicon layer 110.

As shown in FIGS. 16A-16C, a third oxide film 111 is deposited and a second nitride film 112 is formed. Since the upper portions of the pillar-shaped silicon layers will be covered with a gate insulating film and a polysilicon gate electrode later, diffusion layers are formed in the upper portions of the pillar-shaped silicon layers before covered with the gate insulating film and polysilicon gate electrode.

As shown in FIGS. 17A-17C, by etching the second nitride film 112, the second nitride film 112 is made to remain in a sidewall shape.

As shown in FIGS. 18A-18C, an impurity such as arsenic, phosphorus, or boron is implanted to form a diffusion layer 113 in the upper portion of the first pillar-shaped silicon layer 109, diffusion layers 115 and 116 in the upper portions of the first fin-shaped silicon layer 105, a diffusion layer 114 in the upper portion of the second pillar-shaped silicon layer 110, and diffusion layers 115 and 116 in the upper portions of the second fin-shaped silicon layer 106.

As shown in FIGS. 19A-19C, the second nitride film 112 and the third oxide film 111 are removed.

As shown in FIGS. 20A-20C, a heat treatment is performed. The diffusion layers 115 and 116 in the upper portions of the first fin-shaped silicon layer 105 and second fin-shaped silicon layer 106 are brought into contact with each other and thus a diffusion layer 117 is formed. In order to achieve gate last, the diffusion layers 113 and 117 are formed by implanting an impurity into the upper portion of the first pillar-shaped silicon layer 109, the upper portion of the first fin-shaped silicon layer 105, and the lower portion of the first pillar-shaped silicon layer 109; and the diffusion layers 114 and 117 are formed by implanting an impurity into the upper portion of the second pillar-shaped silicon layer 110, the upper portion of the second fin-shaped silicon layer 106, and the lower portion of the second pillar-shaped silicon layer 110.

Next, there is described a production method that includes, in order to achieve gate last, forming a first polysilicon gate electrode 119b, a second polysilicon gate electrode 119a, and a polysilicon gate line 119c using a polysilicon. To achieve gate last, an interlayer insulating film is deposited and then polysilicon gate electrodes and a polysilicon gate line are exposed by chemical mechanical polishing. Therefore, the upper portions of the pillar-shaped silicon layers need to be prevented from being exposed by the chemical mechanical polishing.

Figure 21A:
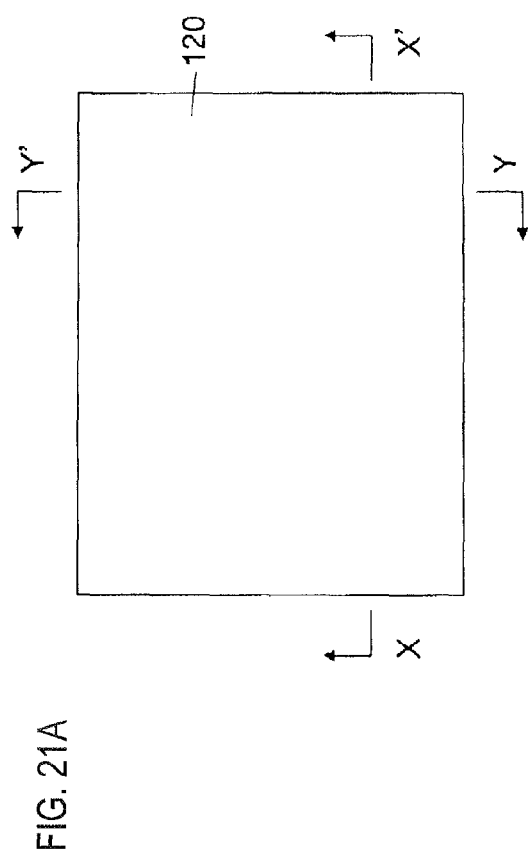
FIG. 21A is a plan view showing a method for producing a semiconductor device according to an embodiment of the present invention.
Figure 21B:
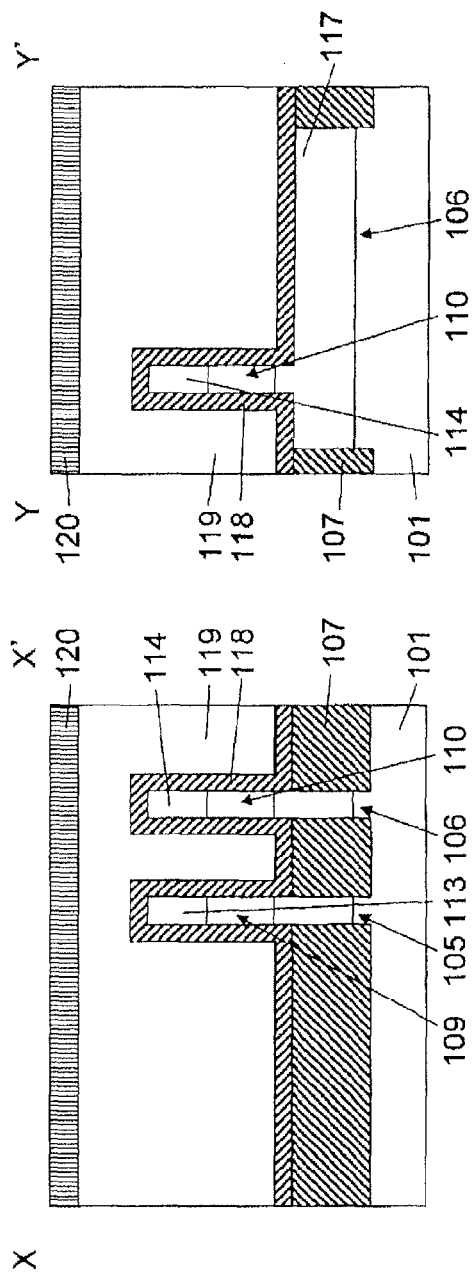
FIG. 21B is a sectional view taken along line X-X' of FIG. 21A.

As shown in FIGS. 21A-21C, a gate insulating film 118 is formed and a polysilicon 119 is deposited and planarized. The upper surface of the planarized polysilicon 119 is located at a higher position than the gate insulating film 118 on the diffusion layer 113 formed in the upper portion of the first pillar-shaped silicon layer 109 and the gate insulating film 118 on the diffusion layer 114 formed in the upper portion of the second pillar-shaped silicon layer 110. Thus, when the interlayer insulating film is deposited and then the polysilicon gate electrodes and polysilicon gate line are exposed by chemical mechanical polishing in order to achieve gate last, the upper portions of the pillar-shaped silicon layers can be prevented from being exposed by chemical mechanical polishing.

A third nitride film 120 is deposited. The third nitride film 120 is a film that, when a silicide is formed in the upper portions of the first fin-shaped silicon layer 105 and second fin-shaped silicon layer 106, prevents the formation of the silicide in upper portions of a first polysilicon gate electrode 119b, a second polysilicon gate electrode 119a, and a polysilicon gate line 119c.

As shown in FIGS. 22A-22C, a third resist 121 for forming a first polysilicon gate electrode 119b, a second polysilicon gate electrode 119a, and a polysilicon gate line 119c is formed. A portion to be the gate line is desirably perpendicular to the first fin-shaped silicon layer 105 and second fin-shaped silicon layer 106 to decrease the parasitic capacitance between the gate line and the substrate.

As shown in FIGS. 23A-23C, the third nitride film 120 is etched and the polysilicon 119 is etched to form a first polysilicon gate electrode 119b, a second polysilicon gate electrode 119a, and a polysilicon gate line 119c.

Figure 24A:
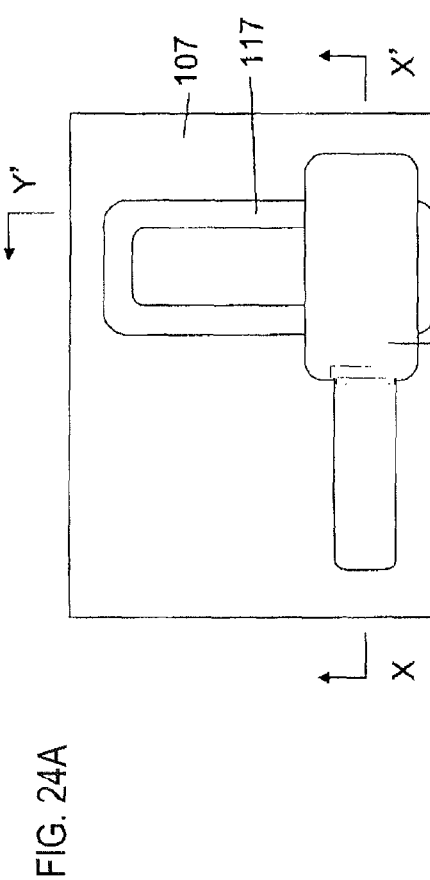
FIG. 24A is a plan view showing a method for producing a semiconductor device according to an embodiment of the present invention.
Figure 24B:
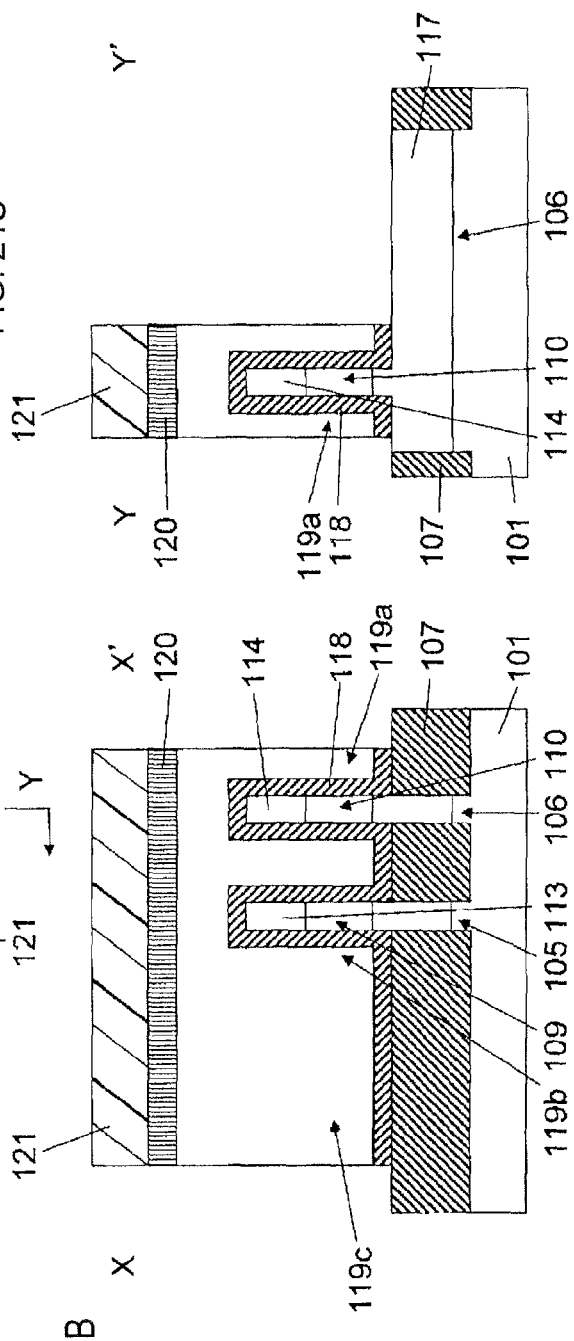
FIG. 24B is a sectional view taken along line X-X' of FIG. 24A.
Figure 24C:
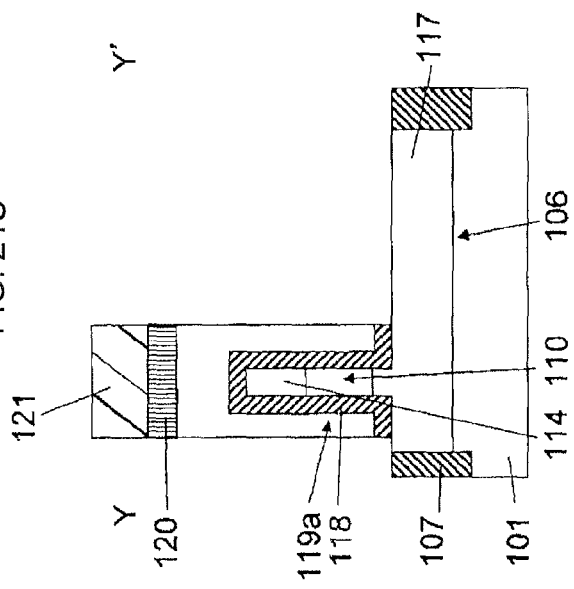
FIG. 24C is a sectional view taken along line Y-Y' of FIG. 24A.

As shown in FIGS. 24A-24C, the gate insulating film 118 is etched.

As shown in FIGS. 25A-25C, the third resist 121 is removed.

The production method that includes, in order to achieve gate last, forming a first polysilicon gate electrode 119b, a second polysilicon gate electrode 119a, and a polysilicon gate line 119c using a polysilicon has been described. The upper surface of the polysilicon after the first polysilicon gate electrode 119b, second polysilicon gate electrode 119a, and polysilicon gate line 119c are formed is located at a higher position than the gate insulating film 118 on the diffusion layer 113 formed in the upper portion of the first pillar-shaped silicon layer 109 and the gate insulating film 118 on the diffusion layer 114 formed in the upper portion of the second pillar-shaped silicon layer 110.

Next, there is described a production method that includes forming a silicide in the upper portion of the diffusion layer 117 formed in the upper portion of the first fin-shaped silicon layer 105 and in the upper portion of the diffusion layer 117 formed in the upper portion of the second fin-shaped silicon layer 106.

This production method is characterized in that a silicide is not formed in upper portions of the first polysilicon gate electrode 119b, second polysilicon gate electrode 119a, and polysilicon gate line 119c and in upper portions of the diffusion layer 113 formed in the upper portion of the first pillar-shaped silicon layer 109 and the diffusion layer 114 formed in the upper portion of the second pillar-shaped silicon layer 110. If a silicide is formed in the upper portions of the diffusion layer 113 formed in the upper portion of the first pillar-shaped silicon layer 109 and the diffusion layer 114 formed in the upper portion of the second pillar-shaped silicon layer 110, the number of production steps is increased.

As shown in FIGS. 26A-26C, a fourth nitride film 122 is deposited.

As shown in FIGS. 27A-27C, by etching the fourth nitride film 122, the fourth nitride film 122 is made to remain in a sidewall shape.

Figure 28A:
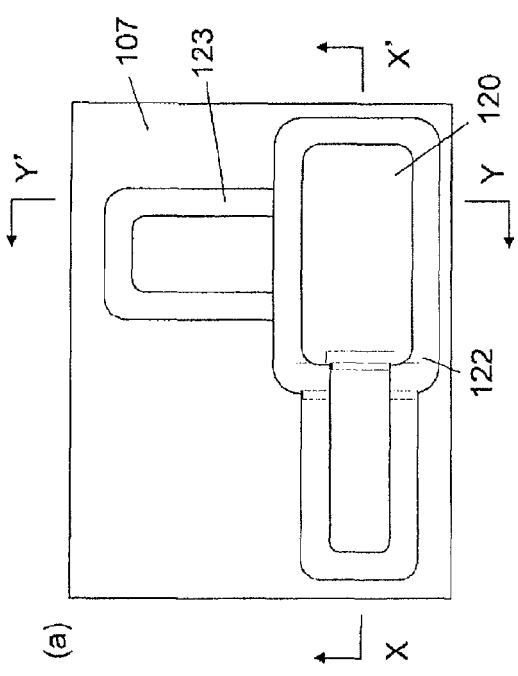
FIG. 28A is a plan view showing a method for producing a semiconductor device according to an embodiment of the present invention.
Figure 28B:
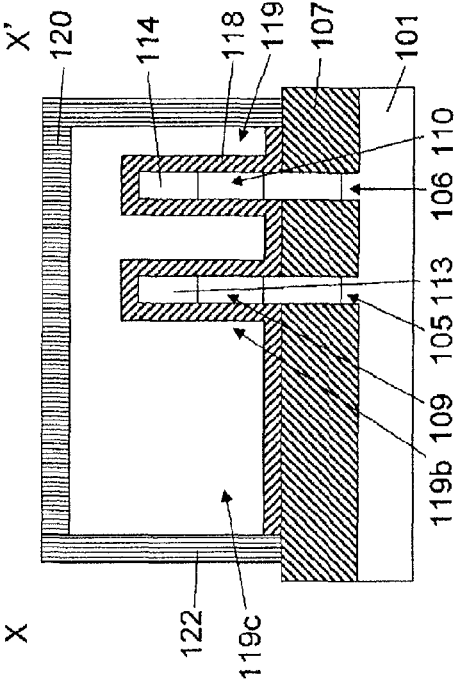
FIG. 28B is a sectional view taken along line X-X' of FIG. 28A.
Figure 28C:
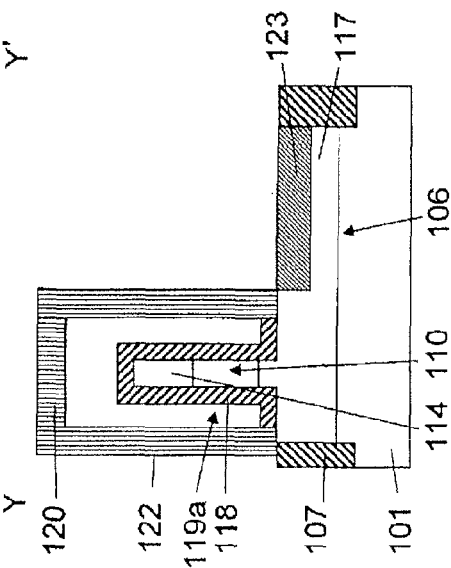
FIG. 28C is a sectional view taken along line Y-Y' of FIG. 28A.

As shown in FIGS. 28A-28C, a metal such as nickel or cobalt is deposited to form a silicide 123 in upper portions of the diffusion layers 117 formed in the upper portions of the first fin-shaped silicon layer 105 and second fin-shaped silicon layer 106. Herein, a silicide is not formed in upper portions of the first polysilicon gate electrode 119b, second polysilicon gate electrode 119a, and polysilicon gate line 119c because the first polysilicon gate electrode 119b, second polysilicon gate electrode 119a, and polysilicon gate line 119c are covered with the fourth nitride film 122 and the third nitride film 120. A silicide is also not formed in upper portions of the diffusion layer 113 formed in the upper portion of the first pillar-shaped silicon layer 109 and the diffusion layer 114 formed in the upper portion of the second pillar-shaped silicon layer 110 because the diffusion layer 113 and the diffusion layer 114 are covered with the gate insulating film 118, the first polysilicon gate electrode 119b, the second polysilicon gate electrode 119a, and the polysilicon gate line 119c.

The production method that includes forming a silicide in the upper portion of the diffusion layer 117 formed in the upper portion of the first fin-shaped silicon layer 105 and forming a silicide in the upper portion of the diffusion layer 117 formed in the upper portion of the second fin-shaped silicon layer 106 has been described.

Next, there is described a production method of gate last that includes depositing an interlayer insulating film 125, exposing the first polysilicon gate electrode 119b, second polysilicon gate electrode 119a, and polysilicon gate line 119c, etching the first polysilicon gate electrode 119b, second polysilicon gate electrode 119a, and polysilicon gate line 119c, depositing a metal 126, and forming a first metal gate electrode 126b, a second metal gate electrode 126a, and a metal gate line 126c.

Figure 29A:
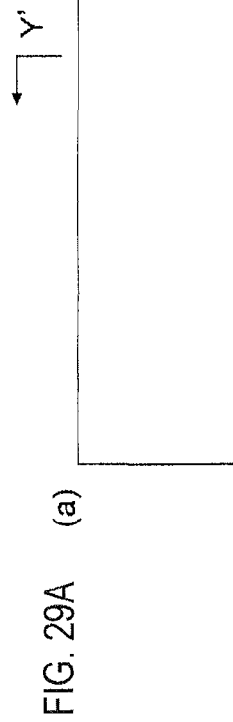
FIG. 29A is a plan view showing a method for producing a semiconductor device according to an embodiment of the present invention.
Figure 29B:
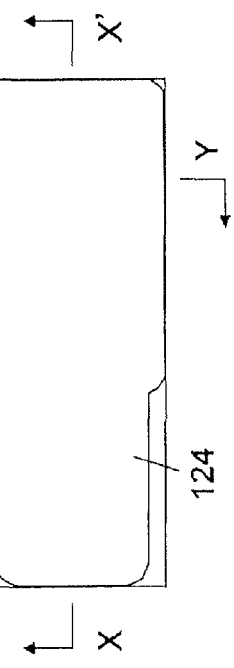
FIG. 29B is a sectional view taken along line X-X' of FIG. 29A.
Figure 29C:
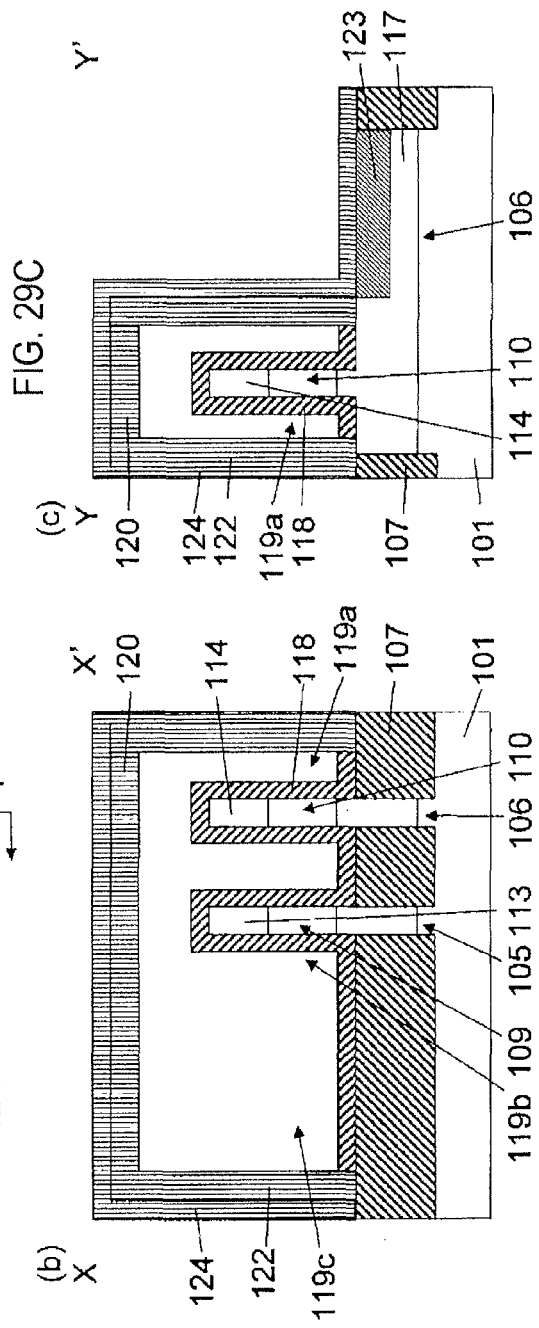
FIG. 29C is a sectional view taken along line Y-Y' of FIG. 29A.

As shown in FIGS. 29A-29C, a fifth nitride film 124 is deposited in order to protect the silicide 123.

As shown in FIGS. 30A-30C, an interlayer insulating film 125 is deposited and planarized by chemical mechanical polishing.

As shown in FIGS. 31A-31C, the first polysilicon gate electrode 119b, second polysilicon gate electrode 119a, and polysilicon gate line 119c are exposed by chemical mechanical polishing.

As shown in FIGS. 32A-32C, the first polysilicon gate electrode 119b, second polysilicon gate electrode 119a, and polysilicon gate line 119c are etched. This etching is desirably performed by wet etching.

As shown in FIGS. 33A-33C, a metal 126 is deposited and planarized to fill, with the metal 126, the portions in which the first polysilicon gate electrode 119b, second polysilicon gate electrode 119a, and polysilicon gate line 119c have been present. Atomic layer deposition is preferably used.

As shown in FIGS. 34A-34C, the metal 126 is etched to expose the gate insulating film 118 on the diffusion layer 113 in the upper portion of the first pillar-shaped silicon layer 109 and the gate insulating film 118 on the diffusion layer 114 in the upper portion of the second pillar-shaped silicon layer 110. As a result, a first metal gate electrode 126b, a second metal gate electrode 126a, and a metal gate line 126c are formed.

The production method of gate last that includes depositing the interlayer insulating film 125, exposing the first polysilicon gate electrode 119b, second polysilicon gate electrode 119a, and polysilicon gate line 119c, etching the first polysilicon gate electrode 119b, second polysilicon gate electrode 119a, and polysilicon gate line 119c, depositing the metal 126, and forming the first metal gate electrode 126b, the second metal gate electrode 126a, and the metal gate line 126c has been described.

Next, there is described a production method for forming contacts. Since the silicide is not formed in the upper portions of the diffusion layer 113 formed in the upper portion of the first pillar-shaped silicon layer 109 and the diffusion layer 114 formed in the upper portion of the second pillar-shaped silicon layer 110, a contact is directly connected to the diffusion layer 113 in the upper portion of the first pillar-shaped silicon layer 109 and another contact is directly connected to the diffusion layer 114 in the upper portion of the second pillar-shaped silicon layer 110.

As shown in FIGS. 35A-35C, an interlayer insulating film 127 is deposited and planarized.

Figure 36C:
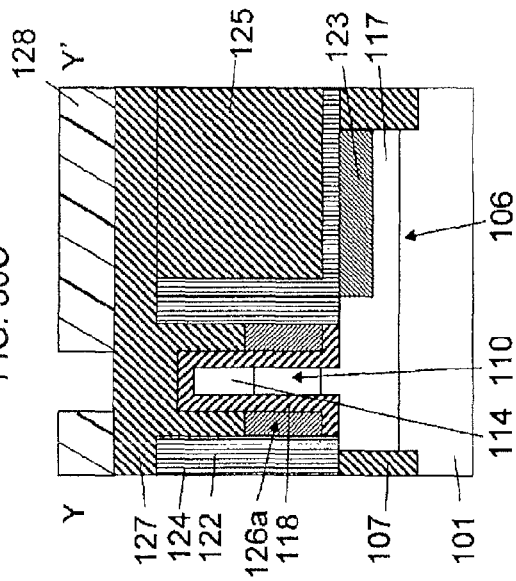
FIG. 36C is a sectional view taken along line Y-Y' of FIG. 36A.
Figure 36A:
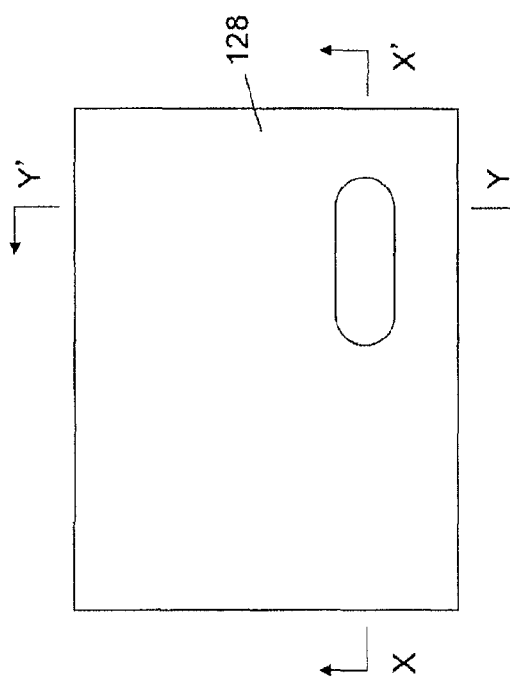
FIG. 36A is a plan view showing a method for producing a semiconductor device according to an embodiment of the present invention.
Figure 36B:
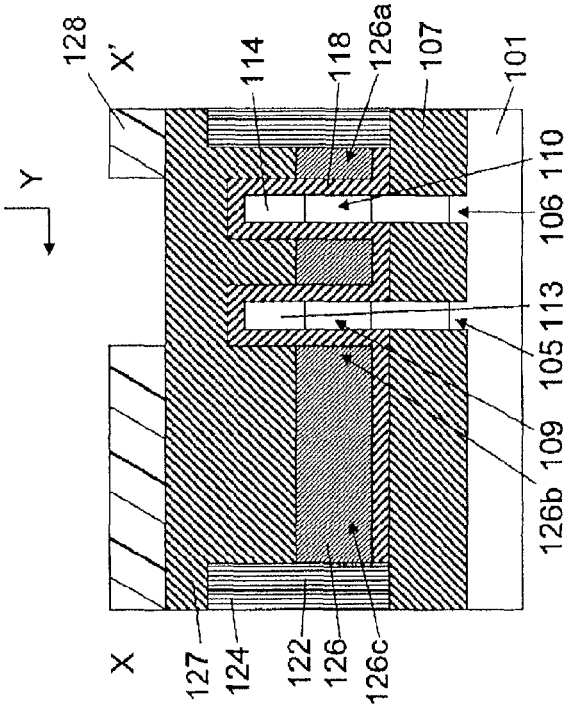
FIG. 36B is a sectional view taken along line X-X' of FIG. 36A.

As shown in FIGS. 36A-36C, a fourth resist 128 for making a contact hole above the first pillar-shaped silicon layer 109 and second pillar-shaped silicon layer 110 is formed.

Figure 37C:
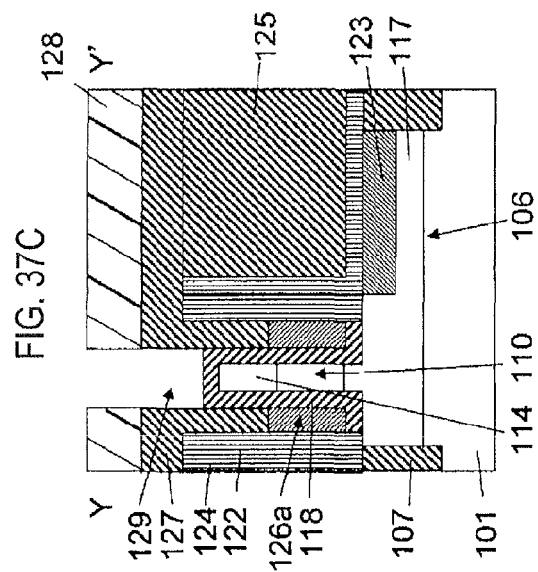
FIG. 37C is a sectional view taken along line Y-Y' of FIG. 37A.
Figure 37A:
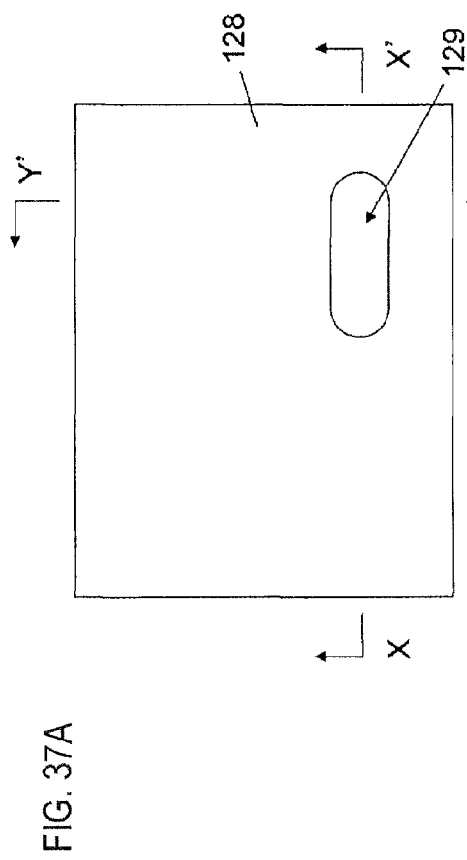
FIG. 37A is a plan view showing a method for producing a semiconductor device according to an embodiment of the present invention.
Figure 37B:
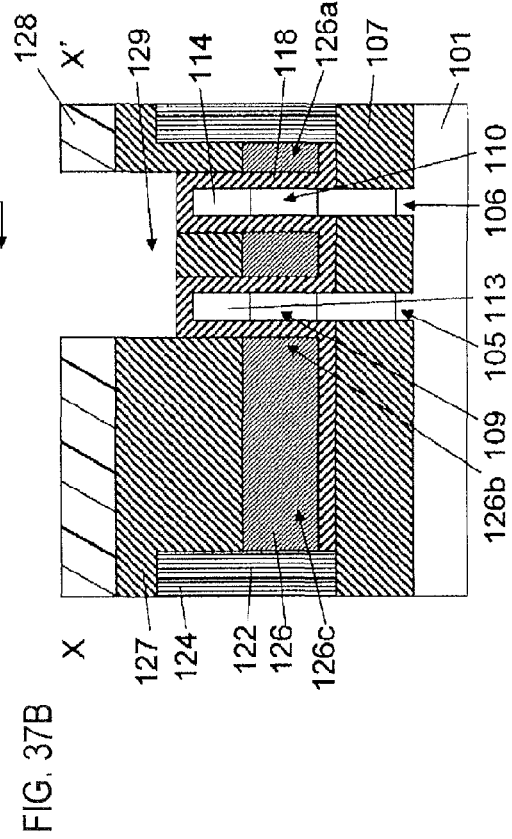
FIG. 37B is a sectional view taken along line X-X' of FIG. 37A.

As shown in FIGS. 37A-37C, a contact hole 129 is made by etching the interlayer insulating film 127.

As shown in FIGS. 38A-38C, the fourth resist 128 is removed.

As shown in FIGS. 39A-39C, a fifth resist 130 for making contact holes above the metal gate line 126c and above the first fin-shaped silicon layer 105 and second fin-shaped silicon layer 106 is formed.

As shown in FIGS. 40A-40C, contact holes 131 and 132 are made by etching the interlayer insulating films 127 and 125, respectively.

As shown in FIGS. 41A-41C, the fifth resist 130 is removed.

As shown in FIGS. 42A-42C, the fifth nitride film 124 and the gate insulating film 118 are etched to expose the silicide 123 and the diffusion layers 113 and 114, respectively.

As shown in FIG. 43, a metal is deposited to form contacts 133, 134, and 135. The production method for forming contacts has been described. Since the silicide is not formed in the upper portions of the diffusion layer 113 formed in the upper portion of the first pillar-shaped silicon layer 109 and the diffusion layer 114 in the upper portion of the second pillar-shaped silicon layer 110, the contact 134 is directly connected to the diffusion layer 113 in the upper portion of the first pillar-shaped silicon layer 109 and the other contact 134 is directly connected to the diffusion layer 114 in the upper portion of the second pillar-shaped silicon layer 110.

Next, there is described a production method for forming metal wire layers.

As shown in FIGS. 44A-44C, a metal 136 is deposited.

As shown in FIGS. 45A-45C, sixth resists 137, 138, and 139 for forming metal wires are formed.

As shown in FIGS. 46A-46C, the metal 136 is etched to form metal wires 140, 141, and 142.

As shown in FIGS. 47A-47C, the sixth resists 137, 138, and 139 are removed.

The production method for forming metal wire layers has been described.

FIG. 1 shows a SGT structure formed by the above-described production method.

The SGT structure includes a first fin-shaped semiconductor layer 105 formed on a substrate 101 and a second fin-shaped semiconductor layer 106 formed on the substrate 101, the first fin-shaped semiconductor layer 105 and the second fin-shaped semiconductor layer 106 being connected to each other at their ends to form a closed loop; a first insulating film 107 formed around the first fin-shaped semiconductor layer 105 and second fin-shaped semiconductor layer 106; a first pillar-shaped semiconductor layer 109 formed in an upper portion of the fin-shaped semiconductor layer 105 and a second pillar-shaped semiconductor layer 110 formed in an upper portion of the second fin-shaped semiconductor layer 106, the first pillar-shaped semiconductor layer 109 having a width equal to the width of the first fin-shaped semiconductor layer 105 and the second pillar-shaped semiconductor layer 110 having a width equal to the width of the second fin-shaped semiconductor layer 106; a diffusion layer 117 formed in an upper portion of the first fin-shaped semiconductor layer 105 and a lower portion of the first pillar-shaped semiconductor layer 109, a diffusion layer 113 formed in an upper portion of the first pillar-shaped semiconductor layer 109, a diffusion layer 117 formed in an upper portion of the second fin-shaped semiconductor layer 106 and a lower portion of the second pillar-shaped semiconductor layer 110, and a diffusion layer 114 formed in an upper portion of the second pillar-shaped semiconductor layer 110; a silicide 123 formed in upper portions of the diffusion layers 117 formed in the upper portion of the first fin-shaped semiconductor layer 105 and in the upper portion of the second fin-shaped semiconductor layer 106; a gate insulating film 118 formed around the first pillar-shaped semiconductor layer 109, a first metal gate electrode 126b formed around the gate insulating film 118, a gate insulating film 118 formed around the second pillar-shaped semiconductor layer 110, a second metal gate electrode 126a formed around the gate insulating film 118, and a metal gate line 126c that is connected to the first metal gate electrode 126b and the second metal gate electrode 126a and that extends in a direction perpendicular to the direction in which the first fin-shaped semiconductor layer 105 and second fin-shaped semiconductor layer 106 extend; and a contact 134 formed on the diffusion layer 113 formed in the upper portion of the first pillar-shaped semiconductor layer 109 so as to be directly connected to the diffusion layer 113 and a contact 134 formed on the diffusion layer 114 formed in the upper portion of the second pillar-shaped semiconductor layer 110 so as to be directly connected to the diffusion layer 114.

Accordingly, there are provided a SGT production method in which the parasitic capacitance between a gate line and a substrate is decreased, a gate last process is employed, and two transistors are produced from a single dummy pattern and a SGT structure formed by the production method.

The invention claimed is:

1. A semiconductor device comprising:
  a first fin-shaped semiconductor layer on a substrate;
  a second fin-shaped semiconductor layer on the substrate;
  a first insulating film around the first fin-shaped semiconductor layer and the second fin-shaped semiconductor layer;
  a first pillar-shaped semiconductor layer on the first fin-shaped semiconductor layer, wherein a width of the bottom of the first pillar-shaped semiconductor is equal to a width of the top of the first fin-shaped semiconductor layer;
  a second pillar-shaped semiconductor layer on the second fin-shaped semiconductor layer, wherein a width of the bottom of the second pillar-shaped semiconductor is equal to a width of the top of the second fin-shaped semiconductor layer;
  a first diffusion layer in an upper portion of the first fin-shaped semiconductor layer and a lower portion of the first pillar-shaped semiconductor layer;
  a second diffusion layer in an upper portion of the first pillar-shaped semiconductor layer;
  a third diffusion layer in an upper portion of the second fin-shaped semiconductor layer and a lower portion of the second pillar-shaped semiconductor layer;
  a fourth diffusion layer in an upper portion of the second pillar-shaped semiconductor layer;
  a first gate insulating film around the first pillar-shaped semiconductor layer;
  a first metal gate electrode around the first gate insulating film;
  a second gate insulating film around the second pillar-shaped semiconductor layer;
  a second metal gate electrode around the second gate insulating film;
  a metal gate line connected to the first metal gate electrode and the second metal gate electrode and extending in a direction perpendicular to a direction in which the first fin-shaped semiconductor layer and second fin-shaped semiconductor layer extend;
  a contact on the upper portion of the second diffusion layer and directly connected to the second diffusion layer; and
  a contact on the upper portion of the fourth diffusion layer and directly connected to the fourth diffusion layer.

* * * * *